United States Patent
Lee et al.

(10) Patent No.: US 12,260,923 B2
(45) Date of Patent: Mar. 25, 2025

(54) NONVOLATILE MEMORY DEVICE AND METHOD OF OPERATING NONVOLATILE MEMORY

(71) Applicant: SAMSUNG ELECTRONICS CO., LTD., Suwon-si (KR)

(72) Inventors: Hyunee Lee, Suwon-si (KR); Jongyeol Park, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 149 days.

(21) Appl. No.: 17/820,280

(22) Filed: Aug. 17, 2022

(65) Prior Publication Data

US 2023/0178165 A1 Jun. 8, 2023

(30) Foreign Application Priority Data

Dec. 7, 2021 (KR) .................. 10-2021-0173596
Jan. 26, 2022 (KR) .................. 10-2022-0011290

(51) Int. Cl.
*G11C 29/12* (2006.01)
*G11C 8/12* (2006.01)
(Continued)

(52) U.S. Cl.
CPC .......... *G11C 29/12005* (2013.01); *G11C 8/12* (2013.01); *G11C 16/0483* (2013.01);
(Continued)

(58) Field of Classification Search
CPC . G11C 29/12005; G11C 8/12; G11C 16/0483; G11C 16/08; G11C 16/3445;
(Continued)

(56) References Cited

U.S. PATENT DOCUMENTS 8,111,549 B2  2/2012  Yip
8,301,942 B2  10/2012  Galbraith et al.
(Continued)

FOREIGN PATENT DOCUMENTS

KR  10-0154750  7/1998

OTHER PUBLICATIONS

EESR Dated May 4, 2023 in Corresponding EP Application No. 22189420.7.

*Primary Examiner* — Donald H B Braswell
(74) *Attorney, Agent, or Firm* — F. Chau & Associates, LLC

(57) ABSTRACT

A nonvolatile memory device includes a memory cell array, an address decoder, a leakage detector and a control circuit. The memory cell array includes a plurality of mats corresponding to different bit-lines. The leakage detector is commonly coupled to the plurality of mats at a sensing node in the address decoder. The control circuit performs a first leakage detection operation on M mats selected from the mats to determine a leakage of at least a portion of word-lines of the M mats in an N multi-mat mode, in response to the leakage of at least the portion of word-lines of the M mats being detected based on a result of the first leakage detection operation, inhibits at least one mat of the M mats, and performs a second leakage detection operation on at least one target mat from among the M mats except the inhibited mat.

20 Claims, 34 Drawing Sheets

(51) Int. Cl.
*G11C 16/04* (2006.01)
*G11C 16/08* (2006.01)
*G11C 16/34* (2006.01)

(52) U.S. Cl.
CPC .......... *G11C 16/08* (2013.01); *G11C 16/3445* (2013.01); *G11C 29/12* (2013.01); *G11C 2029/1202* (2013.01); *G11C 2029/1204* (2013.01); *G11C 2211/4068* (2013.01)

(58) Field of Classification Search
CPC ............ G11C 29/12; G11C 2029/1202; G11C 2029/1204; G11C 2211/4068; G11C 16/34; Y02D 10/00
See application file for complete search history.

(56) References Cited

U.S. PATENT DOCUMENTS

| | | |
|---|---|---|
| 8,787,094 B2 | 7/2014 | Costa et al. |
| 9,281,078 B2 | 3/2016 | Kessenich et al. |
| 2012/0005451 A1 | 1/2012 | Lee et al. |
| 2014/0247658 A1 | 9/2014 | Hosono |
| 2015/0070994 A1* | 3/2015 | Hosono .................. G11C 16/08 365/185.11 |
| 2017/0316834 A1 | 11/2017 | Huynh et al. |
| 2018/0358100 A1* | 12/2018 | Akamine ................ G11C 16/10 |
| 2019/0006021 A1* | 1/2019 | Ghai .................. G11C 11/5628 |
| 2023/0023618 A1* | 1/2023 | Zhang .................... G11C 16/30 |

\* cited by examiner

BLK1

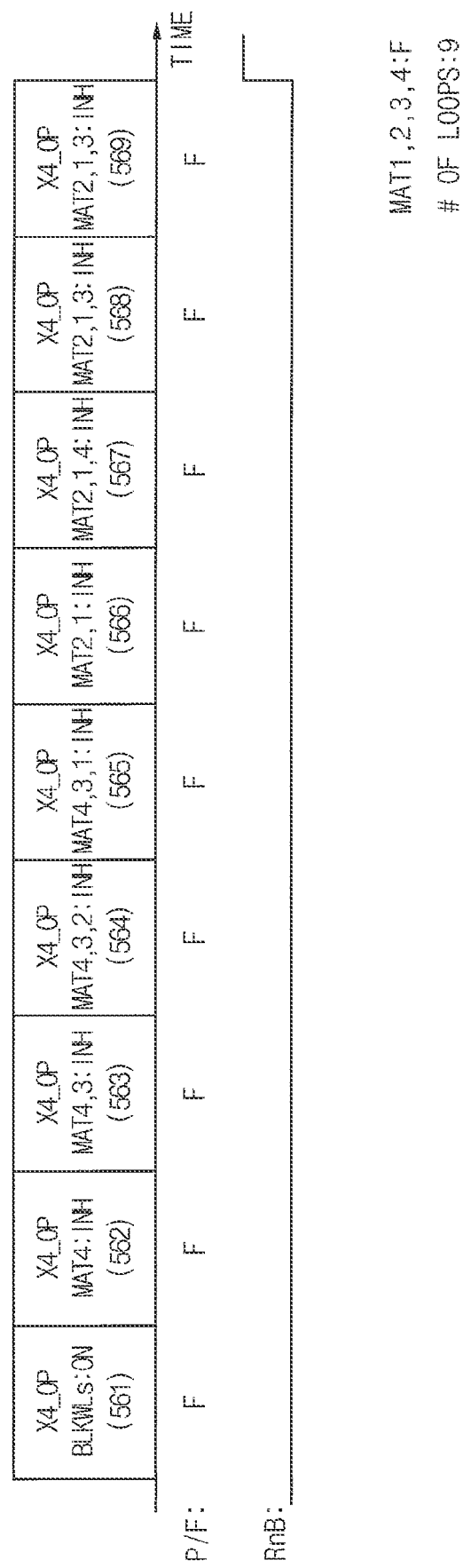

NONVOLATILE MEMORY DEVICE AND METHOD OF OPERATING NONVOLATILE MEMORY

CROSS-REFERENCE TO RELATED APPLICATIONS

This application claims priority under 35 U.S.C. § 119 to Korean Patent Application No. 10-2021-0173596 filed on Dec. 7, 2021, and to Korean Patent Application No. 10-2022-0011290 filed on Jan. 26, 2022, the disclosures of each of which are incorporated by reference herein in their entirety.

TECHNICAL FIELD

Example embodiments generally relate to semiconductor memory devices, and more particularly, to a nonvolatile memory device and a method of operating a nonvolatile memory device.

DISCUSSION OF RELATED ART

Semiconductor memory devices for storing data may be classified as volatile memory devices and nonvolatile memory devices. Volatile memory devices, such as dynamic random access memory (DRAM) devices, are typically configured to store data by charging or discharging capacitors in memory cells, and lose the stored data when power is turned off. Nonvolatile memory devices, such as flash memory devices, may maintain stored data even when power is turned off. Volatile memory devices are widely used as main memories of various apparatuses, while nonvolatile memory devices are widely used for storing program code and/or data in various electronic devices, such as computers, mobile devices, etc.

Recently, nonvolatile memory devices having a three-dimensional structure such as vertical NAND memory devices have been developed to increase the integration degree and memory capacity of the nonvolatile memory devices.

SUMMARY

Some example embodiments provide a nonvolatile memory device capable of rapidly detecting a mat including word-lines in which leakage occurs.

Some example embodiments provide a method of operating a nonvolatile memory device, capable of rapidly detecting a mat including word-lines in which leakage occurs.

According to example embodiments, a nonvolatile memory device includes a memory cell array, an address decoder, at least one leakage detector and a control circuit. The memory cell array includes a plurality of mats corresponding to different bit-lines. Each of the plurality of mats includes at least one memory block including a plurality of cell strings, and each of the plurality of cell strings includes a string selection transistor, a plurality of memory cells and a ground selection transistor which are connected in series and disposed in a vertical direction between a bit-line and a common source line. The address decoder is coupled to the memory cell array through a plurality of word-lines and provides word-line voltages to the memory cell array. The at least one leakage detector is commonly coupled to the plurality of mats at a sensing node in the address decoder. The control circuit controls the address decoder and the at least one leakage detector. The control circuit performs a first leakage detection operation on M mats selected from the plurality of mats to determine a leakage of at least a portion of word-lines of the M mats in an N multi-mat mode during which N mats from among the plurality of mats operate concurrently, in response to the leakage of at least the portion of word-lines of the M mats being detected based on a result of the first leakage detection operation, inhibits at least one mat of the M mats, and performs a second leakage detection operation on at least one target mat from among the M mats except the inhibited mat. M is a natural number greater than one and N is a natural number greater than one.

According to example embodiments, there is provided a method of operating a nonvolatile memory device which includes a memory cell array including a plurality of mats corresponding to different bit-lines. Each of the plurality of mats includes at least one memory block including a plurality of cell strings, and each of the plurality of cell strings includes a string selection transistor, a plurality of memory cells and a ground selection transistor which are connected in series and disposed in a vertical direction between a bit-line and a common source line. According to the method, a first leakage detection operation is performed on M mats selected from the plurality of mats to determine a leakage of at least a portion of word-lines of the M mats in an N multi-mat mode during which N mats from among the plurality of mats operate concurrently, in response to the leakage of at least the portion of word-lines of the M mats being detected based on a result of the first leakage detection operation, at least one mat of the M mats is inhibited, and a second leakage detection operation is performed on at least one target mat from among the M mats except the inhibited mat. M is a natural number greater than one and N is a natural number greater than one.

According to example embodiments, a nonvolatile memory device includes a memory cell array, a voltage generator, an address decoder, at least one leakage detector and a control circuit. The memory cell array includes a plurality of mats corresponding to different bit-lines, each of the plurality of mats includes at least one memory block including a plurality of cell strings, and each of the plurality of cell strings includes a string selection transistor, a plurality of memory cells and a ground selection transistor which are connected in series and disposed in a vertical direction between a bit-line and a common source line. The voltage generator generates word-line voltages based on control signals. The address decoder is coupled to the memory cell array through a plurality of word-lines and provides the word-line voltages to the memory cell array. The at least one leakage detector is commonly coupled to the plurality of mats at a sensing node in the address decoder. The control circuit controls the voltage generator, the address decoder and the at least one leakage detector. The control circuit performs a first leakage detection operation on M mats selected from the plurality of mats to determine a leakage of at least a portion of word-lines of the M mats in an N multi-mat mode during which N mats from among the plurality of mats operate concurrently, in response to the leakage of at least the portion of word-lines of the M mats being detected based on a result of the first leakage detection operation, inhibits at least one mat of the M mats, and performs a second leakage detection operation on at least one target mat from among the M mats except the inhibited mat. M is a natural number greater than one and N is a natural number greater than one.

The nonvolatile memory device and the method of operating the nonvolatile memory device according to example embodiments performs a first leakage detection operation on M mats selected from the plurality of mats to determine a leakage of at least a portion of word-lines of the M mats in an N multi-mat mode during which N mats from among the plurality of mats operate concurrently, in response to the leakage of at least the portion of word-lines of the M mats being detected, inhibits at least one mat of the M mats and performs a second leakage detection operation on at least one target mat from among the M mats except the inhibited mat. Accordingly, in example embodiments, the nonvolatile memory device and the method of operating the nonvolatile memory device may rapidly identify a mat in which the leakage occurs and may prevent memory blocks of a mat in which the leakage does not occur from being processed as a bad block such as a run-time bad block.

BRIEF DESCRIPTION OF THE DRAWINGS

Illustrative, non-limiting example embodiments will be more clearly understood from the following detailed description in conjunction with the accompanying drawings.

FIG. 26C illustrates the control circuit performing a two-step leakage detection operation on the mats in the nonvolatile memory device of FIG. 25 according to example embodiments.

DETAILED DESCRIPTION OF THE EMBODIMENTS

Figure 1:
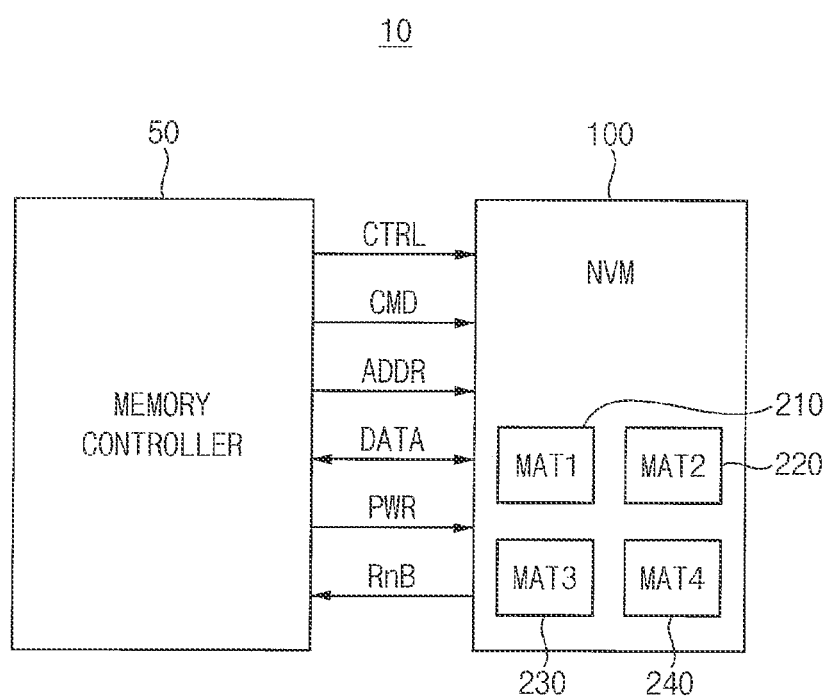
FIG. 1 is a block diagram illustrating a memory system the according to example embodiments.

Example embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an example embodiment may be described as a "second" element in another example embodiment.

It should be understood that descriptions of features or aspects within each example embodiment should typically be considered as available for other similar features or aspects in other example embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

FIG. 1 is a block diagram illustrating a memory system (e.g., a storage device) according to example embodiments.

Referring to FIG. 1, a storage device (e.g., a memory system) 10 may include a memory controller 50 and at least one nonvolatile memory device 100.

In example embodiments, each of the memory controller 50 and the nonvolatile memory device 100 may be provided in the form of a chip, a package, or a module. Alternatively, the memory controller 50 and the nonvolatile memory device 100 may be packaged into one of various packages.

The nonvolatile memory device 100 may perform an erase operation, a program operation or a write operation under control of the memory controller 50. The nonvolatile memory device 100 receives a command CMD, an address ADDR and data DATA through input/output lines from the memory controller 50 for performing such operations. In addition, the nonvolatile memory device 100 may receive a control signal CTRL through a control line from the memory controller 50. In addition, the nonvolatile memory device 100 may receive power PWR through a power line from the memory controller 50. In addition, the nonvolatile memory device 100 may provide the memory controller 50 with a status signal indicating an operating state of the nonvolatile memory device 100.

The nonvolatile memory device 100 may include a plurality of mats 210 MAT1, 220 MAT2, 230 MAT3, and 240 MAT4 corresponding to different bit-lines.

Figure 2:
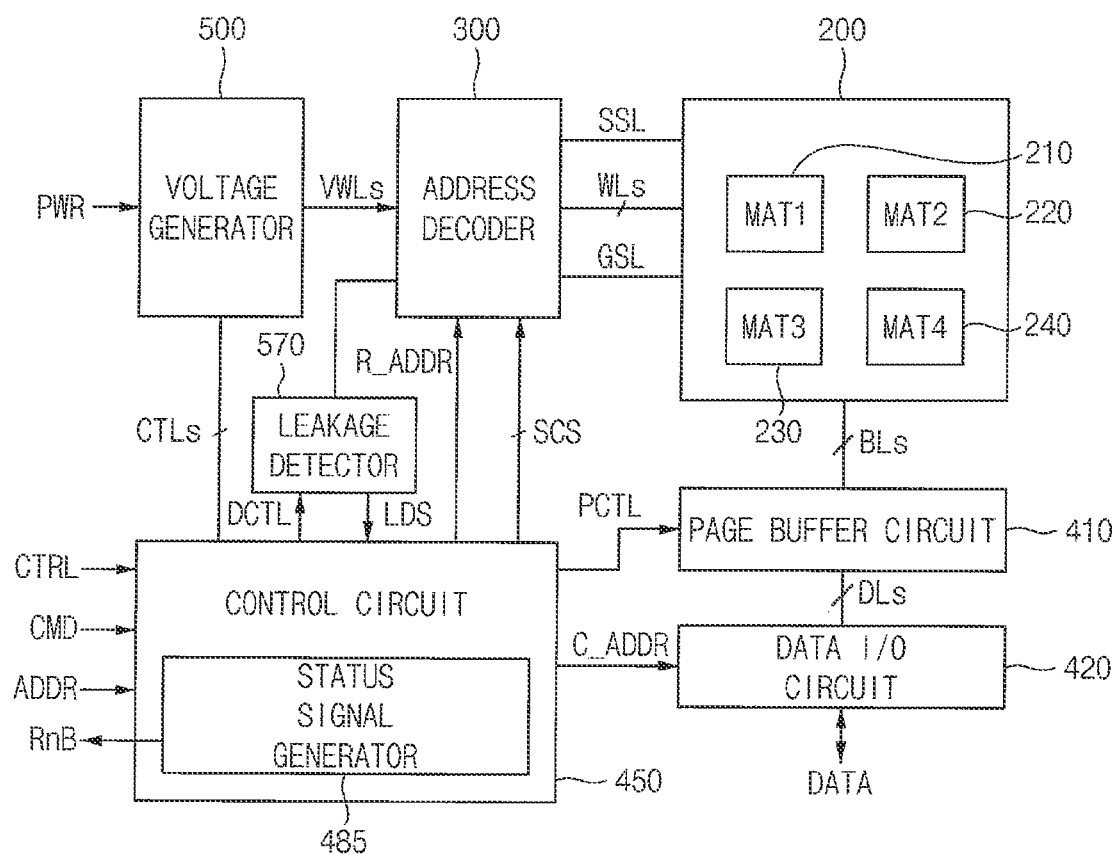
FIG. 2 is a block diagram illustrating the nonvolatile memory device in the memory system of FIG. 1 according to example embodiments.

FIG. 2 is a block diagram illustrating the nonvolatile memory device in the memory system of FIG. 1 according to example embodiments.

Referring to FIG. 2, the nonvolatile memory device 100 may include a memory cell array 200, an address decoder 300 (also referred to as an address decoder circuit), a page buffer circuit 410, a data input/output (I/O) circuit 420, a control circuit 450, a voltage generator 500 (also referred to as a voltage generator circuit) and at least one leakage detector 570 (also referred to as at least one leakage detector circuit).

The memory cell array 200 may be coupled to the address decoder 300 through a string selection line SSL, a plurality of word-lines WLs, and a ground selection line GSL. In addition, the memory cell array 200 may be coupled to the page buffer circuit 410 through a plurality of bit-lines BLs. The memory cell array 200 may include a plurality of memory cells coupled to the plurality of word-lines WLs and the plurality of bit-lines BLs.

In some example embodiments, the memory cell array 200 may be a three-dimensional memory cell array, which is formed on a substrate in a three-dimensional structure (or a vertical structure). In this case, the memory cell array 200 may include vertical cell strings that are vertically oriented such that at least one memory cell is disposed over another memory cell.

The control circuit 450 may receive a command signal CMD indicating a command and an address signal ADDR indicating an address from the memory controller 50, and control a user operation and a leakage detection operation of the nonvolatile memory device 100 based on the command signal CMD and the address signal ADDR. The user operation may include an erase loop, a program loop and a read operation of the nonvolatile memory device 100. The program loop may include a program operation and a program verification operation. The erase loop may include an erase operation and an erase verification operation.

For example, the control circuit 450 may generate control signals CTLs to control the voltage generator 500, may generate a page buffer control signal PCTL to control the page buffer circuit 410 and may generate a control signal DCTL to control the leakage detector 570 based on the command signal CMD and the control signal CTRL. The control circuit 450 may generate a row address R_ADDR and a column address C_ADDR based on the address signal ADDR. The control circuit 450 may provide the row address R_ADDR to the address decoder 430 and provide the column address C_ADDR to the data I/O circuit 420. In addition, the control circuit 450 may generate switching control signals SCS based on the command signal CMD and may provide the switching control signals SCS to the address decoder 300.

In addition, the control circuit 450 may include a status signal generator 485. The status signal generator 485 may generate the status signal RnB indicating an operating state of the erase loop, the program loop, the read operation and the leakage detection operation of the nonvolatile memory device 100, and may provide the status signal RnB to the memory controller 50. The status signal RnB may also be referred to as a ready/busy signal.

The address decoder 300 may be coupled to the memory cell array 200 through the string selection line SSL, the plurality of word-lines WLs, and the ground selection line GSL. During the program operation or the read operation, the address decoder 430 may determine one of the plurality of word-lines WLs as a selected word-line and determine the rest of the plurality of word-lines WLs except for the selected word-line as unselected word-lines based on the row address R_ADDR.

The voltage generator 500 may generate word-line voltages VWLs, which are utilized for the operation of the nonvolatile memory device 100, based on the control signals CTLs. The voltage generator 500 may receive the power PWR from the memory controller 50. The word-line voltages VWLs may be applied to the plurality of word-lines WLs through the address decoder 300.

For example, during the erase operation, the voltage generator 500 may apply an erase voltage to a well of the memory block and may apply a ground voltage to entire word-lines of the memory block. During the erase verification operation, the voltage generator 500 may apply an erase verification voltage to the entire word-lines of the memory block or sequentially apply the erase verification voltage to word-lines on a word-line basis.

For example, during the program operation, the voltage generator 500 may apply a program voltage to the selected word-line and may apply a program pass voltage to the unselected word-lines. In addition, during the program verification operation, the voltage generator 500 may apply a program verification voltage to the selected word-line and may apply a verification pass voltage to the unselected word-lines.

The page buffer circuit 410 may be coupled to the memory cell array 200 through the plurality of bit-lines BLs. The page buffer circuit 410 may include a plurality of page buffers. The page buffer circuit 410 may temporarily store data to be programmed in a selected page or data read out from the selected page.

The data I/O circuit 420 may be coupled to the page buffer circuit 410 through a plurality of data lines DLs. During the program operation, the data I/O circuit 420 may receive program data DATA from the memory controller 50 and provide the program data DATA to the page buffer circuit 410 based on the column address C_ADDR received from the control circuit 450. During the read operation, the data I/O circuit 420 may provide read data DATA, which are stored in the page buffer circuit 410, to the memory controller 50 based on the column address C_ADDR received from the control circuit 450.

The at least one leakage detector 570 may be coupled to the address decoder 300, may be coupled to driving lines coupled to the word-lines WLs of the plurality of mats 210, 220, 230 and 240 at a sensing node in the address decoder 300 to detect leakage of at least a portion of the word-lines WLs, and may provide the control circuit 450 with a leakage detection signal LDS when the leakage is detected.

Figure 3:
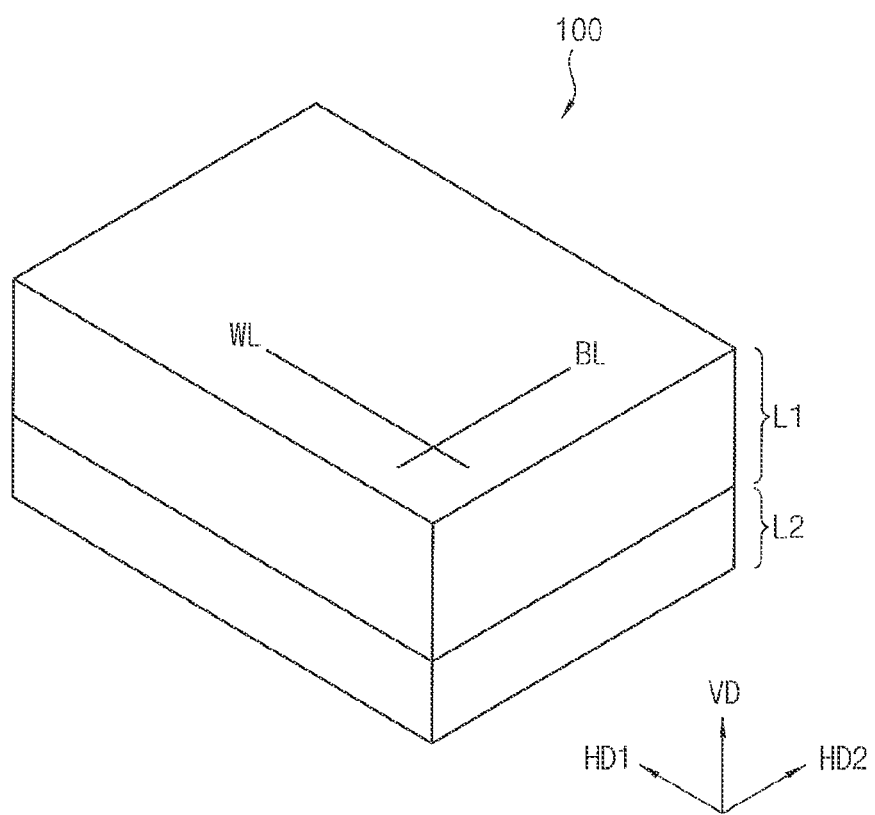
FIG. 3 schematically illustrates a structure of the nonvolatile memory device of FIG. 1 according to example embodiments.

FIG. 3 schematically illustrates a structure of the nonvolatile memory device of FIG. 2 according to example embodiments.

Referring to FIG. 3, the nonvolatile memory device 100 may include a first semiconductor layer L1 and a second semiconductor layer L2. The first semiconductor layer L1 may be stacked in a vertical direction VD with respect to the second semiconductor layer L2. The second semiconductor layer L2 may be disposed under the first semiconductor layer L1 in the vertical direction VD. Thus, among the first and second semiconductor layers L1 and L2, the second semiconductor layer L2 may be disposed closer to a substrate.

In example embodiments, the memory cell array 200 in FIG. 2 may be formed (e.g., disposed) in the first semiconductor layer L1, and a peripheral circuit including the address decoder 300, the page buffer circuit 410, the data I/O circuit 420, the control circuit 450 and the at least one leakage detector 570 in FIG. 2 may be formed (e.g., disposed) in the second semiconductor layer L2. Accordingly, the nonvolatile memory device 100 may have a structure in which the memory cell array 200 is disposed on the peripheral circuit, that is, a cell-over-periphery (COP) structure may be utilized. The COP structure may effectively reduce an area in a horizontal direction and increase the degree of integration of the nonvolatile memory device 100.

In example embodiments, the second semiconductor layer L2 may include the substrate, and by forming transistors on the substrate and metal patterns for wiring transistors, the peripheral circuit may be formed in the second semiconductor layer L2. After the peripheral circuit is formed in the second semiconductor layer L2, the first semiconductor layer L1 including the memory cell array 200 may be formed, and the metal patterns for connecting the word-lines WL and the bit-lines BL of the memory cell array 200 to the peripheral circuit formed in the second semiconductor layer L2 may be formed. For example, the word-lines WL may extend in a first horizontal direction HD1 and the bit-lines BL may extend in a second horizontal direction HD2 crossing the first horizontal direction HD1.

As the number of stages of memory cells in the memory cell array 200 increases with the development of semiconductor processes, that is, as the number of stacked word-lines WL increases, an area of the memory cell array 200 may decrease, and accordingly, an area of the peripheral circuit may also be reduced. According to example embodiments, to reduce an area of a region occupied by the page buffer circuit 410, the page buffer circuit 410 may have a structure in which the page buffer unit and the cache latch are separated from each other, and may connect sensing nodes included in each of the page buffer units commonly to a combined sensing node.

Figure 4:
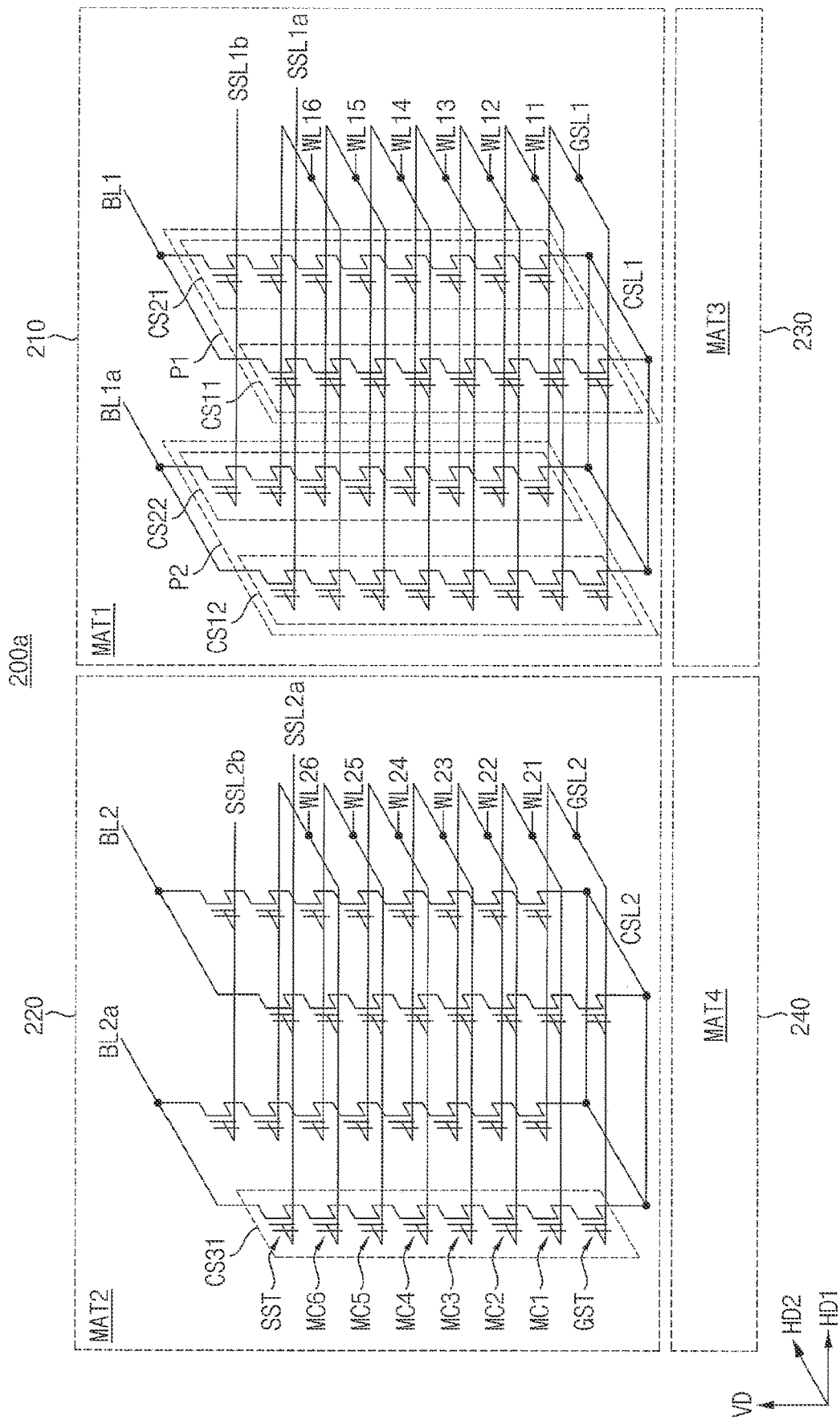
FIG. 4 is a circuit diagram illustrating a mat configuration in the nonvolatile memory device of FIG. 2 according to example embodiments.

FIG. 4 is a circuit diagram illustrating a mat configuration in the nonvolatile memory device of FIG. 2 according to example embodiments.

Referring to FIG. 4, a memory cell array 200a including the plurality of mats 210, 220, 230 and 240 is illustrated. Each of the plurality of mats 210, 220, 230 and 240 may include a plurality of memory blocks, and each of the memory blocks may include a plurality of cell strings. For example, a memory block of a first mat 21 may include a plurality of cell strings CS11, CS12, CS21, and CS22. The plurality of cell strings in a mat may be formed in a plane. In FIG. 4, configuration of each of the mats 210 and 220 is illustrated in detail, and for convenience of explanation, the configuration of each of the mats 230 and 240 is not illustrated, but may be substantially the same as the configuration of each of the mats 210 and 220.

Each of the mats (first and second mats) 210 and 210 may include a plurality of memory blocks, and one of the memory blocks may have multiple string selection lines SSL1a and SSL1b to select at least one of the cell strings CS11, CS12, CS21, and CS22. For example, when a selection voltage is applied to a first string selection line SSL1a, the first and second cell strings CS11 and CS12 may be selected. When a selection voltage is applied to a second string selection line SSL1b, third and fourth cell strings CS21 and CS22 may be selected.

In some embodiments, the mats 210 and 220 may have the same physical structure. For example, like the mat 210, the mat 220 may include multiple memory blocks and multiple cell strings formed in a memory block of the multiple memory blocks. Also, the mat 220 may include multiple string selection lines SSL2a and SSL2b to select at least one of multiple cell strings.

Each of the mats 210 and 220 may be coupled to corresponding word-lines and a common source line. The cell strings in the mat 210 may be coupled to word-lines WL11~WL16, a ground selection line GSL1 and a common source line CSL1. The cell strings in the mat 210 may be coupled to word-lines WL21~WL26, a ground selection line GSL2 and a common source line CSL2.

The mats 210 and 220 do not share bit-lines. First bit-lines BL1 and BL1a are coupled to the mat 210 exclusively. Second bit-lines BL2 and BL2a are coupled to the mat 220 exclusively.

Although FIG. 4 illustrates an example in which each mat is connected with two bit-lines and six word-lines, example embodiments are not limited thereto. For example, in example embodiments, each mat is connected with three or more bit-lines and seven or more word-lines.

Each cell string may include at least one string selection transistor, memory cells, and at least one ground selection transistor. For example, a cell string CS31 of the mat 220 may include a ground selection transistor GST, multiple memory cells MC1 to MC6, and a string selection transistor SST, sequentially disposed perpendicular to a substrate. The remaining cell strings may be formed substantially the same as the cell string CS31.

The mats 210 and 220 may include independent string selection lines. For example, string selection lines SSL1a and SSL1b are only connected with the mat 210, and string selection lines SSL2a and SSL2b are only connected with the mat 220. A string selection line may be used to select cell strings only in a mat. Also, cell strings may be independently selected in every mat by controlling the string selection lines independently.

For example, cell strings CS11 and CS12 may be independently selected by applying a selection voltage only to first string selection line SSL1a. When the selection voltage is applied to first string selection line SSL1a, string selection transistors of cell strings CS11 and CS12 corresponding to first string selection line SSL1a may be turned on by the selection voltage. At this time, memory cells of the cell strings CS11 and CS12 may be electrically connected with a bit-line. When a non-selection voltage is applied to first string selection line SSL1a, string selection transistors of cell strings CS11 and CS12 corresponding to first string selection line SSL1a are turned off by the non-selection voltage. At this time, memory cells of the cell strings CS11 and CS12 are electrically isolated from a bit-line.

Figure 5:
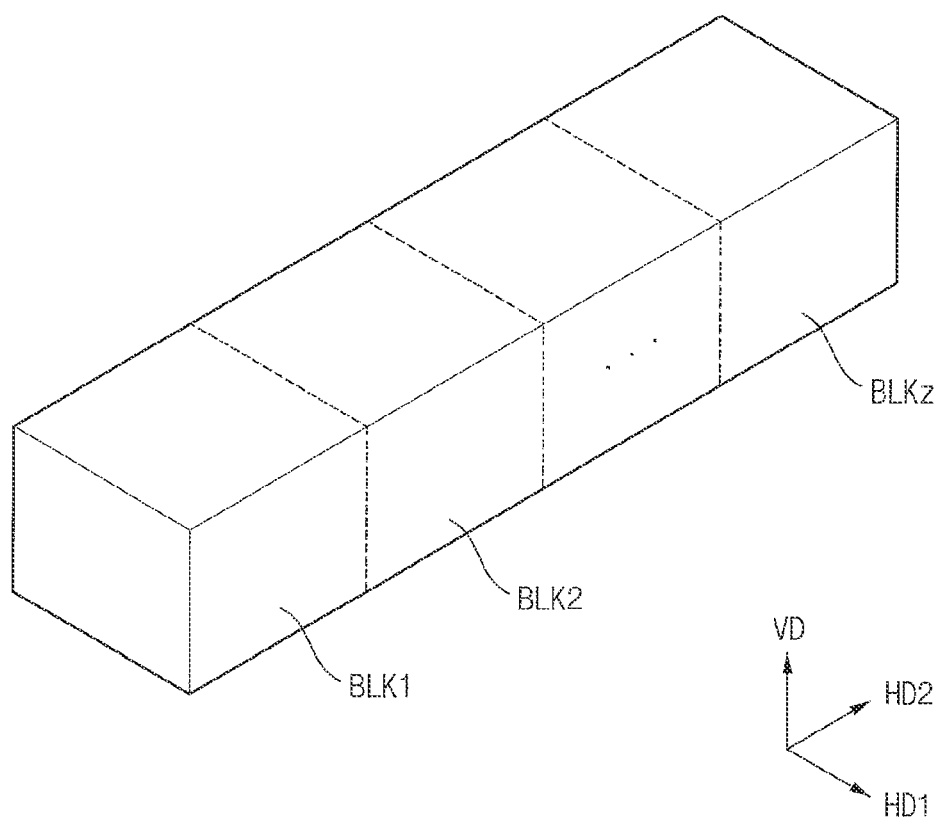
FIG. 5 is a block diagram illustrating an example of the memory cell array in the nonvolatile memory device of FIG. 2 according to example embodiments.

FIG. 5 is a block diagram illustrating an example of the memory cell array in the nonvolatile memory device of FIG. 2 according to example embodiments.

Referring to FIG. 5, a memory cell array 200b may include a plurality of memory blocks BLK1 to BLKz which extend along the first horizontal direction HD1, the second horizontal direction HD2 and the vertical direction VD. Here, z is a natural number greater than two. In an embodiment, the memory blocks BLK1 to BLKz may be selected by the address decoder 300 in FIG. 2. For example, the address decoder 300 may select a memory block BLK corresponding to a block address among the memory blocks BLK1 to BLKz.

Figure 6:
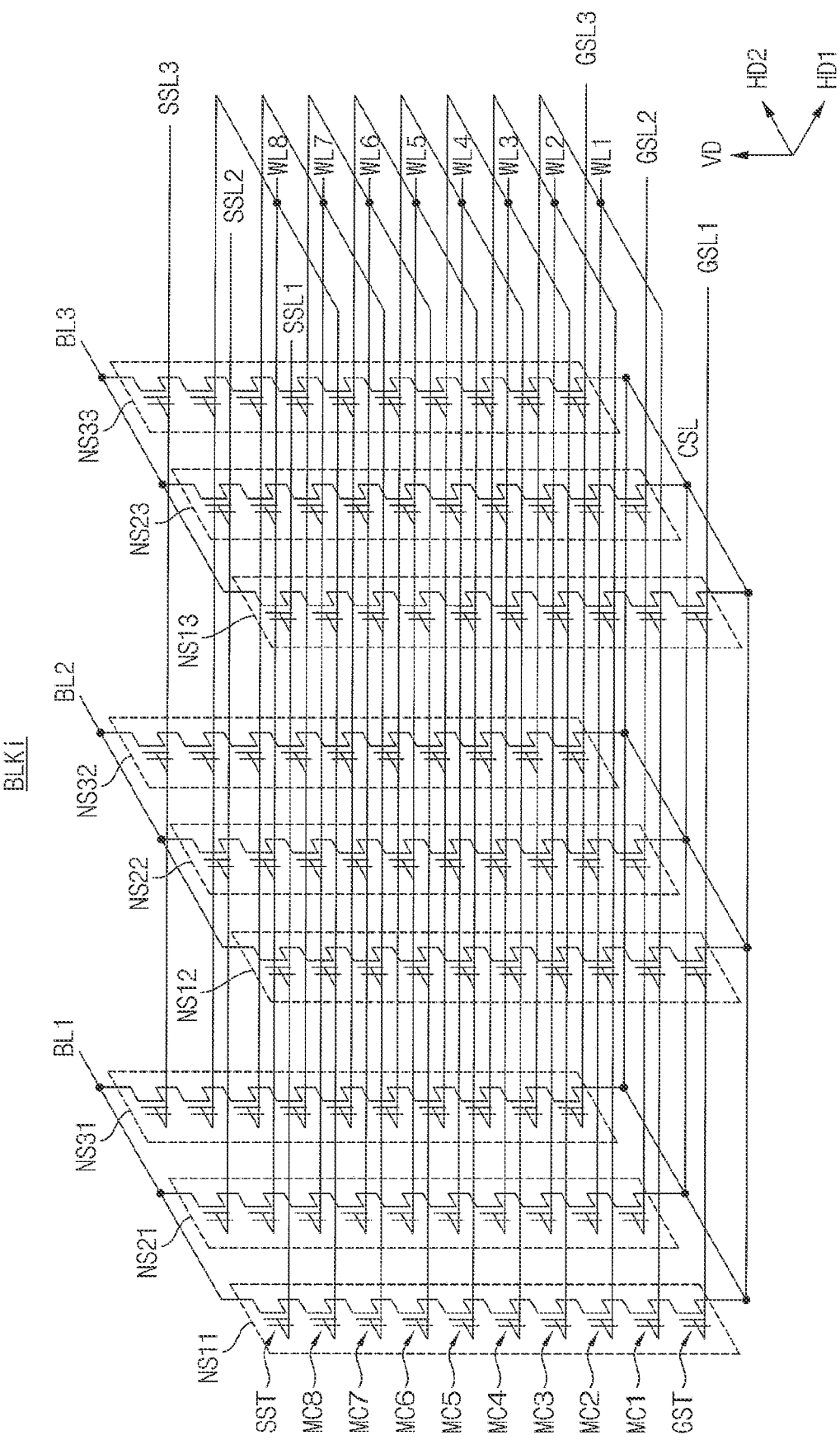
FIG. 6 is a circuit diagram illustrating one of the memory blocks in FIG. 5 according to example embodiments.

FIG. 6 is a circuit diagram illustrating one of the memory blocks in FIG. 5 according to example embodiments.

The memory block BLKi of FIG. 6 may be formed on a substrate in a three-dimensional structure (or a vertical structure). For example, a plurality of memory cell strings included in the memory block BLKi may be formed in a direction perpendicular to the substrate.

Referring to FIG. 6, the memory block BLKi may include memory cell strings NS11 to NS33 coupled between bit-lines BL1, BL2 and BL3 and a common source line CSL.

The memory cell strings may be used interchangeably with the cell strings. The memory cell strings may be also referred to as NAND cell strings. Each of the memory cell strings NS11 to NS33 may include a string selection transistor SST, a plurality of memory cells MC1 to MC8, and a ground selection transistor GST. In FIG. 6, each of the memory cell strings NS11 to NS33 is illustrated as including eight memory cells MC1 to MC8. However, example embodiments are not limited thereto. In some example embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL. Word-lines (e.g., WL1) having the same height may be commonly connected, and the ground selection lines GSL1 to GSL3 and the string selection lines SSL1 to SSL3 may be separated.

Figure 7:
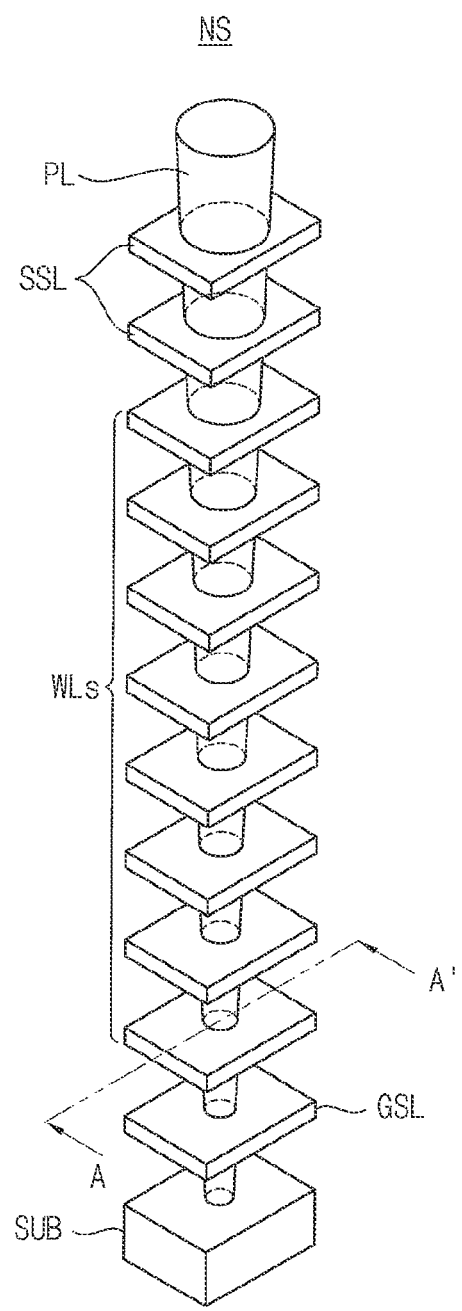
FIG. 7 is a diagram illustrating an example structure of a cell string in the memory block of FIG. 6.
Figure 8:
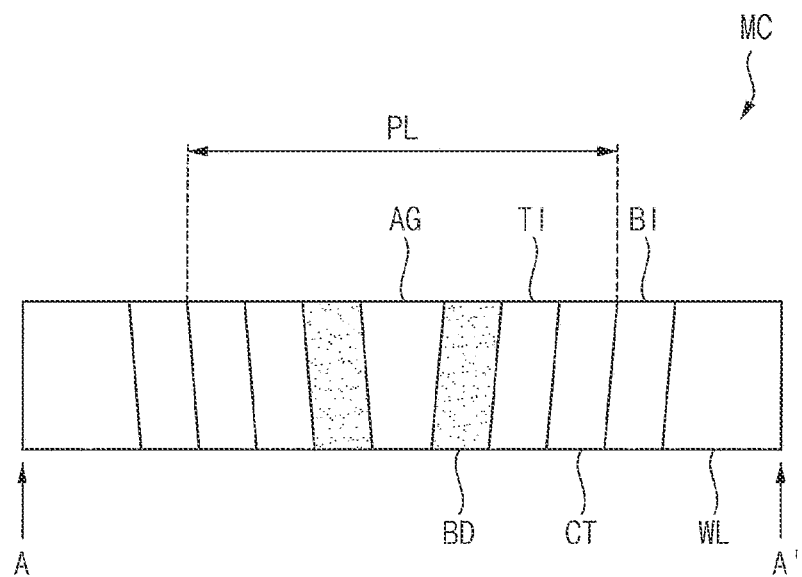
FIG. 8 is a diagram illustrating a memory cell included in the cell string of FIG. 7 according to example embodiments.

FIG. 7 is a diagram illustrating an example structure of a cell string in the memory block of FIG. 6. FIG. 8 is a diagram illustrating a memory cell included in the cell string of FIG. 7 according to example embodiments.

Referring to FIGS. 7 and 8, a pillar PL extending in a vertical direction may be formed on a substrates SUB for providing the cell string NS. The ground selection line GSL, the word-lines WL and the string selection lines SSL may be formed of conductive materials such as metals, which are parallel to the substrate SUB. The pillar PL may penetrate the conductive materials forming ground selection line GSL, the word-lines WL and the string selection lines SSL to contact the substrate SUB. The word-lines WL may include dummy word-lines.

FIG. 8 illustrates a cross-sectional view taken along the line A-A' in FIG. 7. As an example, a cross-section of one memory cell MC corresponding to a word-line is illustrated in FIG. 8. The pillar PL may include a body BD in a form of a cylinder, and an airgap AG may be provided in the body BD. The body BD may include silicon of a P-type and the body BD may be a region in which a channel is formed.

The pillar PL may further include a tunnel insulation layer TI surrounding the body BD and a charge capturing layer CT surrounding the tunnel insulation layer TI. A blocking insulation layer BI may be provided between one word-line and the pillar PL. The body BD, the tunnel insulation layer TI, the charge capturing layer CT, the blocking insulation layer BI and the one word-line may form a transistor of a charge capturing type. In some example embodiments, the string selection transistor SST, the ground selection transistor GST and the other memory cells may have the same structure as illustrated in FIG. 8.

As illustrated in FIGS. 7 and 8, the width or the cross-section area of the pillar PL may be decreased as the distance to the substrate SUB is decreased.

When the same voltage is applied to the bodies of the ground selection transistor GST, the memory cells MC and the string selection transistor SST, and the same voltage is applied to the ground selection line GLS, the word-lines WL and the string selection line SSL, the electric field formed in the memory cell disposed closer to the substrate SUB is greater than the electric field formed in the memory cell disposed further from the substrate SUB. These characteristics may affect the program disturbance during the program operation.

Figure 9:
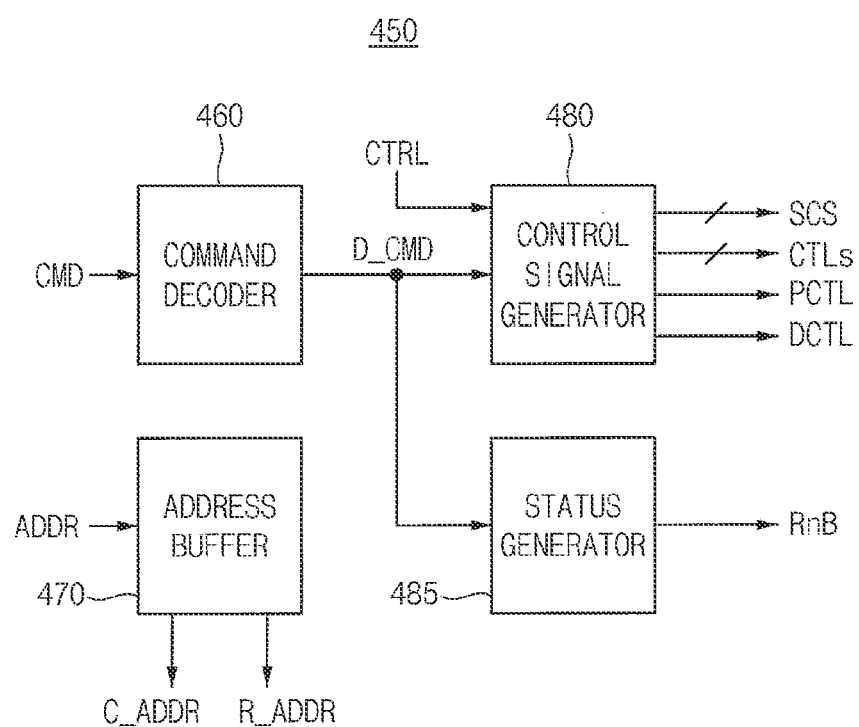
FIG. 9 is a block diagram illustrating the control circuit in the nonvolatile memory device of FIG. 2 according to example embodiments.

FIG. 9 is a block diagram illustrating the control circuit in the nonvolatile memory device of FIG. 2 according to example embodiments.

Referring to FIG. 9, the control circuit 450 may include a command decoder 460, an address buffer 470, a control signal generator 480 and the status signal generator 485.

The command decoder 460 may decode the command CMD and may provide a decoded command D_CMD to the control signal generator 480 and the status signal generator 485.

The address buffer 470 may receive the address ADDR, may provide the row address R_ADDR to the address decoder 300 and may provide the column address C_ADDR to the data I/O circuit 420.

The control signal generator 480 may receive the decoded command D_CMD and the control signal CTRL, may generate the control signals CTLs based on an operation directed by the decoded command D_CMD and the control signal CTRL, may provide the control signals CTLs to the voltage generator 500, may generate the page buffer control signal PCTL, may provide the page buffer control signal PCTL to the page buffer circuit 410, may generate the control signal DCTL and may provide the control signal DCTL to the leakage detector 570. In addition, the control signal generator 480 may generate the switching control signals SCS based on the decoded command D_CMD and may provide the switching control signals SCS to the address decoder 300.

The status signal generator 485 may receive the decoded command D_CMD, may generate the status signal RnB indicating operating state of the erase loop, the program loop, the read operation and the leakage detection operation of the nonvolatile memory device 100 and may provide the status signal RnB to the memory controller 50.

Figure 10:
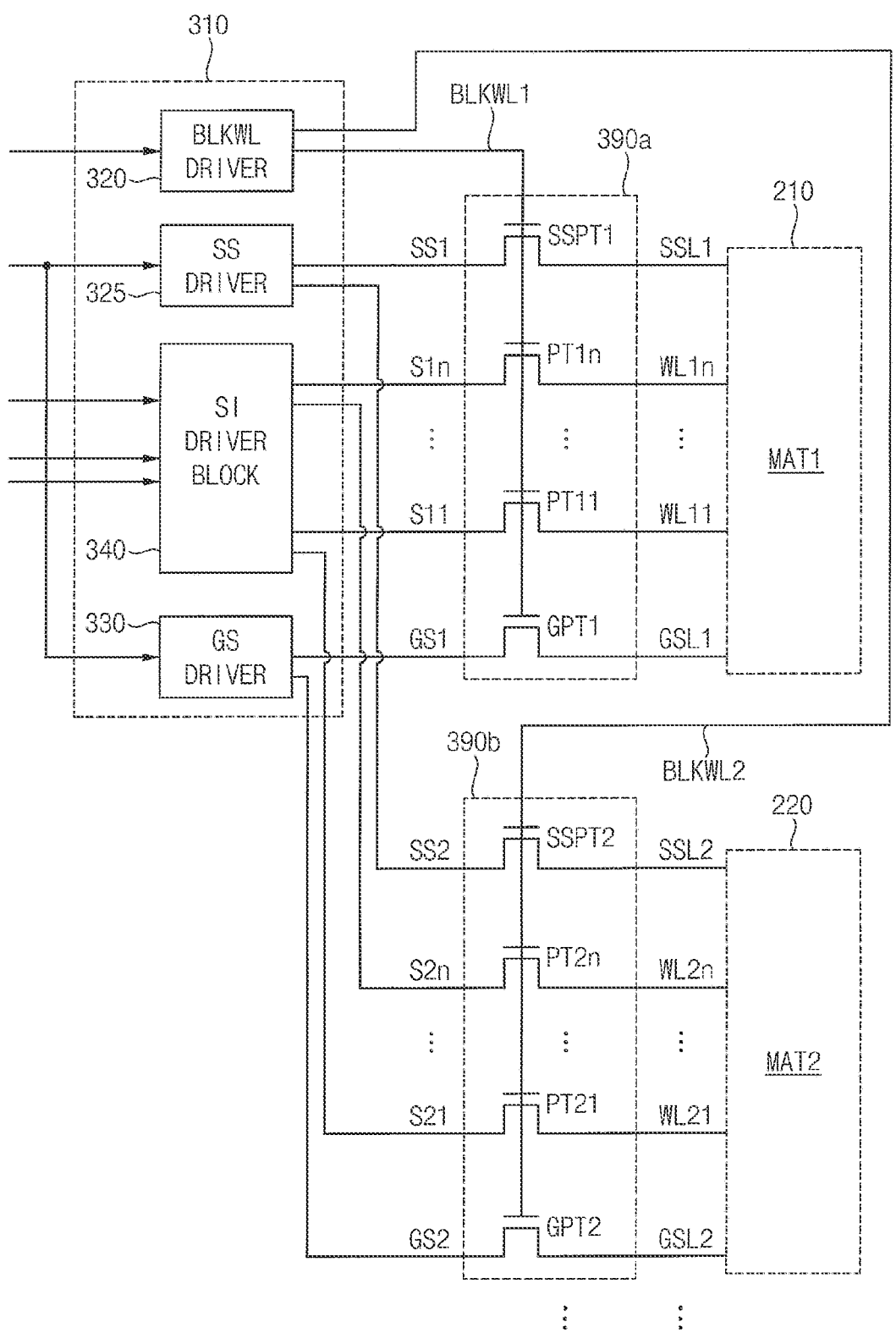
FIG. 10 is a block diagram illustrating an example of the address decoder in the nonvolatile memory device of FIG. 2 according to example embodiments.

FIG. 10 is a block diagram illustrating an example of the address decoder in the nonvolatile memory device of FIG. 2 according to example embodiments.

In FIG. 10, the mats 210 and 220 from among the plurality of mats 210, 220, 230 and 240 are illustrated together with the address decoder 300 for convenience of explanation.

Referring to FIG. 10, the address decoder 300 may include a driver circuit 310 and a plurality of pass switch circuits 390a and 390b (also referred to as pass transistor circuits 390a and 390b).

The driver circuit 310 may transfer voltages provided from the voltage generator 500 to the memory cell array 200 in response to a block address. The driver circuit 310 may include a block selection driver BLKWL DRIVER 320, a string selection driver SS DRIVER 325, a driving line driver block SI DRIVER BLOCK 340 and a ground selection driver GS DRIVER 330.

The block selection driver 320 may supply a high voltage from the voltage generator 500 to the pass switch circuits 390a and 390b in response to the block address. The block selection driver 320 may supply the high voltage to a first block word-line BLKWL1 coupled to gates of a plurality of pass transistors GPT1, PT11~PT1n and SSPT1 in the pass transistor circuit 390a, and may supply the high voltage to a second block word-line BLKWL2 coupled to gates of a plurality of pass transistors GPT2, PT21~PT2n and SSPT2 in the pass transistor circuit 390b. Here, n is an integer greater than one. The block selection driver 320 may control the application of various voltages such as, for example, a pass voltage, a program voltage, and a read voltage to the mats 210 and 220.

The pass transistors PT11~PT1n may be coupled to the mat 210 through a plurality of word-lines WL11~WL1n, and the pass transistors PT21~PT2n may be coupled to the mat 220 through a plurality of word-lines WL21~WL2n.

The string selection driver 325 may supply selection voltage SS1 and SS2 from the voltage generator 500 to a respective one of string selection lines SSL1 and SSL2 through a respective one of the pass transistors SSPT1 and SSPT2 as a string selection signal. During a program operation, the string selection driver 325 may supply the selection voltages SS1 and SS2 so as to turn on all string selection transistors in a selected memory block.

During a program operation, the driving line driver block 340 may supply the program voltage, the pass voltage and the read voltage from the voltage generator 500 to word-lines WL11~WL1n through driving lines S11~S1n and the pass transistors PT11~PT1n, and may supply the program voltage, the pass voltage and the read voltage from the voltage generator 500 to word-lines WL21~WL2n through driving lines S21~S2n and the pass transistors PT21~PT2n. The driving line driver block 340 may include a plurality of driving line drivers corresponding to the plurality of mats in the memory cell array 200.

The ground selection driver 330 may supply ground selection signals GS1 and GS2 from the voltage generator 500 to a respective one of ground selection lines GSL1 and GSL2 through a respective one of the pass transistors GPT1 and GPT2 as a selection signal.

The pass transistors GPT1, PT11~PT1n and SSPT1 are configured such that the ground selection line GSL1, the word-lines WL11~WL1n and the string selection line SSL1 are electrically connected to corresponding driving lines, in response to activation of the high voltage on the first block word-line BLKWL1. The pass transistors GPT2, PT21~PT2n and SSPT2 are configured such that the ground selection line GSL2, the word-lines WL21~WL2n and the string selection line SSL2 are electrically connected to corresponding driving lines, in response to activation of the high voltage on the second block word-line BLKWL2. In example embodiments, each of the pass transistors GPT1, PT11~PT1n and SSPT1 and each of the pass transistors GPT2, PT21~PT2n and SSPT2 may include a high voltage transistor capable of enduring high-voltage.

Figure 11:
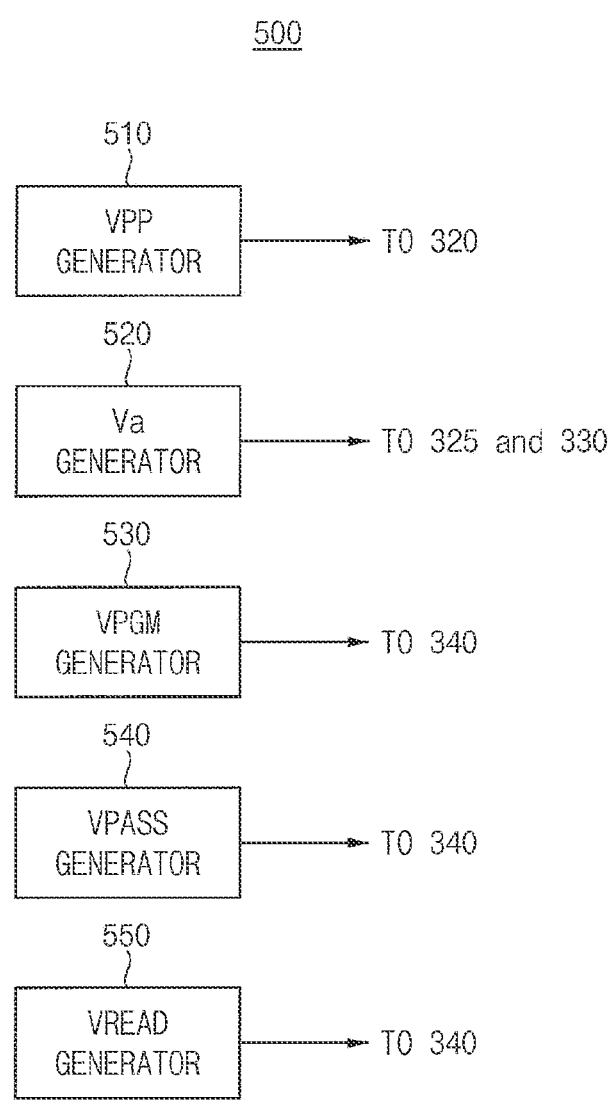
FIG. 11 is a block diagram illustrating an example of the voltage generator in the nonvolatile memory device of FIG. 2 according to example embodiments.

FIG. 11 is a block diagram illustrating an example of the voltage generator in the nonvolatile memory device of FIG. 2 according to example embodiments.

Referring to FIG. 11, the voltage generator 500 may include a high voltage generator VPP generator 510, a selection voltage generator Va GENERATOR 520, a program voltage generator VPGM GENERATOR 530, a pass voltage generator VPASS GENERATOR 540 and a read voltage generator VREAD GENERATOR 550.

The high voltage generator 510 may generate a high voltage to be supplied to the block selection driver 320. The selection voltage generator 520 may generate selection voltages (SS1, SS2, GS1 and GS2 in FIG. 10) to be supplied to the string selection lines SSL1 and SSL2 and the ground selection lines GSL1 and GSL2, respectively, and may provide the selection voltages to the string selection driver 325 and the ground selection driver 330.

The program voltage generator 530 may generate a program voltage to be supplied to a selected word-line during a program operation. The program voltage generator 530 may generate a step voltage according to an incremental step pulse programming (ISPP) method and provide the step voltage to the driving line driver block 340. The pass voltage generator 540 may generate a pass voltage to be supplied to the unselected word-lines during a program operation and provide the pass voltage to the driving line driver block 340. The read voltage generator 550 may generate a read voltage to be supplied to the unselected word-lines during a read operation and provide the read voltage to the driving line driver block 340.

Figure 12:
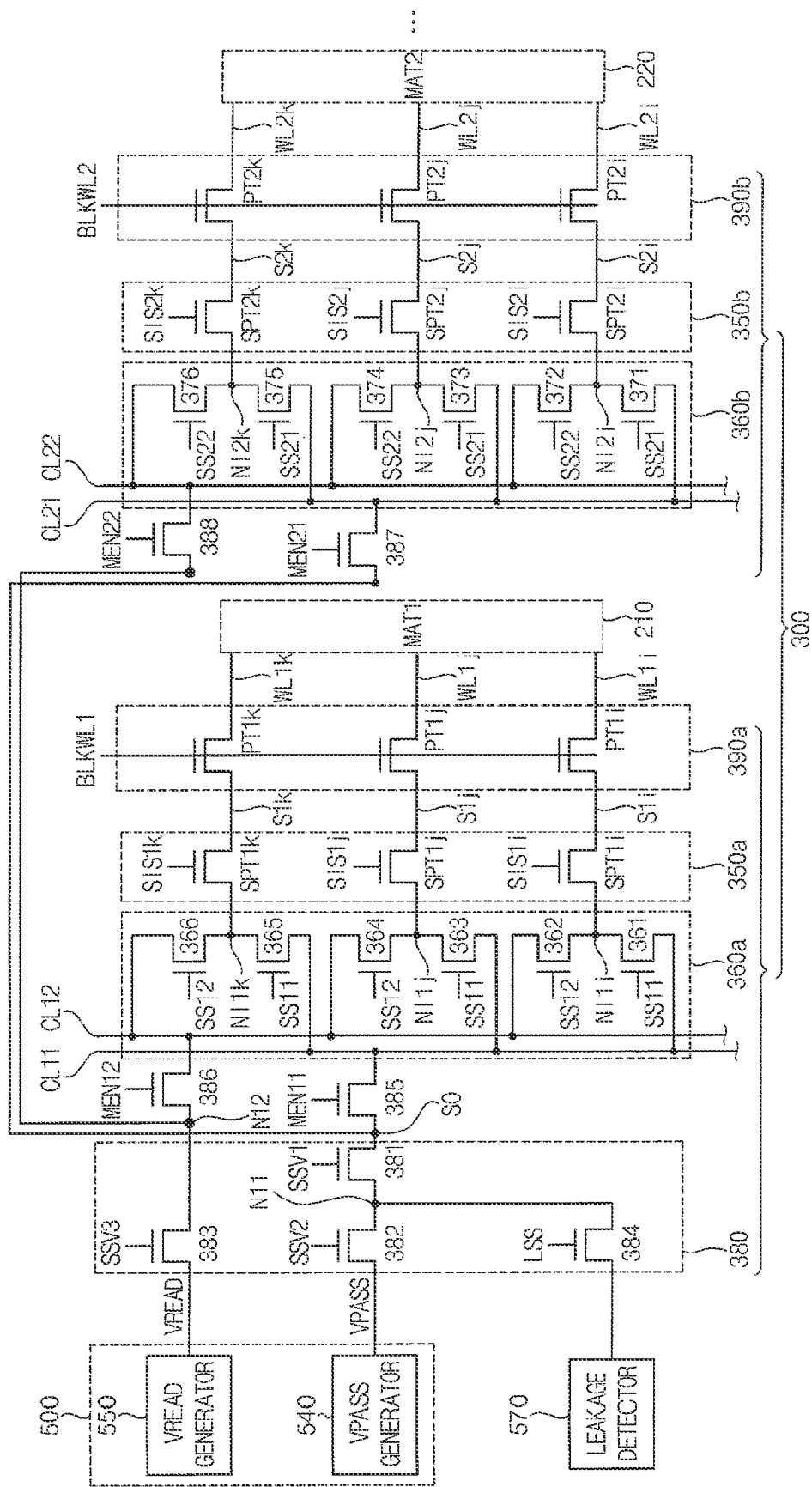
FIG. 12 illustrates a portion of the nonvolatile memory device of FIG. 2 according to example embodiments.

FIG. 12 illustrates a portion of the nonvolatile memory device of FIG. 2 according to example embodiments.

FIG. 12 illustrates the address decoder 300, the voltage generator 500 and the leakage detector 570, which are associated with a leakage detection operation. The pass voltage generator 540 and the read voltage generator 550 of the voltage generator 500 are illustrated. In FIG. 12, the first mat 210 and the second mat 220 from among the plurality of mats 210, 220, 230 and 240 are illustrated together for convenience of explanation.

Referring to FIG. 12, the address decoder 300 may include the pass switch circuit 390a coupled to the first mat 210, the pass switch circuit 390a coupled to the second mat 220, selection switch circuits 350a and 350b, first voltage transfer circuits 360a and 360b, a second voltage transfer circuit 380 and mat selection switches 385, 386, 387 and 388. The selection switch circuits 350a and 350b, the first voltage transfer circuits 360a and 360b, the second voltage transfer circuit 380 and the mat selection switches 385, 386, 387 and 388 may correspond to the driving line driver block 340 in FIG. 10.

The pass switch circuit 390a may include a plurality of pass transistors PT1$i$, PT1$j$ and PT1$k$ which are disposed between word-lines WL1$i$, WL1$j$ and WL1$k$ and driving lines S1$i$, S1$j$ and S1$k$, and connect each of the word-lines WL1$i$, WL1$j$ and WL1$k$ to respective one of the driving lines S1$i$, S1$j$ and S1$k$. Each gate of the pass transistors PT1$i$, PT1$j$ and PT1$k$ is connected to the first block word-line BLKWL1, and each of the pass transistors PT1$i$, PT1$j$ and PT1$k$ may connect each of the word-lines WL1$i$, WL1$j$ and WL1$k$ to a respective one of the driving lines S1$i$, S1$j$ and S1$k$ in response to the high-voltage on the first block word-line BLKWL1. Here, i is an integer greater than zero, j is an integer greater than i and k is an integer greater than j.

In example embodiments, each of the pass transistors PT1$i$, PT1$j$ and PT1$k$ may include a high voltage n-channel metal-oxide semiconductor (NMOS) transistor.

The selection switch circuit 350a may include selection transistors SPT1$i$, SPT1$j$ and SPT1$k$, which are connected to the first voltage transfer circuit 360a and to a respective one of the pass transistors PT1$i$, PT1$j$ and PT1$k$. Each of the selection transistors SPT1$i$, SPT1$j$ and SPT1$k$ may be selectively turned on in response to a respective one of driving line selection signals SIS1$i$, SIS1$j$ and SIS1$k$ applied to a gate of a respective one of the selection transistors SPT1$i$, SPT1$j$ and SPT1$k$, and may provide voltages from the first voltage transfer circuit 360a to the driving lines S1$i$, S1$j$ and S1$k$.

The driving line selection signals SIS1$i$, SIS1$j$ and SIS1$k$ may be included in the switching control signal SCS in FIG. 2.

In example embodiments, each of the selection transistors SPT1$i$, SPT1$j$ and SPT1$k$ may include an NMOS transistor.

The first voltage transfer circuit 360a may include a plurality of NMOS transistors 361, 362, 363, 364, 365 and 366 connected between a connection line CL11 and a connection line CL12.

The NMOS transistor 361 is connected between the connection line CL11 and an internal node NI1$i$ which is coupled to the selection transistor SPT1$i$, and has a gate receiving a selection signal SS11. The NMOS transistor 362 is connected between the connection line CL12 and the internal node NI1$i$, and has a gate receiving a selection signal SS12.

The NMOS transistor 363 is connected between the connection line CL11 and an internal node NI1$j$, which is coupled to the selection transistor SPT1$j$, and has a gate receiving the selection signal SS11. The NMOS transistor 364 is connected between the connection line CL12 and the internal node NI1$j$, and has a gate receiving the selection signal SS12.

The NMOS transistor 365 is connected between the connection line CL11 and an internal node NI1$k$, which is coupled to the selection transistor SPT1$k$, and has a gate receiving the selection signal SS11. The NMOS transistor 366 is connected between the connection line CL12 and the internal node Ni1$k$, and has a gate receiving the selection signal SS12.

The NMOS transistors 361, 363 and 365 are turned on in response to the selection signal SS11 and may provide voltages from the connection line CL11 to the driving lines S1$i$, S1$j$ and S1$k$ through the selection transistors SPT1$i$, SPT1$j$ and SPT1$k$. The NMOS transistors 362, 364 and 366 are turned on in response to the selection signal SS12 and may provide voltages from the connection line CL12 to the driving lines S1$i$, S1$j$ and S1$k$ through the selection transistors SPT1$i$, SPT1$j$ and SPT1$k$.

The selection signals SS11 and SS12 may be included in the switching control signal SCS in FIG. 2.

The pass switch circuit 390b may include a plurality of pass transistors PT2$i$, PT2$j$ and PT2$k$, which are disposed between word-lines WL2$i$, WL2$j$ and WL2$k$ and driving lines S2$i$, S2$j$ and S2$k$, and connect each of the word-lines WL2$i$, WL2$j$ and WL2$k$ to a respective one of the driving lines S2$i$, S2$j$ and S2$k$. Each gate of the pass transistors PT2$i$, PT2$j$ and PT2$k$ is connected to the second block word-line BLKWL2, and each of the pass transistors PT2$i$, PT2$j$ and PT2$k$ may connect each of the word-lines WL2$i$, WL2$j$ and WL2$k$ to a respective one of the driving lines S2$i$, S2$j$ and S2$k$ in response to the high-voltage on the second block word-line BLKWL2.

In example embodiments, each of the pass transistors PT2$i$, PT2$j$ and PT2$k$ may include a high voltage NMOS transistor.

The selection switch circuit 350b may include selection transistors SPT2$i$, SPT2$j$ and SPT2$k$, which are connected to the first voltage transfer circuit 360b and to a respective one of the pass transistors PT2$i$, PT2$j$ and PT2$k$. Each of the selection transistors SPT2$i$, SPT2$j$ and SPT2$k$ may be selectively turned on in response to a respective one of driving line selection signals SIS2$i$, SIS2$j$ and SIS2$k$ applied to a gate of a respective one of the selection transistors SPT2$i$, SPT2$j$ and SPT2$k$, and may provide voltages from the first voltage transfer circuit 360b to the driving lines S2$i$, S2$j$ and S2$k$.

The driving line selection signals SIS2$i$, SIS2$j$ and SIS2$k$ may be included in the switching control signal SCS in FIG. 2.

In example embodiments, each of the selection transistors SPT2$i$, SPT2$j$ and SPT2$k$ may include an NMOS transistor.

The first voltage transfer circuit 360b may include a plurality of NMOS transistors 371, 372, 373, 374, 375 and 376 connected between a connection line CL21 and a connection line CL22.

The NMOS transistor 371 is connected between the connection line CL11 and an internal node NI2i, which is coupled to the selection transistor SPT2i, and has a gate receiving a selection signal SS21. The NMOS transistor 372 is connected between the connection line CL22 and the internal node NI2i, and has a gate receiving a selection signal SS22.

The NMOS transistor 373 is connected between the connection line CL11 and an internal node NI2j, which is coupled to the selection transistor SPT2j, and has a gate receiving the selection signal SS21. The NMOS transistor 374 is connected between the connection line CL22 and the internal node NI2j, and has a gate receiving the selection signal SS22.

The NMOS transistor 375 is connected between the connection line CL11 and an internal node NI2k, which is coupled to the selection transistor SPT2k, and has a gate receiving the selection signal SS21. The NMOS transistor 376 is connected between the connection line CL22 and the internal node Ni2k, and has a gate receiving the selection signal SS22.

The NMOS transistors 371, 373 and 375 are turned on in response to the selection signal SS21 and may provide voltages from the connection line CL21 to the driving lines S2i, S2j and S2k through the selection transistors SPT2i, SPT2j and SPT2k. The NMOS transistors 372, 374 and 376 are turned on in response to the selection signal SS22 and may provide voltages from the connection line CL22 to the driving lines S2i, S2j and S2k through the selection transistors SPT2i, SPT2j and SPT2k.

The selection signals SS21 and SS22 may be included in the switching control signal SCS in FIG. 2.

The second voltage transfer circuit 380 may include NMOS transistors 381, 382, 383 and 384.

The NMOS transistor 381 is connected between a first node N11 and a sensing node SO, and has a gate receiving a switching control signal SSV1. The NMOS transistor 382 is connected between the first node N11 and the pass voltage generator 540 to receive a pass voltage VPASS, and has a gate receiving a switching control signal SSV2. The NMOS transistors 381 and 382 may be selectively turned on in response to the switching control signals SSV1 and SSV2, and may transfer the pass voltage VPASS to the driving lines S1i, S1j and S1k via the mat selection switch 385 and the connection line CL11 or may transfer the pass voltage VPASS to the driving lines S2i, S2j and S2k via the mat selection switch 387 and the connection line CL21.

The NMOS transistor 383 is connected between a second node N12 and the read voltage generator 550 to receive a read voltage VREAD, and has a gate receiving a switching control signal SSV3. The NMOS transistor 383 may be selectively turned on in response to the switching control signals SSV3, and may transfer the read voltage VREAD to the driving lines S2i, S2j and S2k via the mat selection switch 386 and the connection line CL12 or may transfer the read voltage VREAD to the driving lines S1i, S1j and S1k via the mat selection switch 388 and the connection line CL22.

The NMOS transistor 384 is connected between the first node N11 and the leakage detector 570, and has a gate receiving a switching control signal LCS. The NMOS transistor 384 may be selectively turned on in response to the switching control signal LCS and may provide a voltage of the sensing node SO to the leakage detector 570 via the first node N11.

The mat selection switch 385 is connected between the sensing node SO and the connection line CL11 and has a gate receiving a first mat enable signal MEN11. The mat selection switch 386 is connected between the second node N12 and the connection line CL12 and has a gate receiving a first mat enable signal MEN12. The mat selection switch 387 is connected between the sensing node SO and the connection line CL21 and has a gate receiving a second mat enable signal MEN21. The mat selection switch 388 is connected between the second node N12 and the connection line CL22 and has a gate receiving a second mat enable signal MEN22.

The mat selection switches 385 and 386 may be turned on in response to the first mat 210 being selected and the mat selection switches 387 and 388 may be turned on in response to the second mat 220 being selected.

The switching control signals SSV1, SSV2, SSV3 and LSS and the mat enable signals MEN11, MEN12, MEN21 and MEN22 may be included in the switching control signal SCS in FIG. 2.

Figure 13:
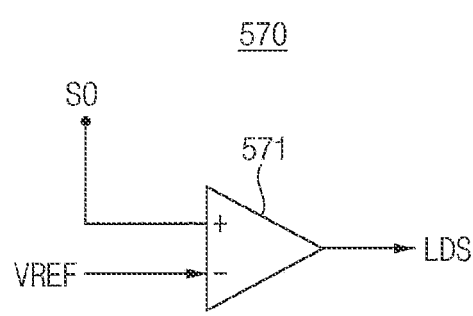
FIG. 13 illustrates an example of the leakage detector in the nonvolatile memory device of FIG. 2 according to example embodiments.

FIG. 13 illustrates an example of the leakage detector in the nonvolatile memory device of FIG. 2 according to example embodiments.

Referring to FIG. 13, the leakage detector 570 may include a comparator 571. The comparator 571 may include a negative (−) input terminal connected to the sensing node SO, a positive (+) input terminal to receive a reference voltage VREF and an output terminal to provide the leakage detection signal LDS.

When the comparator 571 is coupled to the sensing node SO through the NMOS transistor 384 during a sensing period, the comparator 571 may compare the voltage level of the sensing node SO with the reference voltage VREF and may provide the leakage detection signal LDS to the control circuit 450 in FIG. 2 based on a result of the comparison, when the voltage level of the sensing node SO is reduced below the reference voltage VREF.

Figure 14:
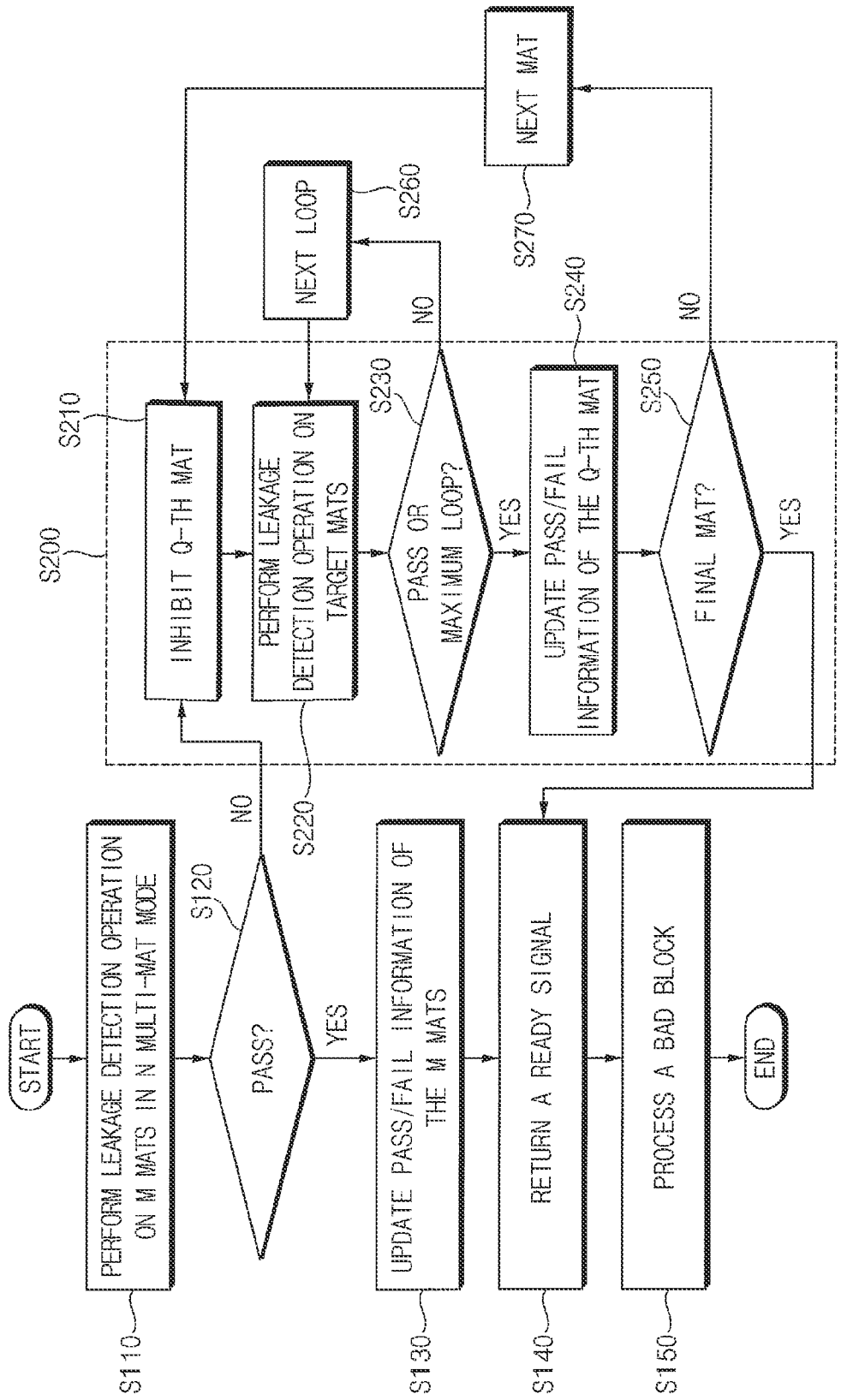
FIG. 14 is a flowchart illustrating a method of operating a nonvolatile memory device according to example embodiments.

FIG. 14 is a flowchart illustrating a method of operating a nonvolatile memory device according to example embodiments.

Referring to FIGS. 2 through 14, in a method of a nonvolatile memory device 100 including a plurality of mats, a leakage detection circuit 570 and a control circuit 450, the control circuit 450 controls the leakage detection circuit 570 to perform a first leakage detection operation on M mats selected from the plurality of mats in an N multi-mat mode, during which N mats from among the plurality of mats operate concurrently (operation S110). Here, M may be a natural number greater than one, and N may be a natural number greater than one.

The control circuit 450 determines whether the M mats pass the first leakage detection operation based on whether a leakage of at least a portion of word-lines of the M mats occurs (operation S120).

In response to the M mats passing the first leakage detection operation (YES in operation S120), the control circuit 450 updates pass/fail information of the M mats (operation S1300), the control circuit 450 transitions a status signal RnB to a logic high level to return the status signal RnB indicating a ready state to the memory controller 50 (operation S140) and the control circuit 450 processes a portion of a plurality of memory blocks as a bad block based on pass/fail information of the plurality of mats (operation S150).

In response to the M mats not passing the first leakage detection operation (NO in operation S120), the control circuit 450 inhibits a Q-th mat selected from among the M mat by deactivating a block word-line of the Q-th mat (operation S210) and performs a second leakage detection operation on the at least one target mat from among the M mats except for the Q-th mat (operation S220). Here, Q may be a natural number.

The control circuit 450 determines whether the at least one target mat passes the second leakage detection operation or determines whether the second leakage detection operation corresponds to a maximum loop based on whether the leakage of word-lines of the at least one target mat occurs (operation S230).

In response to the at least one target mat not passing the second leakage detection operation or in response to the second leakage detection operation not corresponding to the maximum loop (NO in operation S260), the control circuit 250 performs a next loop of the second leakage detection operation on the at least one target mat including the Q-th mat (operation S260).

In response to the at least one target mat passing the second leakage detection operation or in response to the second leakage detection operation corresponding to the maximum loop (YES in operation S260), the control circuit 250 updates pass/fail information associated with the leakage of the at least one target mat (operation S240) and determines whether the Q-th mat corresponds to a final mat of the M mats (operation S250).

In response to the Q-th mat not corresponding to the final mat of the M mats (NO in operation S250), the control circuit 450 inhibits an R-th mat (next mat) from among the M mat (operation S270) and performs the second leakage detection operation on the at least one target mat from among the M mats except the R-th mat (operation S270). Here, R may be a natural number different from Q. The R-th mat may include at least one or more mat.

In FIG. 14, according to an embodiment, operations S210, S220, S230, S240 and S250 may constitute a second step of leakage detection operation in two-step leakage detection operation.

Figure 15:
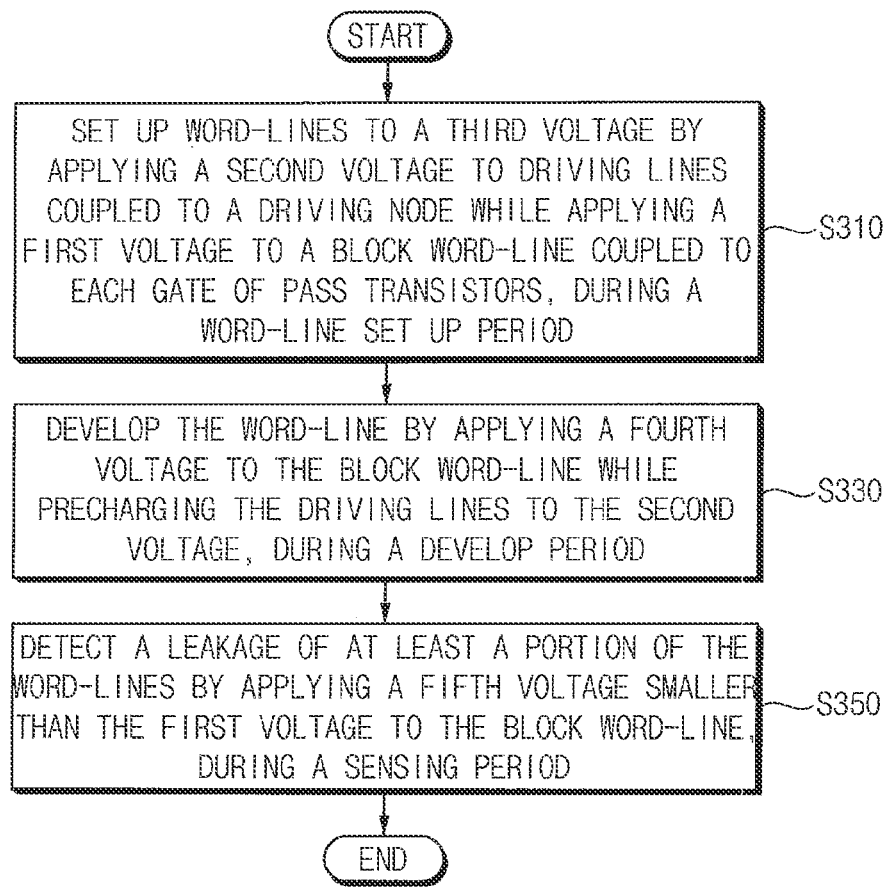
FIG. 15 is a flowchart illustrating a leakage detection operation performed on a selected mat or target mats.

FIG. 15 is a flowchart illustrating a leakage detection operation performed on a selected mat or target mats.

FIG. 15 illustrates a leakage detection operation performed on a nonvolatile memory device including a plurality of mats, each of which includes at least one memory block which includes a plurality of cell strings, where each cell string includes a string selection transistor, a plurality of memory cells and a ground selection transistor connected between a bit-line and a common source line.

Referring to FIG. 15, during a word-line set-up period, while applying a first voltage to a block word-line that is coupled to each gate of a plurality of pass transistors which respectively connect a string selection line, a plurality of word-lines and a ground selection line of each of the M mats to a plurality of driving lines, a second voltage is applied to the plurality of driving lines, commonly coupled to a sensing node, to set-up the plurality of word-lines with a third voltage, where the string selection line is coupled to the string selection transistor, the plurality of word-lines are coupled to the memory cells and the ground selection line is coupled to the ground selection transistor (operation S310).

During a word-line development period, while precharging the plurality of driving lines with the second voltage, target word-lines from among the plurality of word-lines are developed by applying a fourth voltage to the block word-line to turn off the plurality of pass transistors (operation S330). The fourth voltage may correspond to a ground voltage.

During a sensing period, leakage of at least a portion of the target word-lines is detected by applying a fifth voltage smaller than the first voltage to the block word-line and by detecting a voltage drop of the sensing node (operation S350).

Figure 16:
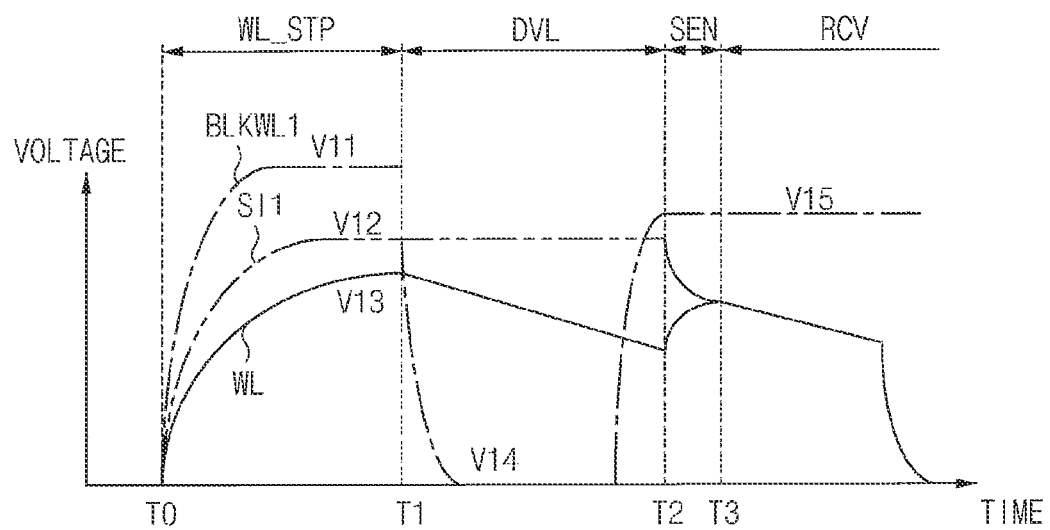
FIGS. 16, 17 and 18 are timing diagrams illustrating a leakage detection operation of the target mat, an operation of the inhibited mat and an operation of an unselected mat according to example embodiments, respectively.
Figure 17:
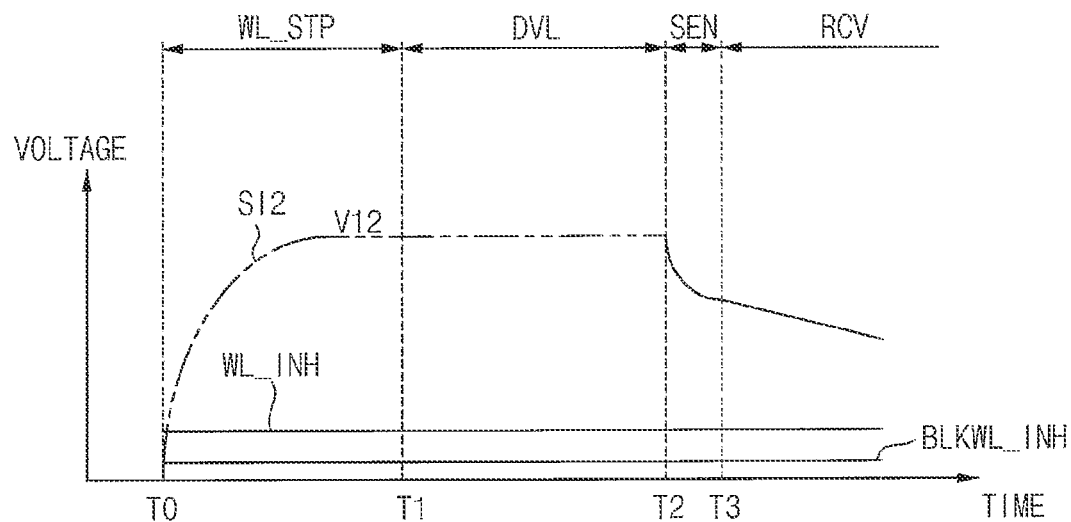
Figure 18:
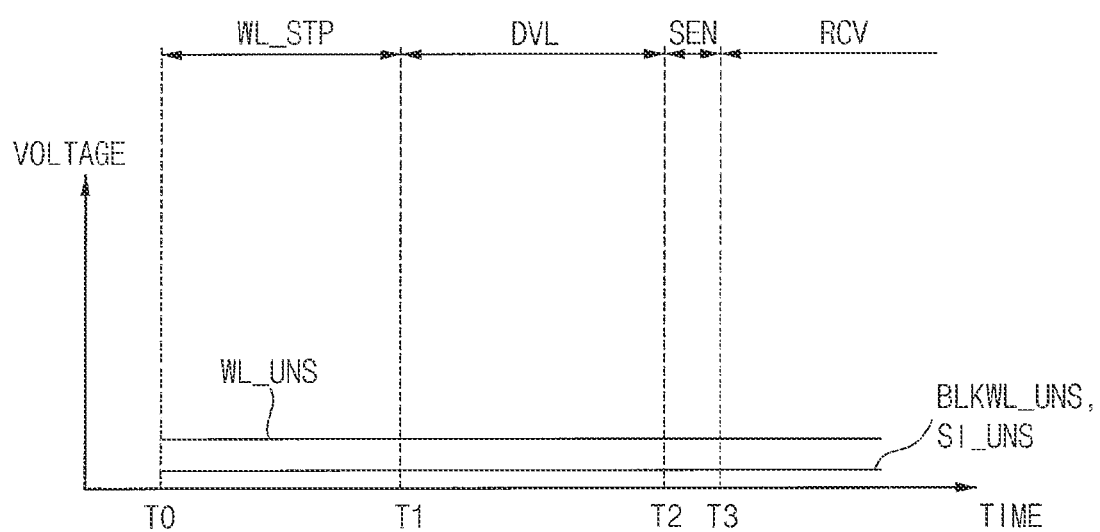

FIGS. 16, 17 and 18 are timing diagrams illustrating a leakage detection operation of the target mat, an operation of the inhibited mat and an operation of an unselected mat according to example embodiments, respectively.

Each of FIGS. 16, 17 and 18 illustrates a word-line set-up period WL_STP, a word-line development period DVL, a sensing period SEN and a recovery period RCV of a leakage detection operation for detecting leakage of a plurality of word-lines. Time points T0~T4 represents boundaries of the periods.

Referring to FIG. 16, during the word-line set-up period WL_STP, a first voltage V11 is applied to a first block word-line BLKWL1 of a selected mat, and a second voltage V22 is applied to driving lines SI1. A level of the first voltage V11 may be greater than a level of the second voltage V12. When the pass transistors are turned on (enabled) in response to the first voltage V11 applied to the first block word-line BLKWL1, voltages of the word-lines WL coupled to the driving lines SI1 through the pass transistors increase from the ground voltage to a level of a third voltage V13 and the word-lines WL are set-up with the third voltage V13. A level of the third voltage V13 may be smaller than a level of the second voltage V22.

During the word-line development period DVL, while precharging the driving lines SI1 with the second voltage V12, a fourth voltage V14 corresponding to the ground voltage is applied to the pass transistors to turn off the pass transistors. Since the pass transistors are turned off, voltages of the word-lines WL decrease from the third voltage V13 and the word-lines are developed.

During the sensing period SEN, leakage of at least a portion of the word-lines is detected (determined) by applying a fifth voltage V15 smaller than the first voltage V11 to the first block word-line BLKWL1 and by detecting a voltage drop of the sensing node.

Since at least one pass transistor coupled to at least one word-line in which leakage occurs is turned on by the fifth voltage V15, charge sharing occurs between a driving line coupled to the at least one pass transistor and the at least one word-line in which leakage occurs, and a voltage level of the driving line coupled to the at least one word-line in which leakage occurs is decreased. Therefore, a voltage drop occurs at the sensing node.

During the recovery period RCV, the voltage levels of the at least one word-line in which leakage occurs and the driving line coupled to the at least one word-line in which leakage occurs continuously decrease.

Referring to FIG. 17, during the word-line set-up period WL_STP, during the word-line development period DVL, during the sensing period SEN and during the recovery period RCV, a voltage corresponding to a ground voltage is applied to a block word-line BLKWL_INH of the inhibited mat and a voltage corresponding to a power supply voltage is applied to word-lines WL_INH of the inhibited mat. Therefore, a voltage of driving lines SI2 of the inhibited mat is substantially the same as a voltage (for example, the second voltage V12) of driving lines of the target mat.

Referring to FIG. 18, during the word-line set-up period WL_STP, during the word-line development period DVL, during the sensing period SEN and during the recovery period RCV, a voltage corresponding to a ground voltage is applied to a block word-line BLKWL_UNS and driving lines SI_UNS of the unselected mat and a voltage corresponding to a power supply voltage is applied to word-lines WL_UNS of the unselected mat.

Figure 19:
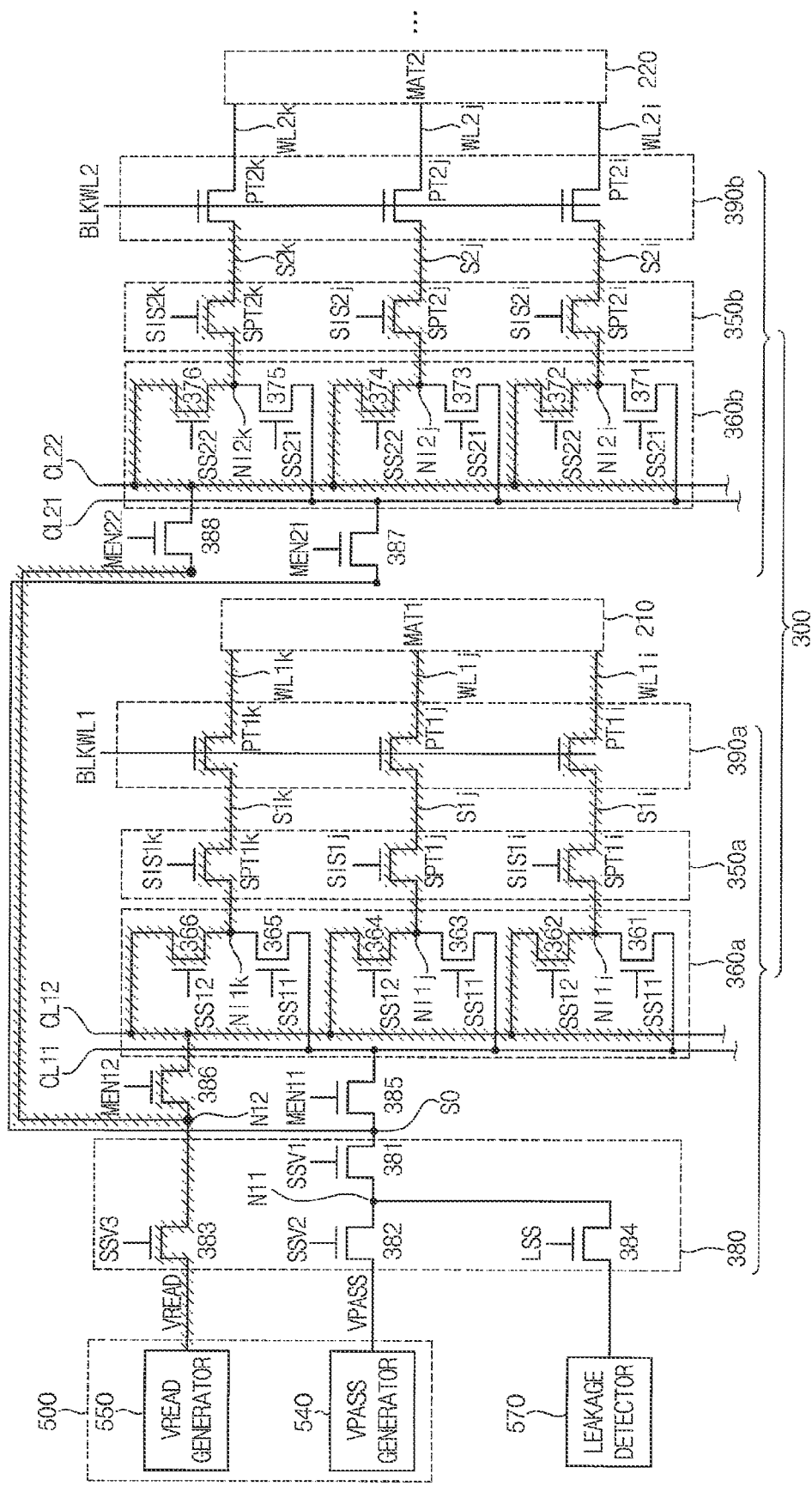
FIGS. 19, 20 and 21 illustrate operations of the nonvolatile memory device of FIG. 12 during a word-line set-up period, a word-line development period and a sensing period, respectively, according to example embodiments.
Figure 20:
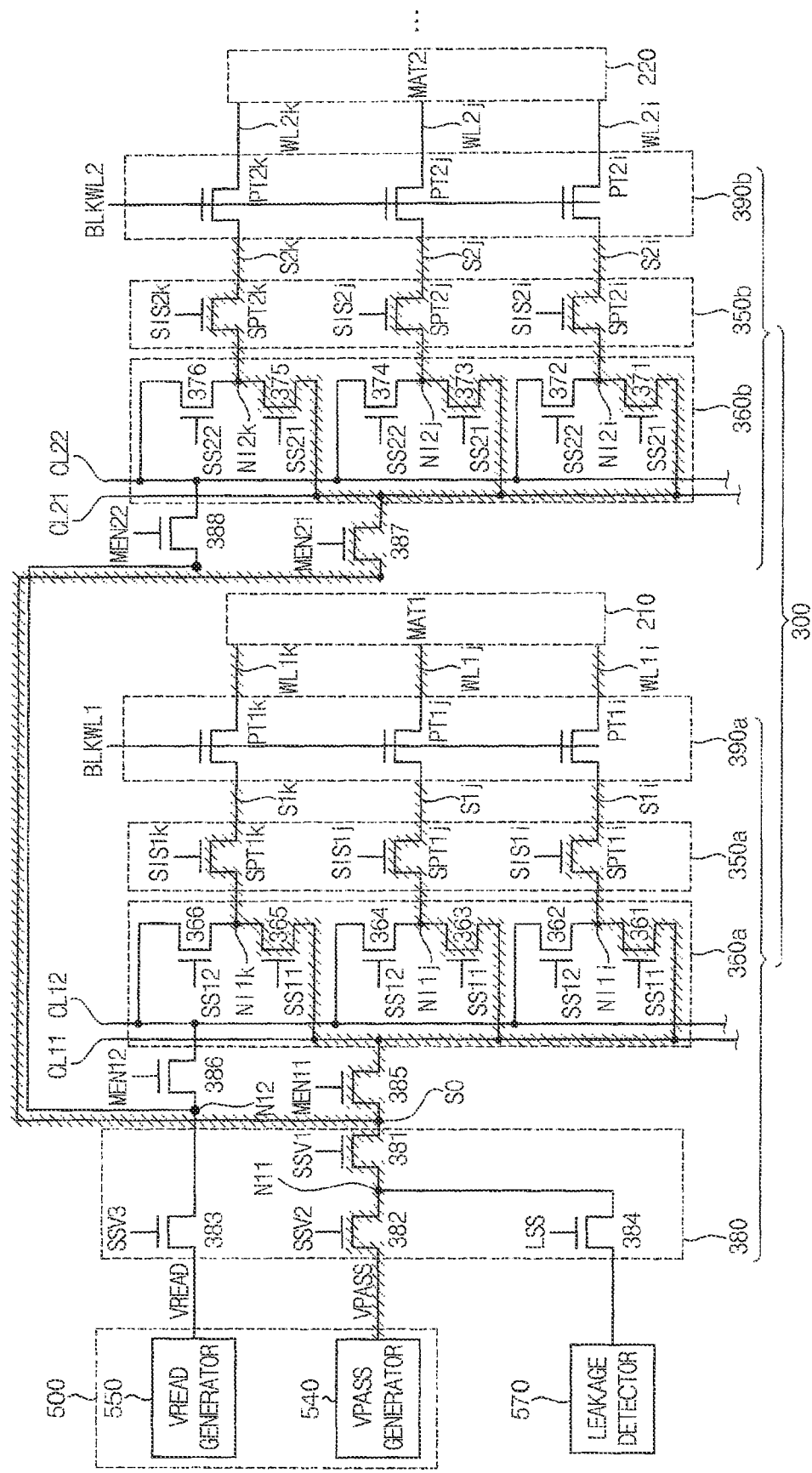
Figure 21:
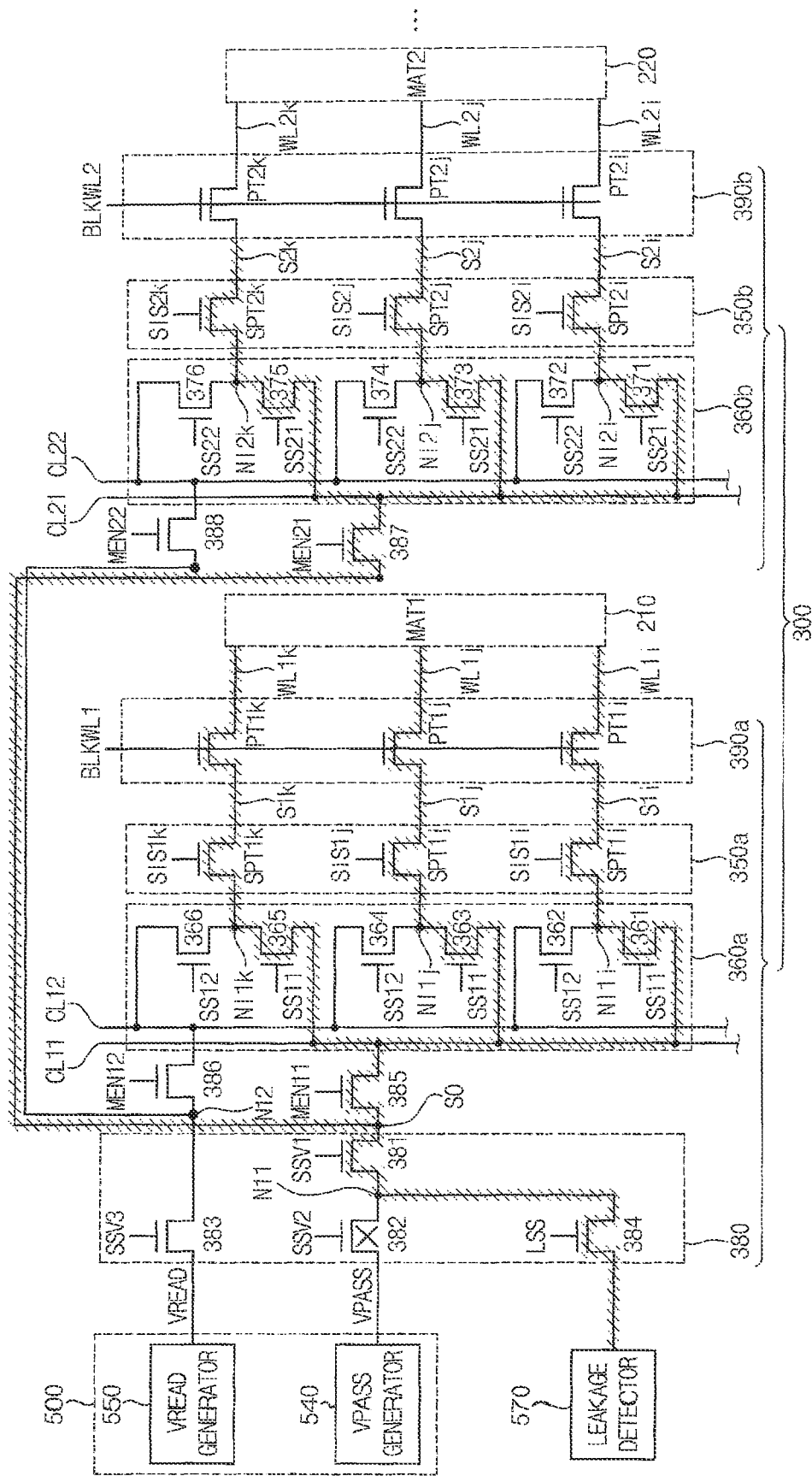

FIGS. 19, 20 and 21 illustrate operations of the nonvolatile memory device of FIG. 12 during the word-line set-up period, the word-line development period and the sensing period, respectively, according to example embodiments.

In FIGS. 19, 20 and 21, it is assumed that the first mat 210 corresponds to the target mat and the second mat 220 corresponds to the inhibited mat.

Referring to FIG. 19, during the word-line set-up period, the word-lines WL1$i$, WL1$j$ and WL$ik$ are set-up with a third voltage by applying a second voltage to the driving lines S1$i$, S1$j$ and S1$k$ using the read voltage VREAD provided from the read voltage generator 550. The second voltage may be applied to the driving lines S1$i$, S1$j$ and S1$k$ by turning on the NMOS transistor 383, turning off the NMOS transistors 381 and 382, turning on the mat selection switch 386, turning off the NMOS transistors 361, 363 and 365, turning on the NMOS transistors 362, 364 and 366, turning on the selection transistors SPT1$i$, SPT1$j$ and SPT1$k$ and applying a first voltage to the first block word-line BLKWL1 to turn on the pass transistors PT1$j$, PT1$j$ and PT1$k$.

In addition, during the word-line set-up period, the driving lines S2$i$, S2$j$ and S2$k$ are precharged with the second voltage and the second mat 220 is inhibited by turning off the NMOS transistors 371, 373 and 375, turning on the NMOS transistors 372, 374 and 376, turning on the mat selection switch 388, turning on the selection transistors SPT2$i$, SPT2$j$ and SPT2$k$ and applying a fourth voltage to the second block word-line BLKWL2 to turn off the pass transistors PT2$j$, PT2$j$ and PT2$k$.

Referring to FIG. 20, during the word-line development period, the word-lines WL1$i$, WL1$j$ and WL1$k$ are developed, while the driving lines S1$i$, S1$j$ and S1$k$ are precharged with the second voltage using the pass voltage VPASS provided from the pass voltage generator 540 by applying the fourth voltage to the first block word-line BLKWL1 to turn off the pass transistors PT1$j$, PT1$j$ and PT1$k$, turn off the NMOS transistor 383, turn on the NMOS transistors 381 and 382, turn off the NMOS transistor 384, turn on the mat selection switch 385, turn on the NMOS transistors 361, 363 and 365, turn off the NMOS transistors 362, 364 and 366, and turn on the selection transistors SPT1$i$, SPT1$j$ and SPT1$k$.

In addition, during the word-line development period, the driving lines S2$i$, S2$j$ and S2$k$ are precharged with the second voltage by applying the fourth voltage to the second block word-line BLKWL2 to turn off the pass transistors PT2$j$, PT2$j$ and PT2$k$, turn on the mat selection switch 387, turn on the NMOS transistors 371, 373 and 375, turn off the NMOS transistors 372, 374 and 376 and turn on the selection transistors SPT2$i$, SPT2$j$ and SPT2$k$.

Referring to FIG. 21, during the sensing period, each of the driving lines S1$i$, S1$j$ and S1$k$ may be connected to respective one of the word-lines WL1$i$, WL1$j$ and WL1$k$ by applying a fifth voltage to each gate of the pass transistors PT1$j$, PT1$j$ and PT1$k$ through the first block word-line BLKWL1, turning off the NMOS transistors 382 and 383, turning on the mat selection switch 385, turning on the NMOS transistors 361, 363 and 365, turning off the NMOS transistors 362, 364 and 366, and turning on the selection transistors SPT1$i$, SPT1$j$ and SPT1$k$.

In addition, during the sensing period, the selection transistors SPT2$i$, SPT2$j$ and SPT2$k$ are turned off by applying the fourth voltage to the second block word-line BLKWL2, turning on the mat selection switch 387, turning on the NMOS transistors 371, 373 and 375, turning off the NMOS transistors 372, 374 and 376 and turning on the selection transistors SPT2$i$, SPT2$j$ and SPT2$k$. The line connected to the leakage detector 570 may be precharged with the second voltage.

Assuming that leakage occurs in the word-line WL1$k$ and the word-lines WL1$i$ and WL1$j$ are normal word-lines in which no leakage occurs, a threshold voltage of the pass transistor PT1$k$ is reduced because a voltage level at a terminal of the pass transistor PT1$k$, coupled to the word-line WL1$k$ is reduced, the pass transistor PT1$k$ is turned on by the fifth voltage and the pass transistors PT1$i$ and PT1$j$ are in an off state.

Since the pass transistor PT1$k$ is turned on, charge sharing occurs between the word-line WL1$k$ and the driving line S1$k$, a voltage level of the driving line S1$k$ is reduced and a voltage level of the sensing node SO is reduced because the sensing node SO is connected to the driving line S1$k$ through the NMOS transistor 365 and the selection transistor SPT1$k$. The leakage detector 570, coupled to the sensing node SO through the NMOS transistors 381 and 385, compares the voltage level of the sensing node SO with a reference voltage and may provide the leakage detection signal LDS to the control circuit 450 in FIG. 2 based on a result of the comparison, when the voltage level of the sensing node SO is reduced below the reference voltage. In this case, when the leakage occurs in at least one of the word-lines WL2$i$, WL2$j$ and WL2$k$ of the second mat 220 corresponding to the inhibited mat, charge sharing does not occur between the word-lines WL2$i$, WL2$j$ and WL2$k$ and the driving lines S2$i$, S2$j$ and S2$k$ because the pass transistors PT2$i$, PT2$j$ and PT2$k$ are in an off state.

The control circuit 450 may determine that leakage occurs in at least one of the word-lines WL1$i$, WL1$j$ and WL1$k$ of the first mat 210 corresponding to the target mat in response to activation of the leakage detection signal LDS.

In FIGS. 12 through 21, it is described as the leakage detection operation is performed on the word-lines WL. However, example embodiments are not limited thereto. For example, the leakage detection operation may be performed on the string selection line SSL and the ground selection line GSL in FIG. 6 according to example embodiments.

Figure 22:
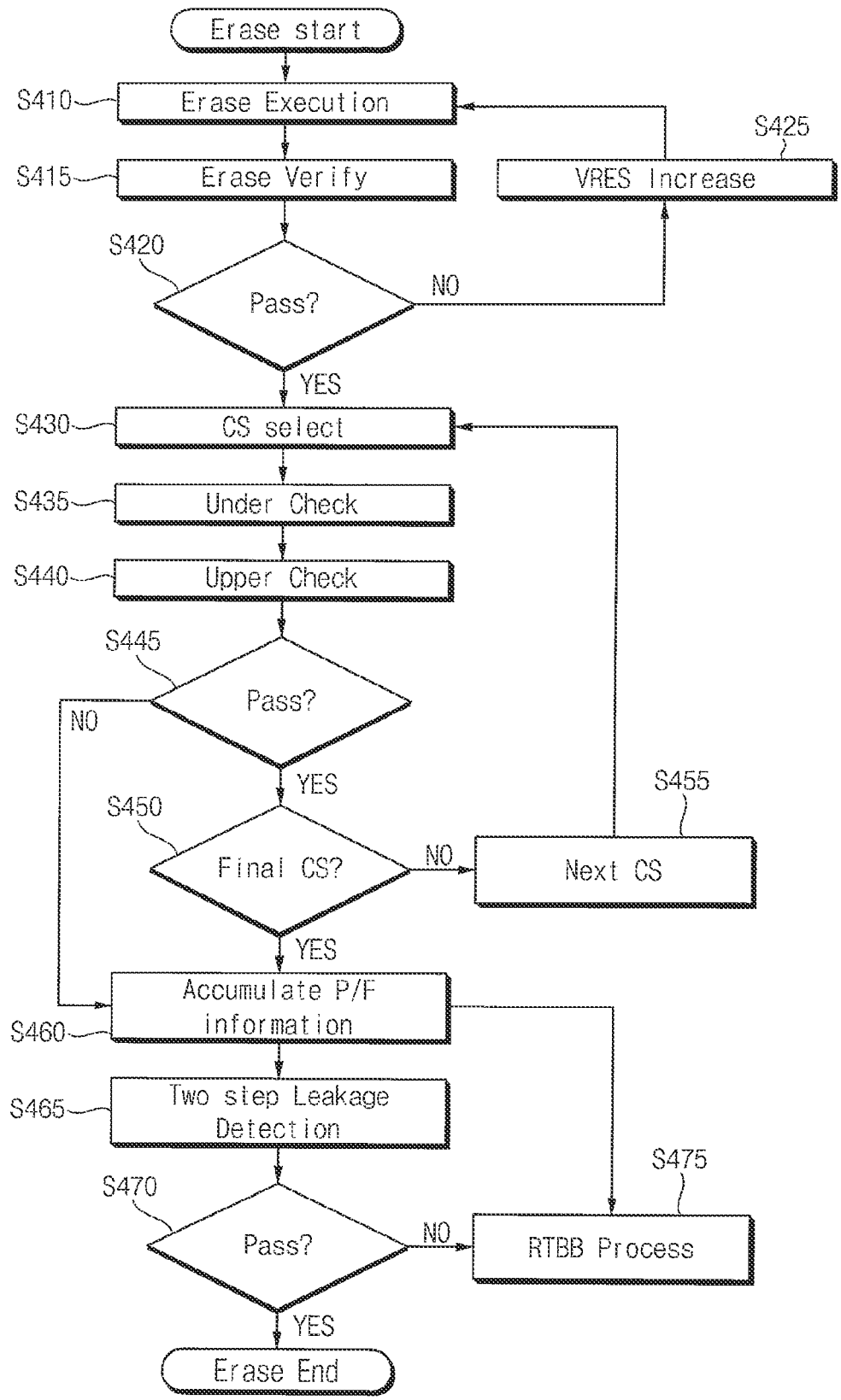
FIG. 22 is a flowchart illustrating an example in which a leakage detection operation is applied to an erase loop of the nonvolatile memory device.

FIG. 22 is a flowchart illustrating an example in which a leakage detection operation is applied to an erase loop of the nonvolatile memory device.

Referring to FIG. 22, an erase loop starts, and the control circuit 450 may perform an erase operation on a selected memory block (operation S410). The control circuit 450 may perform an erase verification operation on word-lines of the selected memory block (operation S415).

The control circuit 450 determines whether the word-lines pass the erase verification operation (operation S420). In response to the word-lines not passing the erase verification operation (NO in operation S420), the control circuit 450 increases an erase voltage VERS (operation S425) and performs the operations S410, S415 and S420 based on the increased erase voltage.

In response to the word-lines passing the erase verification operation (YES in operation S420), the control circuit 450 may select one of the plurality of mats and selects one of a plurality of cell stings in the selected mat (CS select, operation S430).

The control circuit 450 may check a lower limit of a threshold voltage of each of a string selection transistor and a ground selection transistor of the selected cell string (Under Check, operation S435), may check an upper limit of a threshold voltage of each of the string selection transistor and the ground selection transistor of the selected cell string (Upper Check, operation S440) and may determine whether the selected cell string passes the threshold voltage check operation (operation S445).

In response to the selected cell string not passing the threshold voltage check operation (NO in operation S445), the control circuit 450 may update (accumulate) pass/fail P/F information of the selected cell string (operation S460), and may process memory blocks in the selected mat as a run-time bad block RTBB (operation S475).

In response to the selected cell string passing the threshold voltage check operation (YES in operation S445), the control circuit 450 determines whether the selected cell string corresponds to a final cell string of the selected mat (operation S450).

In response to the cell string not corresponding to the final cell string of the selected mat (NO in S450), the control circuit 450 selects a next cell string in the selected mat (operation S455) and performs the operations S435, S440 and S445.

In response to the cell string corresponding to the final cell string of the selected mat (YES in S450), the control circuit 450 may update (accumulate) pass/fail P/F information of the selected mat (operation S460), perform the two step leakage detection operation on the plurality of mats (operation S465) and determine whether each of the plurality of mats passes the two step leakage detection operation (operation S470).

In response to at least a portion of the plurality of mats not passing the two step leakage detection operation, the control circuit 450 may process memory blocks in the portion of the plurality of mats as a run-time bad block RTBB (operation S475).

In response to the plurality of mats passing the two step leakage detection operation, the control circuit 450 completes the erase loop.

The control circuit 450 may transition the status signal RnB to a ready state after the erase loop is completed.

The control circuit 450 may include a register to store pass/fail information of each of the plurality of mats 210, 220, 230 and 240 based on the leakage detection signal LDS. The register may store information about whether the selected cell string has passed the threshold voltage check operation.

Figure 23:
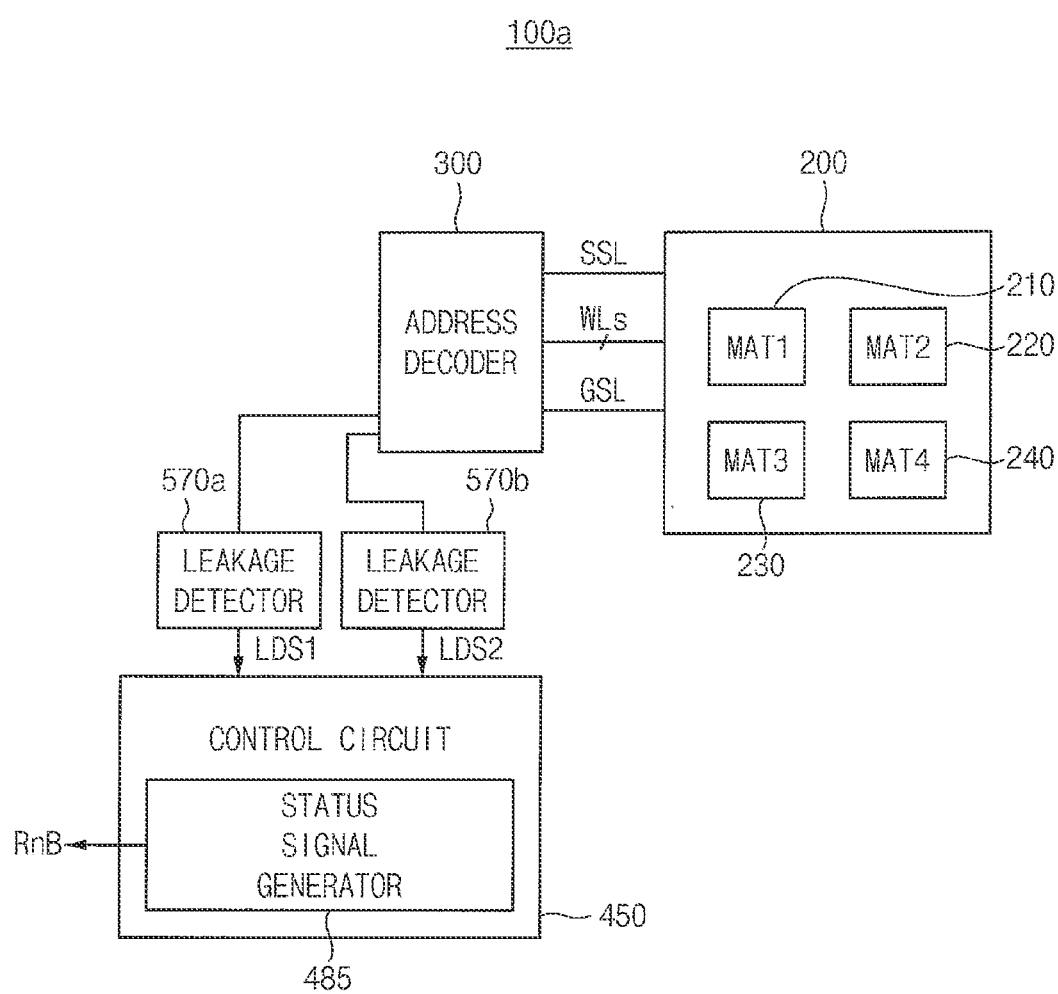
FIG. 23 is a block diagram illustrating an example of a nonvolatile memory device according to example embodiments.

FIG. 23 is a block diagram illustrating an example of a nonvolatile memory device according to example embodiments.

Referring to FIG. 23, a nonvolatile memory device 100a may include a memory cell array 200, an address decoder 300, a first leakage detector 570a and a second leakage detector 570b and a control circuit 450.

The nonvolatile memory device 100a may be similar to the nonvolatile memory device 100 of FIG. 2 and components associated with a leakage detection operation are illustrated in FIG. 23.

The memory cell array 200 may include a plurality of mats 210, 220, 230 and 240 corresponding to different bit-lines. The mats 210 and 220 may constitute a first bank and the mats 230 and 240 may constitute a second bank.

The control circuit 450 may include a status signal generator 485. The status signal generator 485 may generate the status signal RnB indicating an operating state of the erase loop, the program loop, the read operation and the leakage detection operation of the nonvolatile memory device 100a and may provide the status signal RnB to the memory controller 50.

The first leakage detector 570a may be coupled to the address decoder 300, may be coupled to driving lines coupled to the word-lines WLs of the of mats 210 and 220 at a first sensing node in the address decoder 300 to detect leakage of at least a portion of the word-lines WLs of the mats 210 and 220 and may provide the control circuit 450 with a leakage detection signal LDS1 when the leakage is detected.

The second leakage detector 570b may be coupled to the address decoder 300, may be coupled to driving lines coupled to the word-lines WLs of the of mats 230 and 240 at a second sensing node in the address decoder 300 to detect leakage of at least a portion of the word-lines WLs of the mats 230 and 230 and may provide the control circuit 450 with a leakage detection signal LDS2 when the leakage is detected.

Figure 24A:
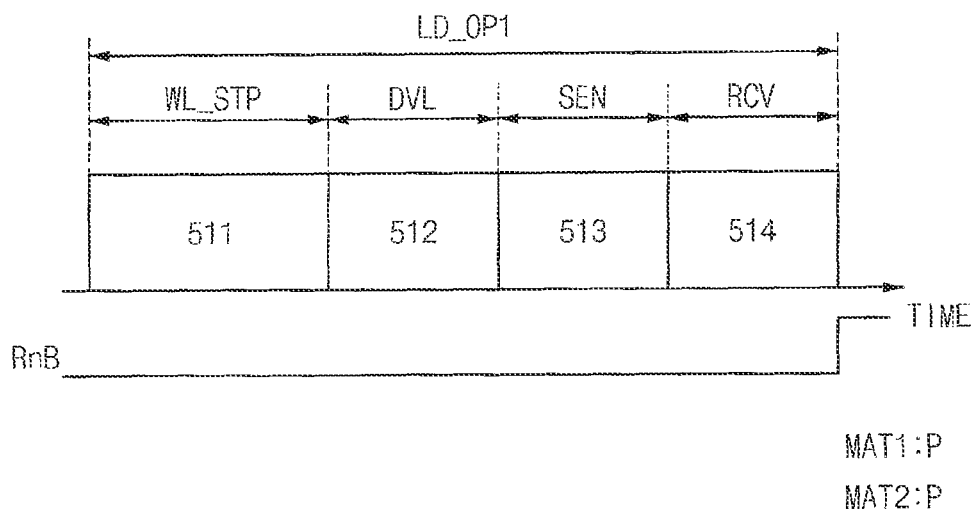
FIG. 24A illustrates the control circuit performs a first leakage detection operation on the mats in the first bank in the nonvolatile memory device of FIG. 23 according to example embodiments.

FIG. 24A illustrates the control circuit performing a first leakage detection operation on the mats in the first bank in the nonvolatile memory device of FIG. 23 according to example embodiments.

Referring to FIGS. 23 and 24A, a first leakage detection operation LD_OP1 may include a word-line set-up period WL_STP, a word-line development period DVL, a sensing period SEN and a recovery period RCY. During the word-line set-up period WL_STP, the control circuit 450 applies a first voltage to block word-lines of the mats 210 and 220 to set-up word-lines of the mats 210 and 220 with a third voltage, as indicated by reference numeral 511.

During the word-line development period DVL, the control circuit 450 develops the word-lines of the mats 210 and 220 by applying a fourth voltage having a level of the ground voltage to block word-lines of the mats 210 and 220 to turn off pass transistors of the mats 210 and 220 while precharging driving lines of the mat with a second voltage, as indicated by reference numeral 512.

During the sensing period SEN, the control circuit 450 determines a leakage of at least a portion of the word-lines of the mats 210 MAT1 and 220 based on a voltage drop of the first sensing node by applying a fifth voltage whose level is MAT2 smaller than a level of the first voltage to the block word-lines of the mats 210 and 220, as indicated by reference numeral 513. During the recovery period RCY, the voltage levels the of at least one word-line in which leakage occurs and the driving line coupled to the at least one word-line in which leakage occurs continuously decrease, as indicated by reference numeral 514. The mats MAT1 and MAT2 pass the first leakage detection operation and the control circuit 450 transitions the status signal RnB to a ready state after the recovery period RCY.

Figure 24B:
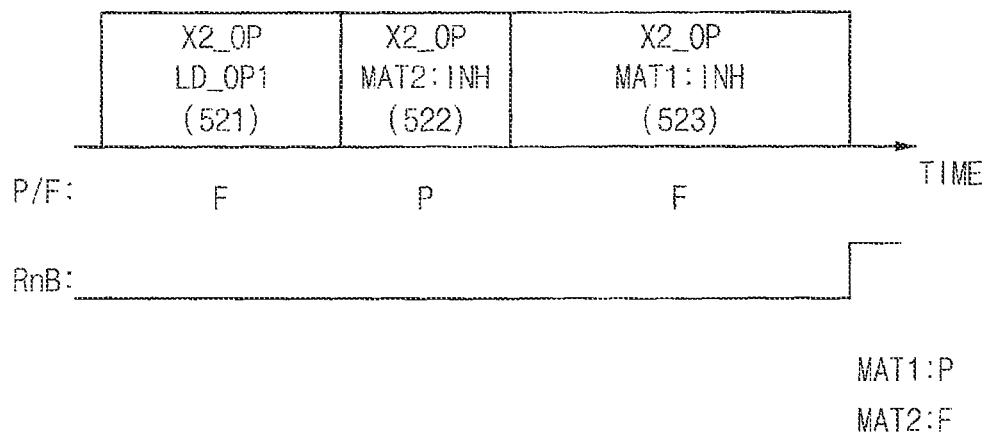
FIG. 24B illustrates the first leakage detector performing the two step leakage detection operation on the mats in the first bank in the nonvolatile memory device of FIG. 23 according to example embodiments.

FIG. 24B illustrates the first leakage detector performing the two step leakage detection operation on the mats in the first bank in the nonvolatile memory device of FIG. 23 according to example embodiments.

Referring to FIGS. 23 and 24B, in a two multi-mat mode X2_OP during which the mats 210 (MAT1) and 220 (MAT2) operate concurrently, the control circuit 450 performs a first leakage detection operation on the mats 210 and 220, as indicated by reference numeral 521. A result of the first leakage detection operation corresponds to a fail F because one of the mats MAT1 and MAT2 does not pass the first leakage detection operation.

In the two multi-mat mode X2_OP, the control circuit 450 inhibits INH the mat MAT2 by applying a ground voltage to the block word-line of the mat MAT2 and performs a second leakage detection operation on the mat MAT1, as indicated by reference numeral 522. A result of the second leakage detection operation on the mat MAT1 corresponds to a pass P. In the two multi-mat mode X2_OP, the control circuit 450 inhibits INH the mat MAT1 by applying a ground voltage to the block word-line of the mat MAT1 and performs a second leakage detection operation on the mat MAT2, as indicated by reference numeral 523. A result of the second leakage detection operation on the mat MAT2 corresponds to a fail F. In the two multi-mat mode X2_OP, the control circuit 450 transitions the status signal RnB to a ready state after the second leakage detection operation on the mat MAT2 is completed. The control circuit 450 determines that the leakage does not occur in the mat MAT1 and the leakage occurs in the mat MAT2 in FIG. 24B.

Figure 24C:
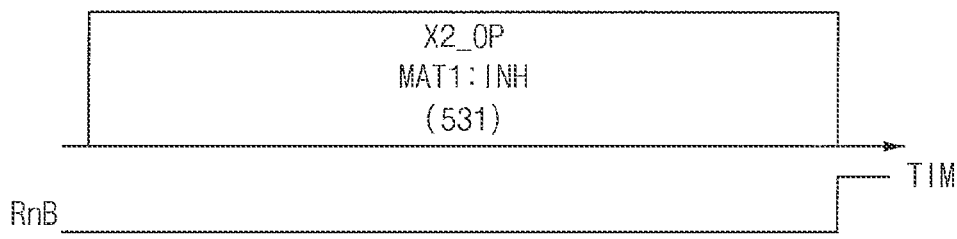
FIG. 24C illustrates the first leakage detector performing the two step leakage detection operation on the mats in the first bank in the nonvolatile memory device of FIG. 23 according to example embodiments.

FIG. 24C illustrates the first leakage detector performing the two step leakage detection operation on the mats in the first bank in the nonvolatile memory device of FIG. 23 according to example embodiments.

In FIG. 24C, it is assumed that at least one of cell strings in the mat MAT1 does not pass the threshold voltage check operation in the erase verification operation of FIG. 22.

Referring to FIGS. 23 and 24C, when at least one of cell strings in the mat MAT1 does not pass the threshold voltage check operation, in a two multi-mat mode X2_OP during which the mats 210 (MAT1) and 220 (MAT2) operate concurrently, the control circuit 450 inhibits INH the mat MAT1 by applying a ground voltage to the block word-line of the mat MAT1 instead of performing the first leakage detection operation and performs a second leakage detection operation on the mat MAT2, as indicated by reference numeral 531. The control circuit 450 updates the pass/fail information of the mat MAT1 as a fail F. A result of the second leakage detection operation on the mat MAT2 corresponds to a pass F. The control circuit 450 transitions the status signal RnB to a ready state after the second leakage detection operation on the mat MAT2 is completed.

Figure 25:
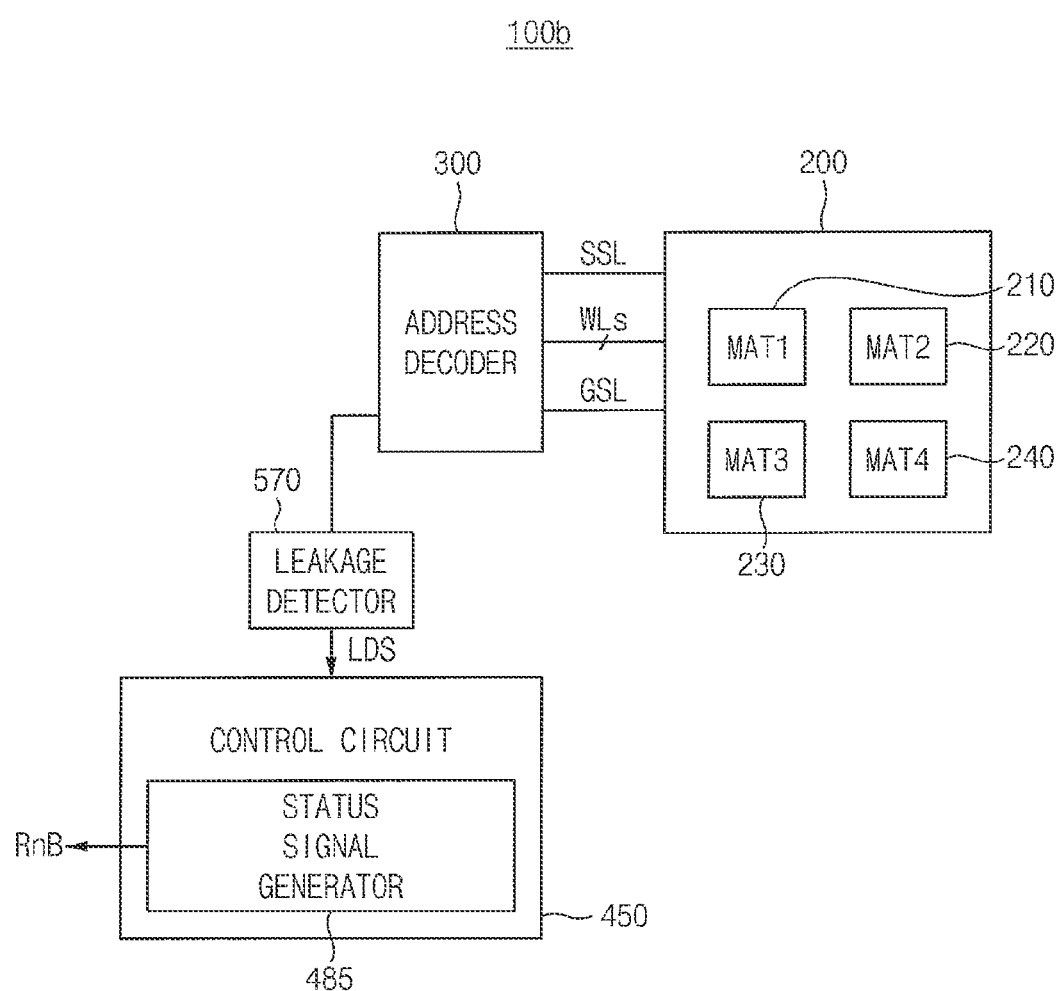
FIG. 25 is a block diagram illustrating an example of a nonvolatile memory device according to example embodiments.

FIG. 25 is a block diagram illustrating an example of a nonvolatile memory device according to example embodiments.

Referring to FIG. 25, a nonvolatile memory device 100b may include a memory cell array 200, an address decoder 300, a leakage detector 570 and a control circuit 450.

The nonvolatile memory device 100b may be similar to the nonvolatile memory device 100 of FIG. 2 and components associated with a leakage detection operation are illustrated in FIG. 25.

The memory cell array 200 may include a plurality of mats 210, 220, 230 and 240 corresponding to different bit-lines. The plurality of mats 210, 220, 230 and 240 may constitute a bank.

The leakage detector 570 may be coupled to the address decoder 300, may be coupled to driving lines coupled to the word-lines WLs of the of mats 210, 220, 230 and 240 at a sensing node in the address decoder 300 to detect leakage of at least a portion of the word-lines WLs of the mats 210, 220, 230 and 240 and may provide the control circuit 450 with a leakage detection signal LDS when the leakage is detected.

Figure 26A:
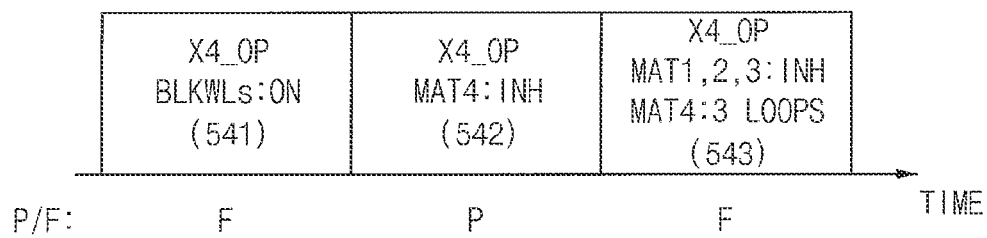
FIG. 26A illustrates the control circuit performing a two-step leakage detection operation on the mats in the nonvolatile memory device of FIG. 25 according to example embodiments.

FIG. 26A illustrates the control circuit performing a two-step leakage detection operation on the mats in the nonvolatile memory device of FIG. 25 according to example embodiments.

Referring to FIGS. 25 and 26A, in a four multi-mat mode X4_OP during which the mats 210 (MAT1), 220 (MAT2), 230 (MAT3) and 240 (MAT4) operate concurrently, the control circuit 450 performs a first leakage detection operation on the mats 210, 220, 230 and 240 by applying a first voltage to block word-lines BLKWLs of the mats 210, 220, 230 and 240 as a reference numeral 541 indicates. A result of the first leakage detection operation corresponds to a fail F because one of the mats 210, 220, 230 and 240 does not pass the first leakage detection operation.

In the four multi-mat mode X4_OP, the control circuit 450 inhibits INH the mat MAT4 by applying a ground voltage to the block word-line of the mat MAT4 and performs a second leakage detection operation on the mats MAT1, MAT2 and MAT3, as indicated by reference numeral 542. A result of the second leakage detection operation is pass P. In the four multi-mat mode X4_OP, the control circuit 450 inhibits INH the mats MAT1, MAT2 and MAT3 by applying the ground voltage to the block word-lines of the mat MAT1, MAT2 and MAT3 and performs the second leakage detection operation on the mat MAT4 during three loops, as indicated by reference numeral 543. A result of the second leakage detection operation on the mat MAT4 is fail F. The control circuit 450 transitions the status signal RnB to a ready state after the second leakage detection operation on the mat MAT4 is completed. The control circuit 450 determines that the leakage does not occur in the mats MAT1, MAT2 and MAT3 and the leakage occurs in the mat MAT4 in FIG. 26A. In addition, a total number of loops # OF LOOPS of leakage detection operations corresponds to five in FIG. 26A.

Figure 26B:
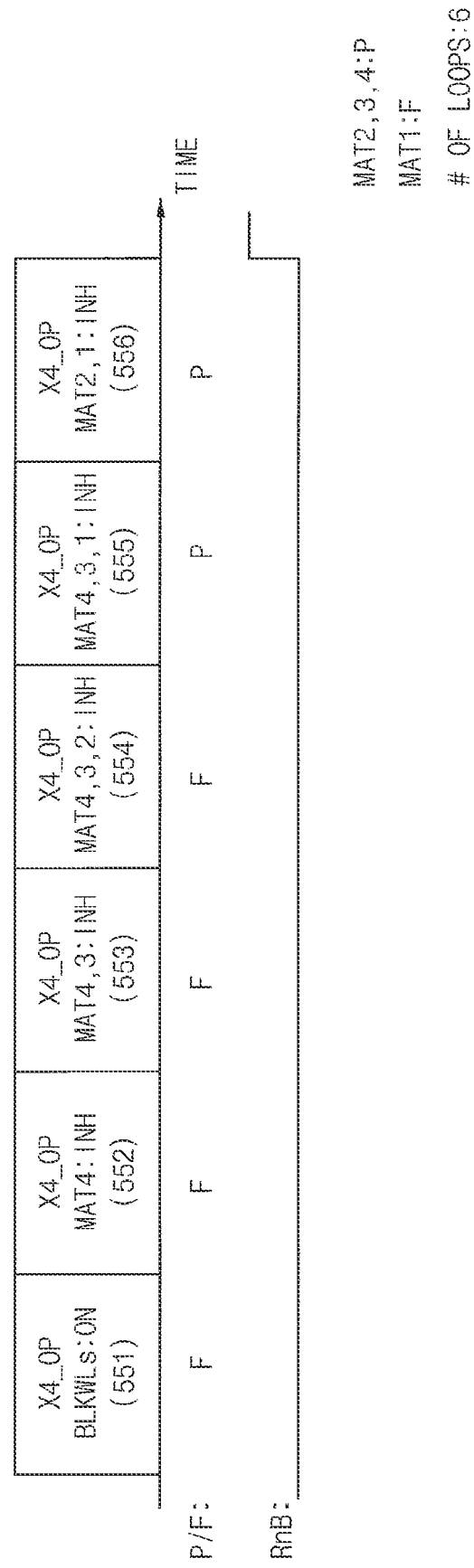
FIG. 26B illustrates the control circuit performing a two-step leakage detection operation on the mats in the nonvolatile memory device of FIG. 25 according to example embodiments.

FIG. 26B illustrates the control circuit performing a two-step leakage detection operation on the mats in the nonvolatile memory device of FIG. 25 according to example embodiments.

Referring to FIGS. 25 and 26A, in a four multi-mat mode X4_OP during which the mats 210 (MAT1), 220 (MAT2), 230 (MAT3) and 240 (MAT4) operate concurrently, the control circuit 450 performs a first leakage detection operation on the mats 210, 220, 230 and 240 by applying a first voltage to block word-lines BLKWLs of the mats 210, 220, 230 and 240, as indicated by reference numeral 551. A result of the first leakage detection operation corresponds to a fail F because one of the mats 210, 220, 230 and 240 does not pass the first leakage detection operation.

In the four multi-mat mode X4_OP, the control circuit 450 inhibits INH the mat MAT4 by applying a ground voltage to the block word-line of the mat MAT4 and performs a second leakage detection operation on the mats MAT1, MAT2 and MAT3, as indicated by reference numeral 552. A result of the second leakage detection operation on the mats MAT1, MAT2 and MAT3 is fail F.

In the four multi-mat mode X4_OP, the control circuit 450 inhibits INH the mats MAT4 and MAT3 by applying the ground voltage to the block word-lines of the mats MAT4 and MAT3 and performs a second leakage detection operation on the mats MAT1 and MAT2, as indicated by reference numeral 553. A result of the second leakage detection operation on the mats MAT1 and MAT2 is fail F. In the four multi-mat mode X4_OP, the control circuit 450 inhibits INH the mats MAT4, MAT3 and MAT2 by applying the ground voltage to the block word-lines of the mats MAT4, MAT3 and MAT2 and performs a second leakage detection operation on the mat MAT1 as, indicated by reference numeral 554. A result of the second leakage detection operation on the mat MAT1 is fail F.

In the four multi-mat mode X4_OP, the control circuit 450 inhibits INH the mats MAT4, MAT3 and MAT1 by applying the ground voltage to the block word-lines of the mats MAT4, MAT3 and MAT1 and performs a second leakage detection operation on the mat MAT2, as indicated by reference numeral 555. A result of the second leakage detection operation on the mat MAT2 is pass P. In the four multi-mat mode X4_OP, the control circuit 450 inhibits INH the mats MAT2 and MAT1 by applying the ground voltage to the block word-lines of the mats MAT2 and MAT1 and performs a second leakage detection operation on the mats MAT3 and MAT4, as indicated by reference numeral 556. A result of the second leakage detection operation on the mats MAT3 and MAT4 is pass P.

The control circuit 450 transitions the status signal RnB to a ready state after the second leakage detection operation on the mats MAT3 and MAT4 is completed. The control circuit 450 determines that the leakage does not occur in the mats MAT4, MAT3 and MAT2 and the leakage occurs in the mat MAT1 in FIG. 26B. In addition, a total number of loops # OF LOOPS of leakage detection operations corresponds to six in FIG. 26B.

FIG. 26C illustrates the control circuit performing a two-step leakage detection operation on the mats in the nonvolatile memory device of FIG. 25 according to example embodiments.

Referring to FIGS. 25 and 26C, in a four multi-mat mode X4_OP during which the mats 210 (MAT1), 220 (MAT2), 230 (MAT3) and 240 (MAT4) operate concurrently, the control circuit 450 performs a first leakage detection operation on the mats 210, 220, 230 and 240 by applying a first voltage to block word-lines BLKWLs of the mats 210, 220, 230 and 240, as indicated by reference numeral 561. A result of the first leakage detection operation correspond to a fail F because one of the mats 210, 220, 230 and 240 does not pass the first leakage detection operation.

In the four multi-mat mode X4_OP, the control circuit 450 inhibits INH the mat MAT4 by applying a ground voltage to the block word-line of the mat MAT4 and performs a second leakage detection operation on the mats MAT1, MAT2 and MAT3, as indicated by reference numeral 562. A result of the second leakage detection operation on the mats MAT1, MAT2 and MAT3 is fail F.

In the four multi-mat mode X4_OP, the control circuit 450 inhibits INH the mats MAT4 and MAT3 by applying the ground voltage to the block word-lines of the mats MAT4 and MAT3 and performs a second leakage detection operation on the mats MAT1 and MAT2, as indicated by reference numeral 563. A result of the second leakage detection operation on the mats MAT1 and MAT2 is fail F. In the four multi-mat mode X4_OP, the control circuit 450 inhibits INH the mats MAT4, MAT3 and MAT2 by applying the ground voltage to the block word-lines of the mats MAT4, MAT3 and MAT2 and performs a second leakage detection operation on the mat MAT1 as, indicated by the reference numeral 564. A result of the second leakage detection operation on the mat MAT1 is fail F.

In the four multi-mat mode X4_OP, the control circuit 450 inhibits INH the mats MAT4, MAT3 and MAT1 by applying the ground voltage to the block word-lines of the mats MAT4, MAT3 and MAT1 and performs a second leakage detection operation on the mat MAT2, as indicated by reference numeral 565. A result of the second leakage detection operation on the mat MAT2 is fail F. In the four multi-mat mode X4_OP, the control circuit 450 inhibits INH the mats MAT2 and MAT1 by applying the ground voltage to the block word-lines of the mats MAT2 and MAT1 and performs a second leakage detection operation on the mats MAT3 and MAT4, as indicated by reference numeral 556. A result of the second leakage detection operation on the mats MAT3 and MAT4 is fail F.

In the four multi-mat mode X4_OP, the control circuit 450 inhibits INH the mats MAT2, MAT1 and MAT4 by applying the ground voltage to the block word-lines of the mats MAT2, MAT1 and MAT4 and performs a second leakage detection operation on the mat MAT3 as, indicated by reference numeral 567. A result of the second leakage detection operation on the mat MAT3 is fail F. In the four multi-mat mode X4_OP, the control circuit 450 inhibits INH the mats MAT2, MAT1 and MAT3 by applying the ground voltage to the block word-lines of the mats MAT2, MAT1 and MAT3 and performs a second leakage detection operation on the mat MAT4, as indicated by reference numeral 568. A result of the second leakage detection operation on the mat MAT4 is fail F. In the four multi-mat mode X4_OP, the control circuit 450 inhibits INH the mats MAT2, MAT1 and MAT3 by applying the ground voltage to the block word-lines of the mats MAT2, MAT1 and MAT3 and performs a second leakage detection operation on the mat MAT4, as indicated by reference numeral 569. A result of the second leakage detection operation on the mat MAT4 is fail F.

The control circuit 450 transitions the status signal RnB to a ready state after the second leakage detection operation on the mat MAT4 is completed. The control circuit 450 determines that the leakage occurs in the mats MAT1, MAT2, MAT3 and MAT4 in FIG. 26C. In addition, a total number of loops # OF LOOPS of leakage detection operations corresponds to nine in FIG. 26C.

Figure 27:
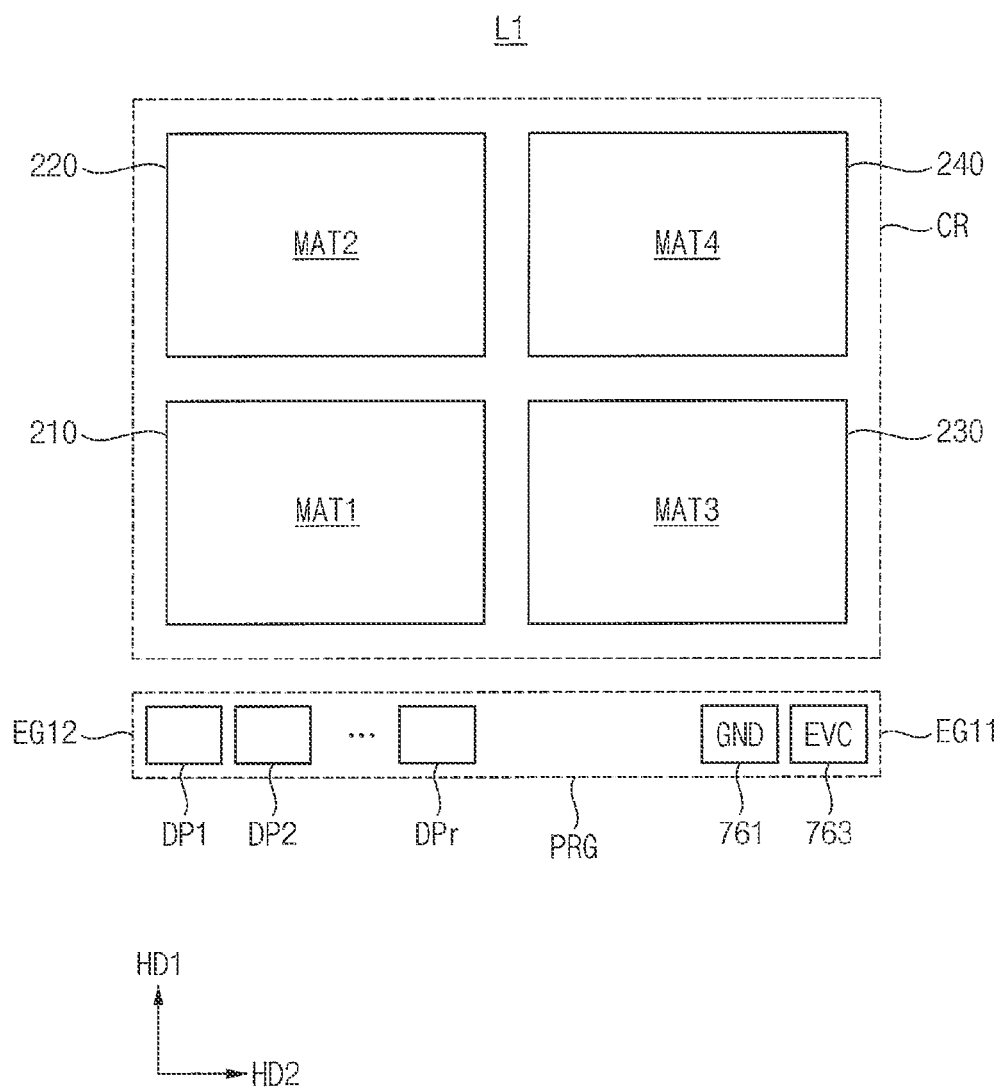
FIG. 27 is a view illustrating the first semiconductor layer in FIG. 3 according to example embodiments.

FIG. 27 is a view illustrating the first semiconductor layer in FIG. 3 according to example embodiments.

Referring to FIGS. 2, 3 and 27, the first semiconductor layer L1 may include a cell region CR and a pad region PRG which are disposed adjacent to each other in the first horizontal direction HD1.

The memory cell array 200 in FIG. 2 may be disposed in the cell region CR and the cell region CR may include the plurality of mats 210, 220, 230 and 240.

The pad region PRG may include a plurality of input/output (I/O) pads DP1~DPr and at least one power pad 761 and 763. A ground voltage GND may be provided to the mats 210, 220, 230 and 240 through the power pad 761 and a power supply voltage EVC may be provided to the mats 210, 220, 230 and 240 through the power pad 763. The plurality of I/O pads DP1~DPr may be disposed in the second horizontal direction HD2 between a first edge portion EG11 and a second edge portion EG12 of the pad region PRG and the least one power pad 761 and 763 may be disposed adjacent to the first edge portion EG11.

Figure 28:
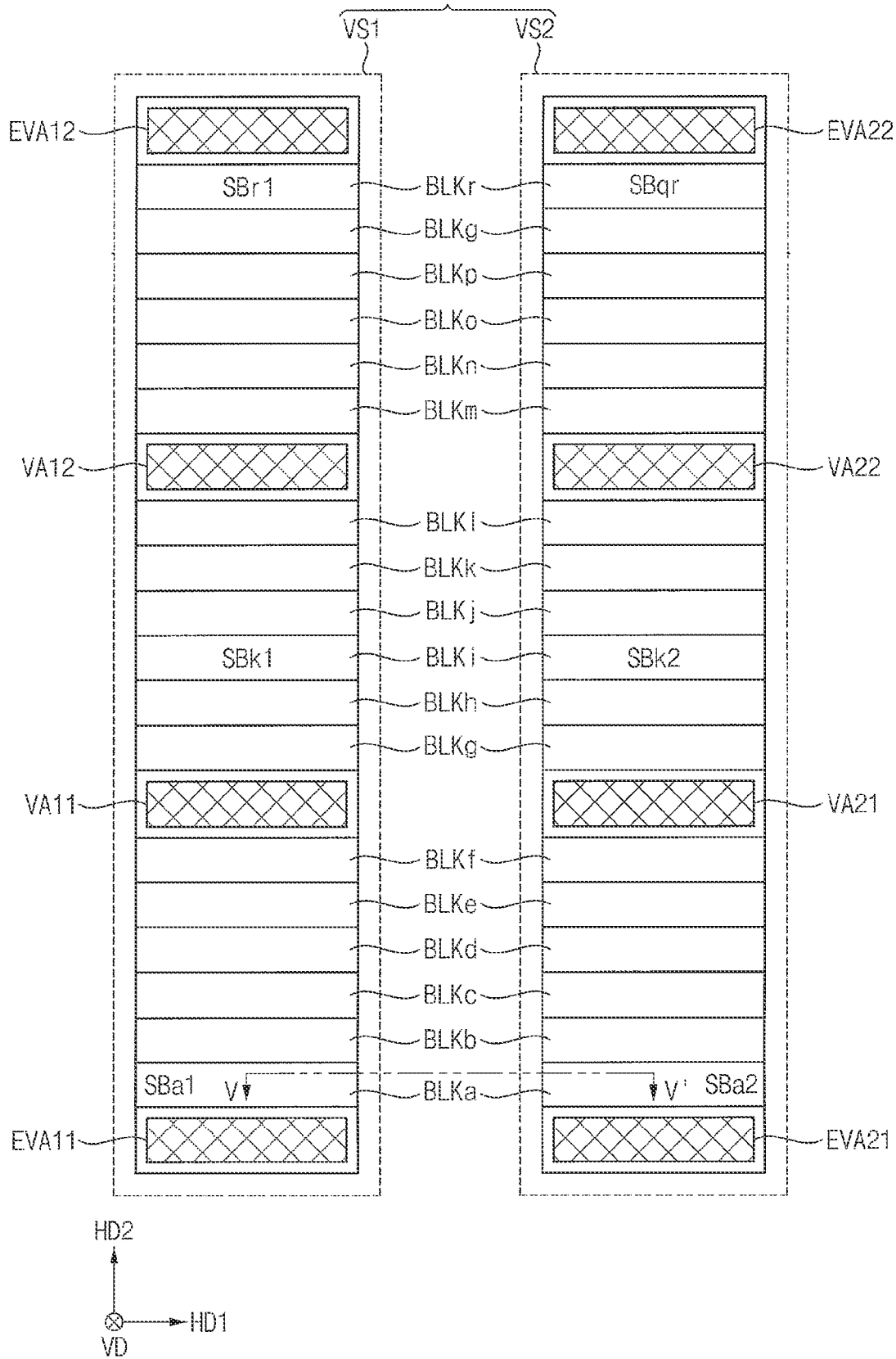
FIG. 28 illustrates an example of the first mat in FIG. 27 according to example embodiments.

FIG. 28 illustrates an example of the first mat in FIG. 27 according to example embodiments.

Referring to FIGS. 27 and 28, the first mat 210 may be disposed on the first semiconductor layer L1, and the first mat MT1 may include a first vertical structure VS1 and a second vertical structure VS2. As shown in FIG. 28, the first mat 210 may include a plurality of memory blocks BLKa~BLKr formed as first and second vertical structures VS1 and VS2. The memory blocks BLK1~BLKr may be arranged in the second horizontal direction HD2. Each of the memory blocks BLKa~BLKr may include a first sub-block and a second sub-block. The memory block BLKa includes a first sub-block SBa1 and a second sub-block SBa2. The memory block BLKi includes a first sub-block SBi1 and a second sub-block SBi2. The memory block BLKr includes a first sub-block SBr1 and a second sub-block SBr2.

As shown in FIG. 28, the first vertical structure VS1 may include a plurality of first sub-blocks of the memory blocks BLKa~BLKr and a plurality of first via regions EVA11, VA11, VA12, and EVA12 which are spaced apart in the second direction. In addition, the second vertical structure VS2 may include a plurality of second sub-blocks of the memory blocks BLKa~BLKr and a plurality of second via regions EVA21, VA21, VA22, and EVA22 which are spaced apart in the second direction. The first sub-blocks may be arranged among the first via regions EVA11, VA11, VA12, and EVA12, and the second sub-blocks may be arranged among the second via regions EVA21, VA21, VA22, and EVA22.

The first via regions EVA11 and EVA12 disposed adjacent to edges in the second horizontal direction HD2 and in the first sub-blocks may be referred to as first and second edge via regions, respectively. The first via regions EVA21 and EVA22 disposed adjacent to edges in the second horizontal direction HD2 and in the second sub-blocks may be referred to as third and fourth edge via regions, respectively.

For example, in the first via regions VA11 and VA12, one or more first through-hole vias that each pass through the first vertical structure VS1 and are connected to the first page buffer circuit 411 may be formed. In addition, in the second via regions VA21 and VA22, one or more second through-hole vias that each pass through the second vertical structure VS22 and are connected to the second page buffer circuit 413 may be formed.

For example, in the first and second edge via regions EVA11 and EVA12, one or more edge through-hole vias that each pass through the first vertical structure VS1 and are connected to an address decoder may be formed. In addition, in the third and fourth edge via regions EVA21 and EVA22, one or more edge through-hole vias that each pass through the second vertical structure VS22 and are connected to an address decoder may be formed.

Figure 29:
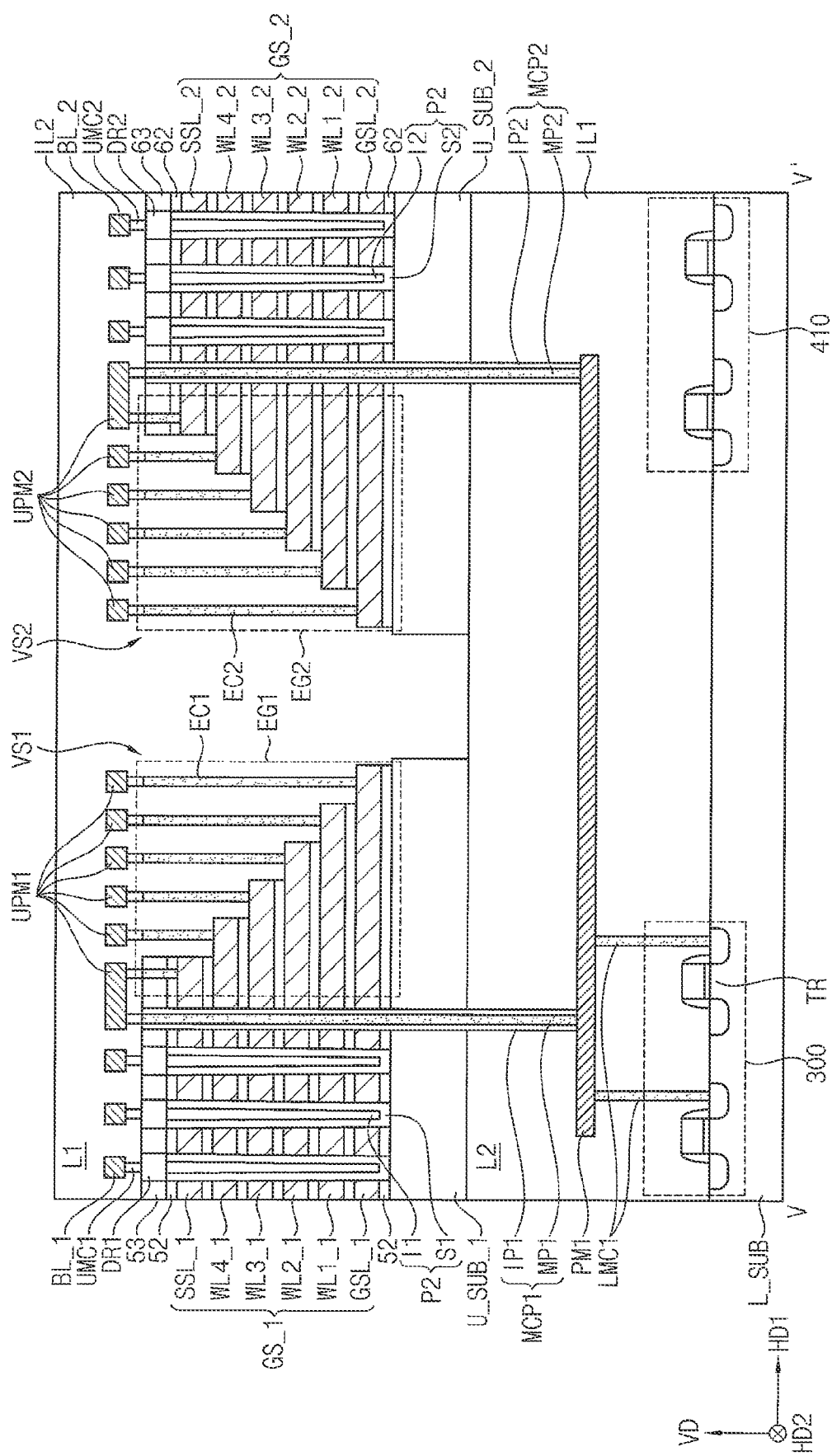
FIG. 29 is a cross-sectional view taken along line V-V' of FIG. 28 according to example embodiments.

FIG. 29 is a cross-sectional view taken along line V-V' of FIG. 28 according to example embodiments.

For example, FIG. 29 is a cross-sectional view taken along line V-V' of FIG. 28, illustrating configurations of the first and second semiconductor layers.

Referring to FIG. 28, the second semiconductor layer L2 may include a lower substrate L_SUB, and the address decoder 300 and the page buffer circuit 410 formed on the lower substrate L_SUB. In addition, the second semiconductor layer L2 may include a plurality of first lower contacts LMC1 electrically connected to the address decoder 300, a first lower conductive line PM1 electrically connected to the plurality of first lower contacts LMC1, and a lower insulating layer IL1 covering the plurality of first lower contacts LMC1 and the first lower conductive line PM1.

The address decoder 300 and the page buffer circuit 410 may be formed on portions of the lower substrate L_SUB. For example, the address decoder 300 and/or the page buffer circuit 410 may be formed by forming a plurality of transistors TR on the lower substrate L_SUB.

The first semiconductor layer L1 may include a first upper substrate U_SUB_1, a second upper substrate U_SUB_2, the first vertical structure VS1 disposed on the first upper substrate U_SUB_1, and the second vertical structure VS2 disposed on the second upper substrate U_SUB_2. In addition, the first semiconductor layer L1 may include a plurality of first upper contacts UMC1, a plurality of first bit-lines BL_1, a plurality of first edge contacts EC1, and a plurality of first upper conductive lines UPM1 which are electrically connected to the first vertical structure VS1. In addition, the first semiconductor layer L1 may include a plurality of second upper contacts UMC2, a plurality of second bit-lines BL_2, a plurality of second edge contacts EC2, and a plurality of second upper conductive lines UPM2 which are electrically connected to the second vertical structure VS2. In addition, the first semiconductor layer L1 may include an upper insulating layer IL2 covering the first and second vertical structures VS1 and VS2 and various conductive lines.

The first and second upper substrates U_SUB_1 and U_SUB_2 may be support layers that respectively support first and second gate conductive layers GS_1 and GS_2. The first and second upper substrates U_SUB_1 and U_SUB_2 may be, for example, base substrates.

The first vertical structure VS1 may include the first gate conductive layers GS_1 disposed on the first upper substrate U_SUB_1, and a plurality of pillars P1 that pass through the first gate conductive layers GS_1 and extend in the third direction on a top surface of the first upper substrate U_SUB_1. The first gate conductive layers GS_1 may include a ground selection line GSL_1, word-lines WL1_1 through WL4_1, and a string selection line SSL_1. The ground selection line GSL_1, the word-lines WL1_1 through WL4_1, and the string selection line SSL_1 may be sequentially formed on the first upper substrate U_SUB_1, and an insulating layer 52 may be disposed under or over each of the first gate conductive layers GS_1.

Each of the plurality of pillars P1 may include a surface layer S1 and an inside portion I1. For example, the surface layer S1 of each of the pillars P1 may include a silicon material doped with an impurity, or a silicon material not doped with an impurity.

For example, the ground selection line GSL_1 and a portion of the surface layer S1 disposed adjacent to the ground selection line GSL_1 may constitute the ground selection transistor GST (see FIG. 6). In addition, the word-lines WL1_1 through WL4_1 and a portion of the surface layer S1 disposed adjacent to the word-lines WL1_1 through WL4_1 may constitute the memory cells MC1-MC8 (see FIG. 6). In addition, the string selection line SSL_1 and a portion of the surface layer S1 disposed adjacent to the string selection line SSL_1 may constitute the string selection transistor SST (see FIG. 6).

A drain region DR1 may be formed on the pillar P1. For example, the drain region DR1 may include a silicon material doped with an impurity. An etch-stop film 53 may be formed on a side wall of the drain region DR1.

The first vertical structure VS1 may include an edge region EG1. As shown in FIG. 29, a cross-section of an edge region EG1 may form a stepped pad structure. The stepped pad structure may be referred to as a "word-line pad". The plurality of first edge contacts EC1 may be connected to the edge region EG1, and an electrical signal may be applied from a peripheral circuit such as the address decoder 300 through the first edge contacts EC1. For example, a contact plug MCP1 that passes through the first vertical structure VS1, the first upper substrate U_SUB_1, and a part of the second semiconductor layer L2 may have one side connected to the first lower conductive line PM1 and the other side electrically connected to the edge region EG1 through the first upper conductive lines UPM1. The contact plug MCP1 may include an insulating film pattern IP1 and a conductive pattern MP1.

At least some of the first edge contacts EC1 may pass through parts of the first and second semiconductor layers L1 and L2 in the third direction between the first and second upper substrates U_SUB_1 and U_SUB_2 and may have one side electrically connected to a contact plug (e.g., MCP1) connected to the lower conductive line (e.g., PM1).

Since the first and second vertical structures VS1 and VS2 have corresponding configurations in the cross-sectional view taken along line V-V' of the mat 210 of FIG. 29, a repeated explanation of elements of the second vertical structure VS2 corresponding to those of the first vertical structure VS1 is omitted for convenience of explanation.

The second vertical structure VS2 may include a plurality of pillars P2 that pass through the second gate conductive layers GS_2. Each of the pillars P2 may include a surface layer S2 and an inside portion I2. The second gate conductive layers GS_2 may include a ground selection line GSL_2, word lines WL1_2 through WL4_2, and a string selection line SSL_2. An insulating layer 62 may be disposed under or over each of the second gate conductive layers GS_2.

A drain region DR2 may be formed on the pillar P2. An etch-stop film 63 may be formed on a side wall of the drain region DR2. The second vertical structure VS2 may include an edge region EG2. A contact plug MCP2 that passes through the second vertical structure VS2, the second upper substrate U_SUB_2, and a part of the second semiconductor layer L2 may have one side connected to the first lower conductive line PM1 and the other side electrically connected to the edge region EG2 through the second upper conductive lines UPM2. The contact plug MCP2 may include an insulating film pattern IP2 and a conductive pattern MP2.

Figure 30:
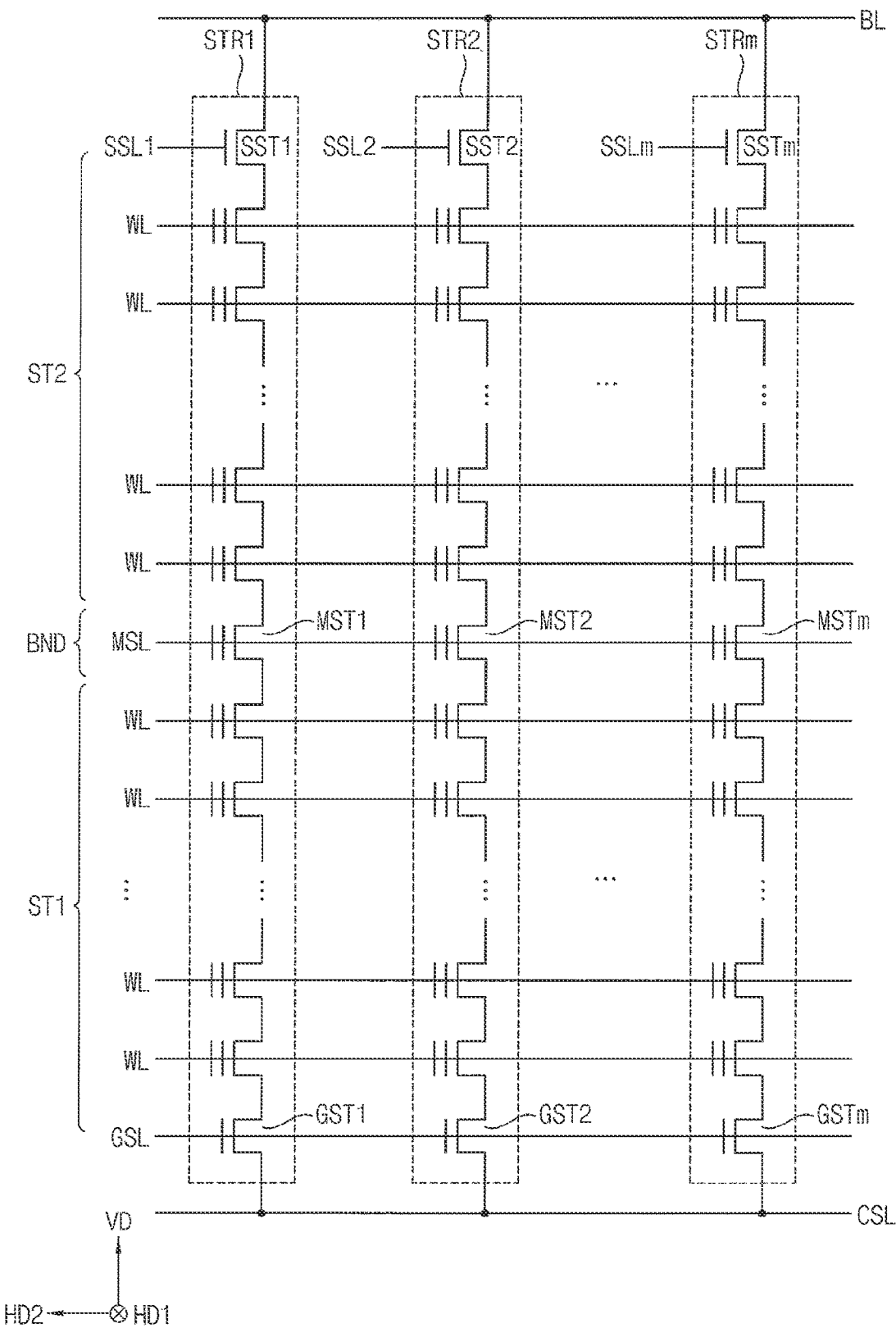
FIG. 30 is a circuit diagram illustrating a structure of a memory cell array according to example embodiments.

FIG. 30 is a circuit diagram illustrating a structure of a memory cell array according to example embodiments.

FIG. 30 illustrates a two-dimensional version of a memory block including cell strings STR1~STRm connected to one bit-line BL and one source line CSL for convenience of illustration.

Referring to FIG. 30, a memory block may include a plurality of cell strings STR1~STRm connected between a bit-line BL and a source line CSL. The cell strings STR1~STRm may include string selection transistors SST1~SSTm controlled by string selection lines SSL1~SSLm, memory cells controlled by word-lines WL, intermediate switching transistors MST1~MSTm controlled by an intermediate switching line MSL and a ground selection transistors GST1~GSTm controlled by a ground selection line GSL, respectively. Here, m is a natural number greater than 1. The memory cells connected to word-lines disposed in edge portions of the stacks ST1 and ST2 in the vertical direction VD may be dummy cells. The dummy cells may be configured to store less bits than memory cells.

In some example embodiments, as illustrated in FIG. 30, a boundary portion BND may include one gate line MSL that switches or activates simultaneously the intermediate switching transistors connected thereto.

For performing the leakage detection operation according to example embodiments, the control circuit 450 may turn on the intermediate switching transistors MST1~MSTm to perform the leakage detection operation on word-lines of the upper stack ST2. After the leakage detection operation on word-lines of the upper stack ST2 is completed, the control circuit 450 may turn off the intermediate switching transistors MST1~MSTm to perform the leakage detection operation on word-lines of the lower stack ST1.

Figure 31:
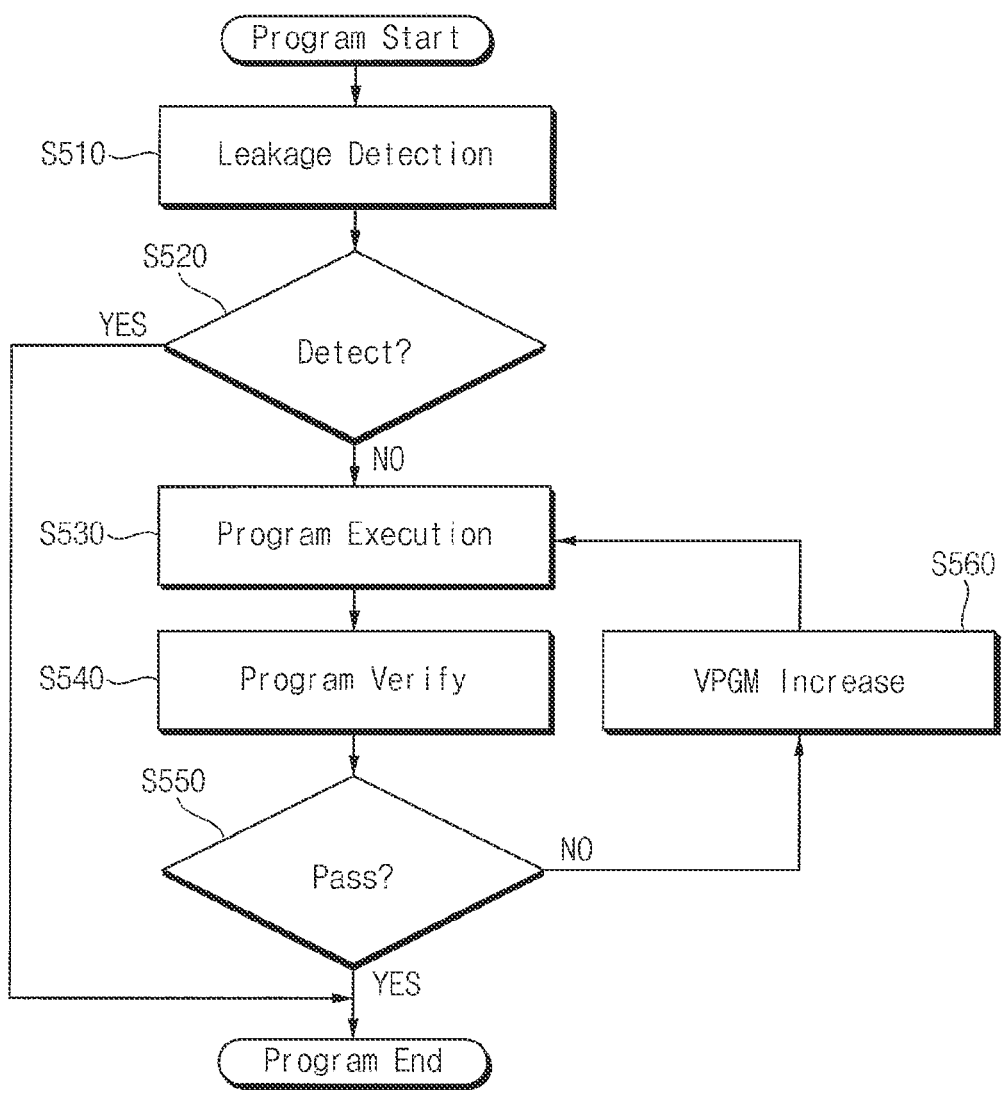
FIG. 31 is a flowchart illustrating an example in which a leakage detection operation is applied to an erase loop of the nonvolatile memory device.

FIG. 31 is a flowchart illustrating an example in which a leakage detection operation is applied to an erase loop of the nonvolatile memory device.

Referring to FIGS. 2 and 31, an erase loop starts, the control circuit 450 performs leakage detection operation on word-lines of a selected memory block (operation S510). The leakage detection operation may correspond to the two-step leakage detection operation including the first leakage detection operation and the second leakage detection operation described above.

The control circuit 450 may determine whether a leakage is detected (e.g., whether a leakage occurs) in at least a portion of the word-lines of the selected mat (operation S520).

When the leakage is not detected (NO in operation S520), the control circuit 450 may perform a program operation on a selected word-line of the selected memory block (operation S530). The control circuit 450 may perform a program verification operation on the selected word-line (operation S540).

The control circuit 450 determines whether the selected word-line passes the program verification operation (operation S550). When the selected word-line does not pass the program verification operation (NO in operation S550), the control circuit 450 increases a program voltage VPGM (operation S440) and performs operations S530, S540 and S550 based on the increased program voltage.

When the selected word-line passes the program verification operation (YES in operation S550), the control circuit 450 may complete the program loop.

When the leakage is detected (YES in operation S520), the control circuit 450 may complete the program loop without performing the program operation on the selected memory block.

Therefore, the nonvolatile memory device and the method of operating the nonvolatile memory device according to example embodiments performs a first leakage detection operation on M mats selected from the plurality of mats to determine a leakage of at least a portion of word-lines of the M mats in an N multi-mat mode during which N mats from among the plurality of mats operate concurrently, in response to the leakage of at least the portion of word-lines of the M mats being detected, inhibits at least one mat of the M mats and performs a second leakage detection operation on at least one target mat from among the M mats except the inhibited mat. Accordingly, the nonvolatile memory device and the method of operating the nonvolatile memory device may rapidly identify a mat in which the leakage occurs and may prevent memory blocks of a mat in which the leakage does not occur from being processed as a bad block such as a run-time bad block.

Figure 32:
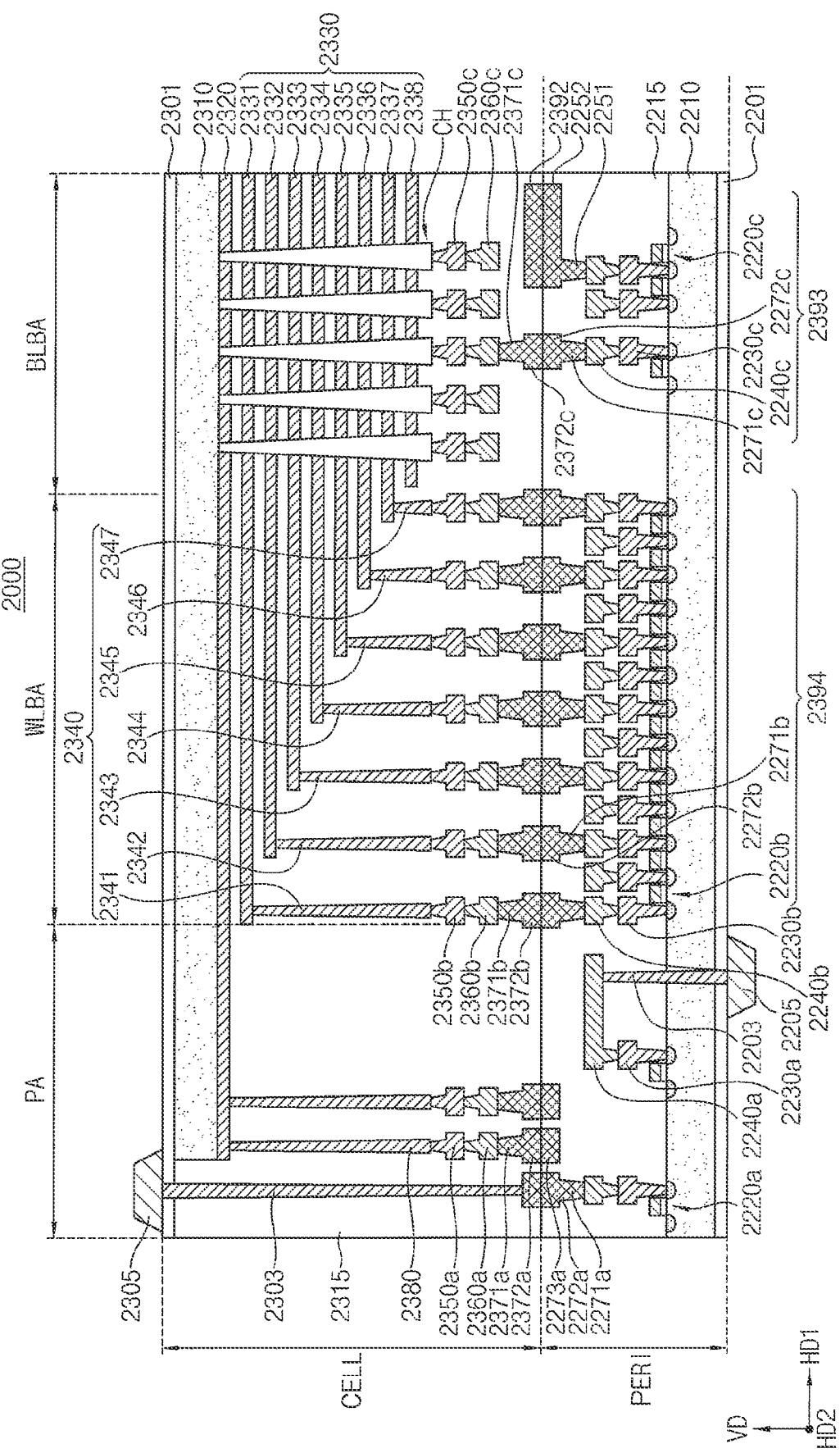
FIG. 32 is a cross-sectional view of a nonvolatile memory device according to example embodiments.

FIG. 32 is a cross-sectional view of a nonvolatile memory device according to example embodiments.

Referring to FIG. 32, a nonvolatile memory device 2000 may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. The bonding metals may include, for example, copper (Cu), and Cu-to-Cu bonding may be implemented. Example embodiments, however, are not limited thereto. For example, the bonding metals may also be formed of aluminum (Al) or tungsten (W).

Each of the peripheral circuit region PERI and the cell region CELL of the nonvolatile memory device 2000 may include an external pad bonding area PA, a word-line bonding area WLBA, and a bit-line bonding area BLBA.

The peripheral circuit region PERI may include a first substrate 2210, an interlayer insulating layer 2215, a plurality of circuit elements 2220*a*, 2220*b*, and 2220*c* formed on the first substrate 2210, first metal layers 2230*a*, 2230*b*, and 2230*c* respectively connected to the plurality of circuit elements 2220*a*, 2220*b*, and 2220*c*, and second metal layers 2240*a*, 2240*b*, and 2240*c* formed on the first metal layers 2230*a*, 2230*b*, and 2230*c*. In an example embodiment, the first metal layers 2230*a*, 2230*b*, and 2230*c* may be formed of tungsten having relatively high electrical resistivity, and the second metal layers 2240a, 2240b, and 2240c may be formed of copper having relatively low electrical resistivity.

In an example embodiment illustrated in FIG. 22, although only the first metal layers 2230a, 2230b, and 2230c and the second metal layers 2240a, 2240b, and 2240c are shown and described, example embodiments are not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum etc. having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as, for example, silicon oxide, silicon nitride, etc.

Lower bonding metals 2271b and 2272b may be formed on the second metal layer 2240b in the word-line bonding area WLBA. In the word-line bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of, for example, aluminum, copper, tungsten, etc. The upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of word-lines 2331, 2332, 2333, 2334, 2335, 2336, 2337, and 2338 (e.g., 2330) may be stacked in a vertical direction VD (e.g., a Z-axis direction), perpendicular to an upper surface of the second substrate 2310. At least one string selection line and at least one ground selection line may be arranged on and below the plurality of word-lines 2330, respectively. The plurality of word-lines 2330 may be disposed between the at least one string selection line and the at least one ground selection line.

In the bit-line bonding area BLBA, a channel structure CH may extend in the vertical direction VD, perpendicular to the upper surface of the second substrate 2310, and pass through the plurality of word-lines 2330, the at least one string selection line, and the at least one ground selection line. The channel structure CH may include a data storage layer, a channel layer, a buried insulating layer, etc., and the channel layer may be electrically connected to a first metal layer 2350c and a second metal layer 2360c. For example, the first metal layer 2350c may be a bit-line contact, and the second metal layer 2360c may be a bit-line. In an example embodiment, the bit-line 2360c may extend in a second horizontal direction HD2 (e.g., a Y-axis direction), parallel to the upper surface of the second substrate 2310.

In an example embodiment illustrated in FIG. 32, an area in which the channel structure CH, the bit-line 2360c, etc. are disposed may be defined as the bit-line bonding area BLBA. In the bit-line bonding area BLBA, the bit-line 2360c may be electrically connected to the circuit elements 2220c providing a page buffer 2393 in the peripheral circuit region PERI. The bit-line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word-line bonding area WLBA, the plurality of word-lines 2330 may extend in a first horizontal direction HD1 (e.g., an X-axis direction), parallel to the upper surface of the second substrate 2310 and perpendicular to the second horizontal direction HD2, and may be connected to a plurality of cell contact plugs 2341, 2342, 2343, 2344, 2345, 2346, and 2347 (e.g., 2340). The plurality of word-lines 2330 and the plurality of cell contact plugs 2340 may be connected to each other via pads provided by at least a portion of the plurality of word-lines 2330 extending in different lengths in the first horizontal direction HD1. A first metal layer 2350b and a second metal layer 2360b may be connected to an upper portion of the plurality of cell contact plugs 2340 connected to the plurality of word-lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word-line bonding area WLBA.

The plurality of cell contact plugs 2340 may be electrically connected to the circuit elements 2220b forming a row decoder 2394 in the peripheral circuit region PERI. In an example embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as, for example, a metal, a metal compound, polysilicon, etc., and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310 and a second input/output pad 2305 may be disposed on the upper insulating film 2301. The second input/output pad 2305 may be connected to at least one of the plurality of circuit elements 2220a, 2220b, and 2220c disposed in the peripheral circuit region PERI through a second input/output contact plug 2303 and/or lower bonding metals 2271a and 2272a, etc. In the example embodiment, the second input/output pad 2305 is electrically connected to a circuit element 2220a.

According to embodiments, the second substrate 2310 and the common source line 2320 are not disposed in an area in which the second input/output contact plug 2303 is disposed. Also, according to embodiments, the second input/output pad 2305 does not overlap the word-lines 2330 in the vertical direction VD. The second input/output contact plug 2303 may be separated from the second substrate 2310 in the direction parallel to the upper surface of the second substrate 2310, and may pass through the interlayer insulating layer 2315 of the cell region CELL to be connected to the second input/output pad 2305.

According to embodiments, the first input/output pad 2205 and the second input/output pad 2305 may be selectively formed. For example, the nonvolatile memory device 2000 may include only the first input/output pad 2205 disposed on the first substrate 2210 or the second input/output pad 2305 disposed on the second substrate 2310. Alternatively, the nonvolatile memory device 2000 may include both the first input/output pad 2205 and the second input/output pad 2305.

A metal pattern provided in an uppermost metal layer may be provided as a dummy pattern or the uppermost metal layer may be absent, in each of the external pad bonding area PA and the bit-line bonding area BLBA, respectively included in the cell region CELL and the peripheral circuit region PERI, according to example embodiments.

In the external pad bonding area PA, the nonvolatile memory device 2000 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. According to embodiments, in the peripheral circuit region PERI, the lower metal pattern 2273a formed in the uppermost metal layer of the peripheral circuit region PERI is not connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL. The upper metal pattern 2372a may be included in upper bonding metals 2371a and 2372a.

The lower bonding metals 2271b and 2272b may be formed on the second metal layer 2240b in the word-line bonding area WLBA. In the word-line bonding area WLBA, the lower bonding metals 2271b and 2272b of the peripheral circuit region PERI may be electrically connected to the upper bonding metals 2371b and 2372b of the cell region CELL by, for example, Cu-to-Cu bonding.

Further, in the bit-line bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. According to embodiments, a contact is not formed on the upper metal pattern 2392 formed in the uppermost metal layer of the cell region CELL. The lower metal pattern 2252 may be included in the lower bonding metals 2271b and 2272b.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. According to embodiments, a contact is not formed on the reinforcement metal pattern.

The first through fifth voltages may be applied to at least one memory block in the cell region CELL through the lower bonding metals 2271b and 2272b in the peripheral circuit region PERI and upper bonding metals 2371b and 2372b of the cell region CELL. The control circuit performs a first leakage detection operation on selected mats, performs a second leakage detection operation on target mats while inhibiting at least one mat from among the selected mat based on a result of the first leakage detection operation and may identify a mat in which the leakage occurs.

Figure 33:
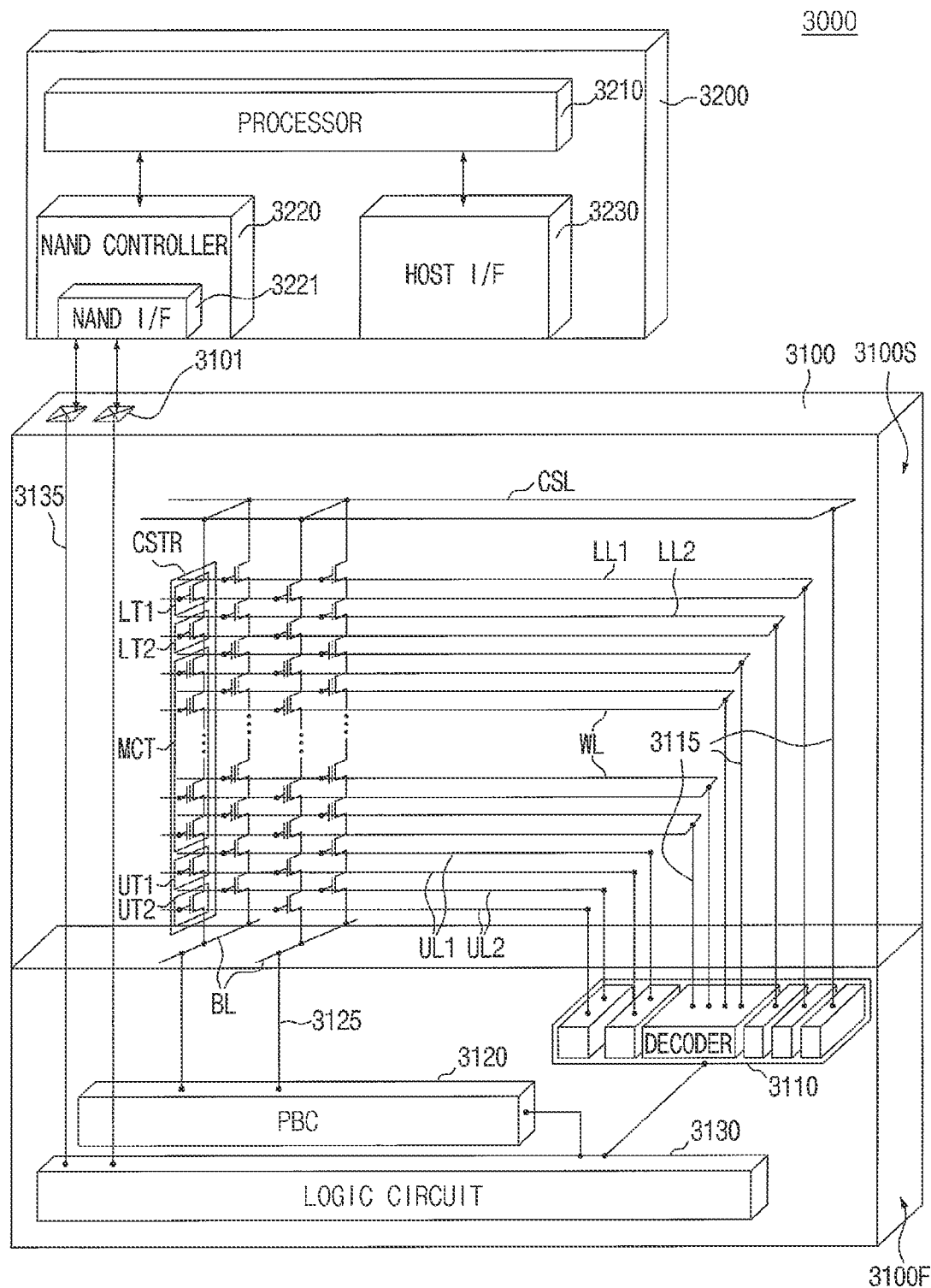
FIG. 33 is a block diagram illustrating an electronic system including a semiconductor device according to example embodiments.

FIG. 33 is a block diagram illustrating an electronic system including a semiconductor device according to example embodiments.

Referring to FIG. 33, an electronic system 3000 may include a semiconductor device 3100 and a controller 3200 electrically connected to the semiconductor device 3100. The electronic system 3000 may be a storage device including one or a plurality of semiconductor devices 3100 or an electronic device including a storage device. For example, the electronic system 3000 may be a solid state drive (SSD) device, a universal serial bus (USB) device, a computing system, a medical device, or a communication device that may include one or a plurality of semiconductor devices 3100.

The semiconductor device 3100 may be a nonvolatile memory device, for example, a nonvolatile memory device, as illustrated with reference to FIGS. 2 through 32. The semiconductor device 3100 may include a first structure 3100F and a second structure 3100S on the first structure 3100F. The first structure 3100F may be a peripheral circuit structure including a decoder circuit 3110, a page buffer circuit 3120, and a logic circuit 3130. The second structure 3100S may be a memory cell structure including a bit-line BL, a common source line CSL, word-lines WL, first and second upper gate lines UL1 and UL2, first and second lower gate lines LL1 and LL2, and memory cell strings CSTR between the bit line BL and the common source line CSL.

In the second structure 3100S, each of the memory cell strings CSTR may include lower transistors LT1 and LT2 disposed adjacent to the common source line CSL, upper transistors UT1 and UT2 disposed adjacent to the bit-line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be varied in accordance with example embodiments.

In example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through a gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through first connection wirings 1115 extending to the second structure 3110S in the first structure 3100F. The bit-lines BL may be electrically connected to the page buffer circuit 3120 through second connection wirings 3125 extending to the second structure 3100S in the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S in the first structure 3100F.

The controller 3200 may include a processor 3210, a NAND controller 3220, and a host interface 3230. The electronic system 3000 may include a plurality of semiconductor devices 3100, and in this case, the controller 3200 may control the plurality of semiconductor devices 3100.

The processor 3210 may control operations of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. Through the NAND interface 3221, control command for controlling the semiconductor device 3100, data to be written in the memory cell transistors MCT of the semiconductor device 3100, data to be read from the memory cell transistors MCT of the semiconductor device 3100, etc., may be transferred. The host interface 3230 may provide communication between the electronic system 3000 and an external host. When control command is received from the external host through the host interface 3230, the processor 3210 may control the semiconductor device 3100 in response to the control command.

A nonvolatile memory device or a storage device according to example embodiments may be packaged using various package types or package configurations.

Embodiments of the present disclosure may be applied to various devices and systems that include the nonvolatile memory devices. For example, embodiments of the present disclosure may be applied to systems such as a personal computer (PC), a server computer, a data center, a workstation, a mobile phone, a smartphone, a tablet computer, a laptop computer, a personal digital assistant (PDA), a portable multimedia player (PMP), a digital camera, a portable game console, a music player, a camcorder, a video player, a navigation device, a wearable device, an Internet of Things (IoT) device, an Internet of Everything (IoE) device, an e-book reader, a virtual reality (VR) device, an augmented reality (AR) device, a robotic device, a drone, etc.

As is traditional in the field of the present disclosure, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

In an example embodiment of the present disclosure, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an example embodiment of the present disclosure, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

While the present disclosure has been particularly shown and described with reference to example embodiments thereof, it will be understood by those of ordinary skill in the art that various changes in form and detail may be made therein without departing from the spirit and scope of the present disclosure as defined by the following claims.

What is claimed is:

1. A nonvolatile memory device, comprising:
   a memory cell array comprising a plurality of mats corresponding to different bit-lines among a plurality of bit-lines,
   wherein each of the plurality of mats comprises at least one memory block comprising a plurality of cell strings, each of the plurality of cell strings comprises a string selection transistor, a plurality of memory cells and a ground selection transistor, which are connected in series and disposed in a vertical direction between a bit-line among the plurality of bit-lines and a common source line;
   an address decoder coupled to the memory cell array through a plurality of word-lines,
   wherein the address decoder is configured to provide word-line voltages to the memory cell array;
   at least one leakage detector commonly coupled to the plurality of mats at a sensing node in the address decoder; and a control circuit configured to control the address decoder and the at least one leakage detector, wherein the control circuit is configured to:

perform a first leakage detection operation on M mats selected from the plurality of mats to determine a leakage of at least a portion of word-lines of the M mats in an N multi-mat mode during which N mats from among the plurality of mats operate concurrently, wherein M is a natural number greater than one, and N is a natural number greater than one, and in response to the leakage of at least the portion of word-lines of the M mats being detected based on a result of the first leakage detection operation:

inhibit at least one mat of the M mats after performing the first leakage detection operation, and perform a second leakage detection operation on at least one target mat from among the M mats except the inhibited at least one mat after performing the first leakage detection operation, wherein the control circuit is configured to perform the first leakage detection operation by, during a word-line set-up period and while applying a first voltage to a block word-line that is coupled to each gate of a plurality of pass transistors which respectively connect a string selection line, a plurality of word-lines and a ground selection line of each of the M mats to a plurality of driving lines, applying a second voltage to the plurality of driving lines, commonly coupled to the sensing node, to provide the plurality of word-lines with a third voltage, wherein the control circuit is configured to perform the second leakage detection operation by deactivating a second block word-line of the inhibited at least one mat during the word-line set-up period, during a word-line development period and during a sensing period.

2. The nonvolatile memory device of claim 1, wherein the string selection line is coupled to the string selection transistor, the plurality of word-lines are coupled to the plurality of memory cells and the ground selection line is coupled to the ground selection transistor, and the control circuit is configured to perform the first leakage detection by:

during a word-line development period and while precharging the plurality of driving lines with the second voltage, applying a fourth voltage to the block word-line to turn off the plurality of pass transistors to develop the plurality of word-lines; and during a sensing period, applying a fifth voltage smaller than the first voltage to the block word-line, detecting a voltage drop of the sensing node, and detecting the leakage based on the voltage drop.

3. A nonvolatile memory device, comprising:

a memory cell array comprising a plurality of mats corresponding to different bit-lines among a plurality of bit-lines, wherein each of the plurality of mats comprises at least one memory block comprising a plurality of cell strings, each of the plurality of cell strings comprises a string selection transistor, a plurality of memory cells and a ground selection transistor, which are connected in series and disposed in a vertical direction between a bit-line among the plurality of bit-lines and a common source line;

an address decoder coupled to the memory cell array through a plurality of word-lines, wherein the address decoder is configured to provide word-line voltages to the memory cell array;

at least one leakage detector commonly coupled to the plurality of mats at a sensing node in the address decoder; and a control circuit configured to control the address decoder and the at least one leakage detector, wherein the control circuit is configured to:

perform a first leakage detection operation on M mats selected from the plurality of mats to determine a leakage of at least a portion of word-lines of the M mats in an N multi-mat mode during which N mats from among the plurality of mats operate concurrently, wherein M is a natural number greater than one, and N is a natural number greater than one, and in response to the leakage of at least the portion of word-lines of the M mats being detected based on a result of the first leakage detection operation:

inhibit at least one mat of the M mats after performing the first leakage detection operation, and perform a second leakage detection operation on at least one target mat from among the M mats except the inhibited at least one mat after performing the first leakage detection operation, wherein the second leakage detection operation is different from the first leakage detection operation, wherein the control circuit is configured to perform the second leakage detection operation by:

deactivating a second block word-line of the inhibited at least one mat during a word-line set-up period, during a word-line development period and during a sensing period, during the word-line set-up period and while applying [[a first voltage to a first block word-line that is coupled to each gate of a plurality of pass transistors which respectively connect a string selection line, a plurality of word-lines and a ground selection line of the at least one target mat to a plurality of driving lines, applying a second voltage to the plurality of driving lines, commonly coupled to the sensing node, to provide the plurality of word-lines with a third voltage, wherein the string selection line is coupled to the string selection transistor, the plurality of word-lines are coupled to the plurality of memory cells and the ground selection line is coupled to the ground selection transistor;

during the word-line development period and while precharging the plurality of driving lines with the second voltage, applying a fourth voltage to the first block word-line to turn off the plurality of pass transistors to develop the plurality of word-lines; and during the sensing period, applying a fifth voltage smaller than the first voltage to the first block word-line, detecting a voltage drop of the sensing node, and detecting the leakage based on the voltage drop.

4. The nonvolatile memory device of claim 3, wherein the control circuit is configured to:

select a Q-th mat from among the M mat as the inhibited at least one mat, wherein Q is a natural number; and perform the second leakage detection operation on the at least one target mat from among the M mats except for the Q-th mat.

5. The nonvolatile memory device of claim 4, wherein, in response to the at least one target mat not passing the second leakage detection operation or in response to the second leakage detection operation not corresponding to a maximum loop, the control circuit is configured to perform a next loop of the second leakage detection operation on the at least one target mat comprising the Q-th mat.

6. The nonvolatile memory device of claim 4, wherein, in response to the at least one target mat passing the second leakage detection operation or in response to the second leakage detection operation corresponding to a maximum loop, the control circuit is configured to:
update pass/fail information associated with the leakage of the at least one target mat; and
determine whether the Q-th mat corresponds to a final mat of the M mats.

7. The nonvolatile memory device of claim 6, wherein, in response to the Q-th mat not corresponding to the final mat of the M mats, the control circuit is configured to:
select one or more mat including an R-th mat from among the M mat as the inhibited at least one mat, wherein R is a natural number different from Q; and
perform the second leakage detection operation on the at least one target mat from among the M mats except the R-th mat.

8. The nonvolatile memory device of claim 6, wherein, in response to the Q-th mat corresponding to the final mat of the M mats, the control circuit is configured to return a status signal indicating a read state to a memory controller disposed outside of the nonvolatile memory device.

9. The nonvolatile memory device of claim 6, wherein, in response to the M mats passing the first leakage detection operation, the control circuit is configured to update pass/fail information associated with the leakage of the M mats.

10. The nonvolatile memory device of claim 1, further comprising:
a voltage generator configured to generate the word-line voltages based on control signals, and
wherein the address decoder comprises:
a plurality of pass switch circuits respectively coupled to the plurality of mats, wherein each of the plurality of pass switch circuits comprises the plurality of pass switch transistors;
a plurality of first voltage transfer circuits respectively corresponding to the plurality of pass switch circuits;
a second voltage transfer circuit connected to the sensing node and connected to the voltage generator and the at least one leakage detector at a first node; and
a plurality of mat selection switches connected between the sensing node and each of the first voltage transfer circuits; and
a plurality of selection switch circuits connected between each of the first voltage transfer circuits and a plurality of driving lines,
wherein each of the plurality of selection switch circuits comprises a plurality of selection transistors configured to connect each of the first voltage transfer circuits to a respective one of the plurality of driving lines.

11. The nonvolatile memory device of claim 10, wherein the control circuit is configured to perform the second leakage detection operation by:
deactivating a second block word-line of the inhibited at least one mat during a word-line set-up period, during a word-line development period and during a sensing period,
during the word-line set-up period and while applying a first voltage to a first block word-line that is coupled to each gate of a plurality of pass transistors which respectively connect a string selection line, a plurality of word-lines and a ground selection line of the at least one target mat to a plurality of driving lines, applying a second voltage to the plurality of driving lines, commonly coupled to the sensing node, to provide the plurality of word-lines with a third voltage,
wherein the string selection line is coupled to the string selection transistor, the plurality of word-lines are coupled to the plurality of memory cells and the ground selection line is coupled to the ground selection transistor;
during the word-line development period and while pre-charging the plurality of driving lines with the second voltage, applying a fourth voltage to the first block word-line to turn off the plurality of pass transistors to develop the plurality of word-lines; and
during the sensing period, applying a fifth voltage smaller than the first voltage to the first block word-line, detecting a voltage drop of the sensing node, and detecting the leakage based on the voltage drop.

12. The nonvolatile memory device of claim 11, wherein the control circuit is configured to control the voltage generator and the address decoder such that:
a level of the second voltage is greater than a level of the first voltage, and a level of the third voltage is smaller than the level of the first voltage by a first threshold voltage during the word-line set-up period; and
a level of the fifth voltage is greater than a level of each of target word-lines by the first threshold voltage during the sensing period, and
wherein the leakage detector is configured to determine that leakage occurs based on a voltage level of the sensing node dropping during the sensing period.

13. The nonvolatile memory device of claim 11, wherein the leakage detector comprises a comparator configured to perform a comparison of a voltage level of the sensing node with respect to a reference voltage and provide the control circuit with a leakage detection signal based on a result of the comparison.

14. The nonvolatile memory device of claim 11, wherein the plurality of cell strings are divided into a plurality of stacks arranged in the vertical direction,
wherein the at least one memory block further comprises a plurality of intermediate switching transistors disposed in a boundary portion between two adjacent stacks in the vertical direction,
wherein the plurality of intermediate switching transistors are configured to perform a switching operation to control an electrical connection of the plurality of cell strings, respectively, and
wherein the control circuit is configured to control the first leakage detection operation and the second leakage detection operation by controlling the switching operation of the plurality of intermediate switching transistors.

15. The nonvolatile memory device of claim 1, wherein the control circuit is configured to:
perform the first leakage detection operation on first mats from among the plurality of mats, in response to the first mats passing an erase verification operation performed on the at least one memory block and in response to the first mats passing a threshold voltage check operation performed on the string selection transistor and the ground selection transistor; and transition a status signal to a read state after completion of the first second leakage detection operation and the second leakage detection operation.

16. The nonvolatile memory device of claim 1, wherein the control circuit, before performing the first leakage detection operation and the second leakage detection operation, is configured to:
perform an erase verification operation on the at least one memory block;
perform a threshold voltage check operation on the string selection transistor and the ground selection transistor in each of each of the plurality of cell strings; and
in response to first mats from among the plurality of mats not passing the erase verification operation and in response to the first mats not passing the threshold voltage check operation,
skip the first leakage detection operation and perform the second leakage detection operation on the first mats.

17. A method of operating a nonvolatile memory device which comprises a memory cell array comprising a plurality of mats corresponding to different bit-lines among a plurality of bit-lines, wherein each of the plurality of mats comprises at least one memory block comprising a plurality of cell strings, each of the plurality of cell strings comprises a string selection transistor, a plurality of memory cells and a ground selection transistor connected in series and disposed in a vertical direction between a bit-line among the plurality of bit-lines and a common source line, the method comprising:
performing a first leakage detection operation on M mats selected from the plurality of mats to determine a leakage of at least a portion of word-lines of the M mats in an N multi-mat mode during which N mats from among the plurality of mats operate concurrently,
wherein M is a natural number greater than one, and N is a natural number greater than one;
in response to the leakage of at least the portion of word-lines of the M mats being detected based on a result of the first leakage detection operation:
inhibiting at least one mat of the M mats after performing the first leakage detection operation, and
performing a second leakage detection operation on at least one target mat from among the M mats except the inhibited at least one mat after performing the first leakage detection operation,
wherein the the control circuit is configured to perform first leakage detection operation by, during a word-line set-up period and while applying a first voltage to a block word-line that is coupled to each gate of a plurality of pass transistors which respectively connect a string selection line, a plurality of word-lines and a ground selection line of each of the M mats to a plurality of driving lines, applying a second voltage to the plurality of driving lines, commonly coupled to the sensing node, to provide the plurality of word-lines with a third voltage,
wherein the control circuit is configured to perform the second leakage detection operation by deactivating a second block word-line of the inhibited at least one mat during the word-line set-up period, during a word-line development period and during a sensing period.

18. The method of claim 17,
wherein the string selection line is coupled to the string selection transistor, the plurality of word-lines are coupled to the plurality of memory cells and the ground selection line is coupled to the ground selection transistor, and performing the first leakage detection operation further comprises:
during a word-line development period and while pre-charging the plurality of driving lines with the second voltage, applying a fourth voltage to the first block word-line to turn off the plurality of pass transistors to develop the plurality of word-lines; and
during a sensing period, applying a fifth voltage smaller than the first voltage to the first block word-line, detecting a voltage drop of the sensing node, and detecting the leakage based on the voltage drop.

19. The method of claim 18, wherein during the word-line set-up period,
a level of the second voltage is greater than a level of the first voltage, and
a level of the third voltage is about the same as the level of the first voltage,
wherein during the word-line set-up period,
a level of the fifth voltage is greater than a level of each of the plurality of word-lines,
wherein the method further comprises:
determining whether the leakage has occurred in a word-line coupled to at least one pass transistor that is turned on by the fifth voltage from among the plurality of pass transistors; and
deactivating a second block word-line of the inhibited at least one mat during the word-line set-up period, during the word-line development period and during the sensing period of the second leakage detection operation.

20. A nonvolatile memory device, comprising:
a memory cell array comprising a plurality of mats corresponding to different bit-line among a plurality of bit-lines,
wherein each of the plurality of mats comprises at least one memory block comprising a plurality of cell strings, each of the plurality of cell strings comprises a string selection transistor, a plurality of memory cells and a ground selection transistor connected in series and disposed in a vertical direction between a bit-line among the plurality of bit-lines and a common source line;
a voltage generator configured to generate word-line voltages based on control signals;
an address decoder coupled to the memory cell array through a plurality of word-lines,
wherein the address decoder is configured to provide the word-line voltages to the memory cell array;
an address decoder configured to provide the word-line voltages to the at least one memory block;
at least one leakage detector commonly coupled to the plurality of mats at a sensing node in the address decoder; and
a control circuit configured to control the voltage generator, the address decoder and the at least one leakage detector,
wherein the control circuit is configured to:
perform a first leakage detection operation on M mats selected from the plurality of mats to determine a leakage of at least a portion of word-lines of the M mats in an N multi-mat mode during which N mats from among the plurality of mats operate concurrently,
wherein M is a natural number greater than one, and N is a natural number greater than one,
in response to the leakage of at least the portion of word-lines of the M mats being detected based on a result of the first leakage detection operation:

inhibit at least one mat of the M mats after performing the first leakage detection operation, and perform a second leakage detection operation on at least one target mat from among the M mats except the inhibited at least one mat after performing the first leakage detection operation, wherein control circuit is configured to perform the first leakage detection operation by, during a word-line set-up period and while applying a first voltage to a block word-line that is coupled to each gate of a plurality of pass transistors which respectively connect a string selection line, a plurality of word-lines and a ground selection line of each of the M mats to a plurality of driving lines, applying a second voltage to the plurality of driving lines, commonly coupled to the sensing node, to provide the plurality of word-lines with a third voltage, wherein the control circuit is configured to perform the second leakage detection operation by deactivating a second block word-line of the inhibited at least one mat during the word-line set-up period, during a word-line development period and during a sensing period.

* * * * *